United States Patent
Aoki

(10) Patent No.: US 9,496,513 B2
(45) Date of Patent: Nov. 15, 2016

(54) ORGANIC THIN FILM PHOTOVOLTAIC DEVICE, FABRICATION METHOD THEREOF, AND ELECTRONIC APPARATUS

(71) Applicant: ROHM CO., LTD., Kyoto (JP)

(72) Inventor: Yoichi Aoki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/846,873

(22) Filed: Sep. 7, 2015

(65) Prior Publication Data
US 2015/0380670 A1 Dec. 31, 2015

Related U.S. Application Data

(63) Continuation of application No. PCT/JP2013/084287, filed on Dec. 20, 2013.

(30) Foreign Application Priority Data

Mar. 7, 2013 (JP) .................................. 2013-044933
Mar. 26, 2013 (JP) .................................. 2013-063512
Mar. 26, 2013 (JP) .................................. 2013-063701

(51) Int. Cl.
*H01L 31/0336* (2006.01)
*H01L 31/072* (2012.01)
(Continued)

(52) U.S. Cl.
CPC .......... *H01L 51/448* (2013.01); *H01L 51/4253* (2013.01); *H01L 27/301* (2013.01); *H01L 51/0037* (2013.01); *Y02E 10/549* (2013.01)

(58) Field of Classification Search
CPC .......... H01L 2924/00; H01L 31/02167; H01L 51/5012; H01L 51/4253; H01L
(Continued)

(56) References Cited

U.S. PATENT DOCUMENTS 7,935,263 B2 5/2011 Duerr et al.
2005/0238803 A1 10/2005 Tremel et al.
(Continued)

FOREIGN PATENT DOCUMENTS

JP 2007-511102 A 4/2007
JP 2007-534119 A 11/2007
(Continued)

*Primary Examiner* — Hsien Ming Lee
(74) *Attorney, Agent, or Firm* — Rabin & Berdo, P.C.

(57) ABSTRACT

An organic thin film photovoltaic device (1) includes: a substrate (10); a first electrode layer (11) disposed on the substrate; a hole transport layer (12) disposed on the first electrode layer; a bulk heterojunction organic active layer (14) disposed on the hole transport layer; a second electrode layer (16) disposed on the bulk heterojunction organic active layer; a sealing glass (40) configured to be opposed to the substrate 10, and configured to seal a laminated structure composed of the first electrode layer, the hole transport layer, the bulk heterojunction organic active layer, and the second electrode layer; and a glass frit (36) disposed between the sealing glass and the substrate and configured to seal the laminated structure. There is provided: an inexpensive organic thin film photovoltaic device of which durability is improved, allowing further weight saving and thin-layering; and a fabrication method of such an organic thin film photovoltaic device.

5 Claims, 63 Drawing Sheets

(51) Int. Cl.
*H01L 29/08* (2006.01)
*H01L 33/00* (2010.01)
*H01L 27/15* (2006.01)
*H01L 21/00* (2006.01)
*H01L 51/44* (2006.01)
*H01L 51/42* (2006.01)
H01L 51/00 (2006.01)
H01L 27/30 (2006.01)

(58) Field of Classification Search
CPC ............... 51/5056;H01L 31/02008; H01L 31/02021; H01L 2924/12044; H01L 51/441; H01L 51/447; H01L 27/301; B32B 2457/12; C08G 2261/95
USPC ........ 257/12, 40, 13, 21, 80, 82, 85, 90, 94, 257/184; 136/243, 254, 257
See application file for complete search history.

(56) References Cited

U.S. PATENT DOCUMENTS

| | | |
|---|---|---|
| 2006/0049396 A1 | 3/2006 | Pichler et al. |
| 2011/0014731 A1 | 1/2011 | Nguyen et al. |
| 2011/0121352 A1 | 5/2011 | Hesse et al. |
| 2012/0199201 A1* | 8/2012 | Seike .................. H01L 51/0096 136/259 |
| 2012/0216869 A1* | 8/2012 | Kato .................... H01L 51/448 136/263 |

FOREIGN PATENT DOCUMENTS

| | | |
|---|---|---|
| JP | 2009-099805 A | 5/2009 |
| JP | 2009-246025 A | 10/2009 |
| JP | 2011-108651 A | 6/2011 |
| JP | 2012-533853 A | 12/2012 |
| JP | 2013-115084 A | 6/2013 |
| WO | WO-2005/050736 A1 | 6/2005 |
| WO | WO-2011/008905 A1 | 1/2011 |
| WO | WO-2012/090943 A1 | 7/2012 |

* cited by examiner (1) PHOTON GENERATION OF EXCITONS
(2) DISSOCIATION OF EXCITONS
(3) TRANSPORT OF CARRIERS Pc ZnPc Me-Ptcdi $C_{60}$

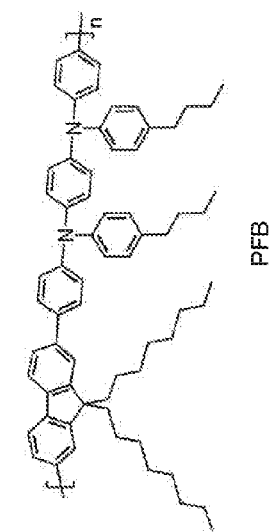
FIG. 9A
MDMO-PPV
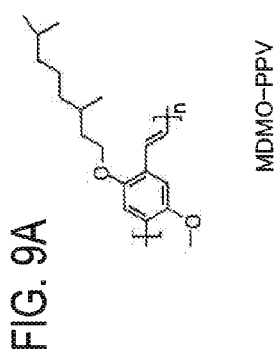
FIG. 9B
PFB
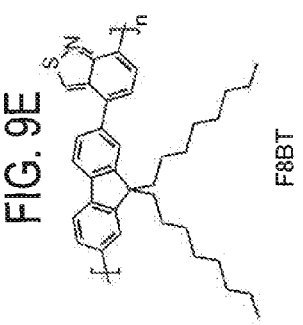
FIG. 9C
CN-MDMO-PPV
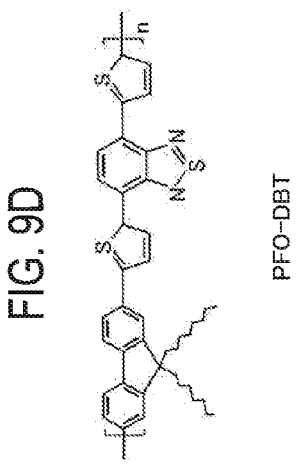
FIG. 9D
PFO-DBT
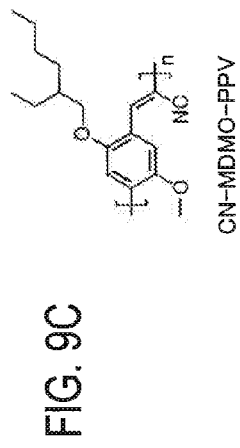
FIG. 9E
F8BT
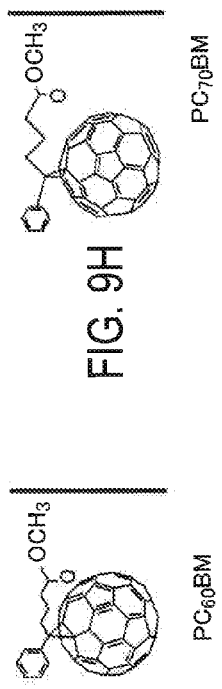
FIG. 9F
PCDTBT
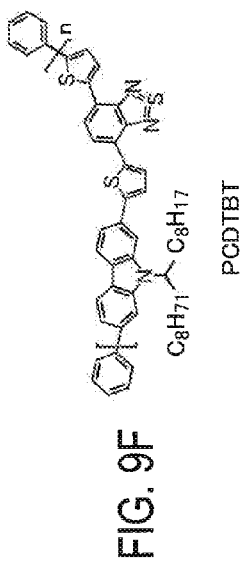
FIG. 9G
PC$_{60}$BM
FIG. 9H
PC$_{70}$BM

ORGANIC THIN FILM PHOTOVOLTAIC DEVICE, FABRICATION METHOD THEREOF, AND ELECTRONIC APPARATUS

CROSS REFERENCE TO RELATED APPLICATIONS

This is a continuation application (CA) of PCT Application No. PCT/JP2013/084287, filed on Dec. 20, 2013, which claims priority to Japan Patent Applications No. P2013-44933 filed on Mar. 7, 2013, No. P2013-63512 filed on Mar. 26, 2013 and No. P2013-63701 filed on Mar. 26, 2013 and is based upon and claims the benefit of priority from prior Japanese Patent Applications No. P2013-44933 filed on Mar. 7, 2013, No. P2013-63512 filed on Mar. 26, 2013 and No. P2013-63701 filed on Mar. 26, 2013 and PCT Application No. PCT/JP2013/084287, filed on Dec. 20, 2013, the entire contents of each of which are incorporated herein by reference.

FIELD

The embodiment described herein relates to an organic thin film photovoltaic device, a fabrication method of the organic thin film photovoltaic device, and an electronic apparatus. The embodiment related to in particular: an inexpensive organic thin film photovoltaic device of which durability is improved and electrode extraction structure is improved, wherein a connecting point can be formed in arbitrary positions, without largely changing of the external structure, allowing further weight saving and thin-layering; a fabrication method of such an organic thin film photovoltaic device; and an electronic apparatus including such an organic thin film photovoltaic device.

BACKGROUND

Since organic thin film photovoltaic devices characterized by ultra-thin structure, lightness in weight, and flexibility are fabricated using printing methods, e.g. an ink-jet process, under room temperature and atmospheric pressure, Well-designed solar cells having high flexibility of shape can be realized.

In organic thin film photovoltaic devices, incident light is effectively confined in an inside of an organic active layer and collecting effect is enhanced by forming a fine pattern to a surface of the organic active layer or an electrode, thereby achieving enhanced photoelectric conversion efficiency.

In a conventional organic thin film photovoltaic device using a surface plasmon resonance, a substance in a solution state modified by an alkyl group or a thiol group, in order to promote dispersion effect, to silver (Ag) or gold (Au) nanoparticles which completed particle size control by organic synthesis had been applied on an interface between p type/n type organic layers and an organic layer/electrode interface by using a spin coat method.

SUMMARY

It was a problem that photoelectric conversion efficiency of the organic thin film photovoltaic device is extremely low as compared with other types of solar cells, but it has been proved that high durability can be obtained by sealing method using an engraved glass and sheet desiccant used for organic Electro Luminescence (EL) displays.

However, such a sealing method using the engraved glass and the sheet desiccant had a problem that the engraved glass had to be thickly formed, and therefore the cost was extremely increased.

Conventionally, in amorphous-silicon solar cells etc., when fabricating well-designed solar cells, after fabricating the cells by arbitrary patterns, back sheets etc. each of which the back surface was colored were bonded to each other.

Ordinarily, an electrode of outdoor-used thin film solar cells is extracted in an edge face of a module composed of cells which are overlapped one upon another in stripes. However, when the solar cell is mounted in a mobile terminal etc. which are mainly used for indoor, it is difficult to extract the electrode due to restrictions of module shape or area at the edge face of the module.

Consequently, the inventors found out a structure in which a connecting point can be freely formed without largely changing of the external structure by providing a mechanism for the purpose of extracting electricity, generated in the module, in arbitrary positions in the cell inside.

The embodiment provides an inexpensive organic thin film photovoltaic device of which durability is improved, allowing further weight saving and thin-layering, and a fabrication method of such an organic thin film photovoltaic device.

Moreover, the embodiment provides: an organic thin film photovoltaic device in which the structure thereof is simple, thereby decreasing the number of fabrication processes, and improving a designedness thereof, allowing further weight saving and thin-layering; a fabrication method of such an organic thin film photovoltaic device; and an electronic apparatus including such an organic thin film photovoltaic device.

Moreover, the embodiment provides an organic thin film photovoltaic device of which electrode extraction structure is improved, wherein a connecting point can be formed in arbitrary positions, without largely changing of the external structure, allowing further weight saving and thin-layering; a fabrication method of such an organic thin film photovoltaic device; and an electronic apparatus including such an organic thin film photovoltaic device.

According to one aspect of the embodiment, there is provided an organic thin film photovoltaic device comprising: a substrate; a first electrode layer disposed on the substrate; a hole transport layer disposed on the first electrode layer; a bulk heterojunction organic active layer disposed on the hole transport layer; a second electrode layer disposed on the bulk heterojunction organic active layer; a sealing glass configured to be opposed to the substrate, the sealing glass configured to seal a laminated structure composed of the first electrode layer, the hole transport layer, the bulk heterojunction organic active layer, and the second electrode layer 16; and a glass frit disposed between the sealing glass and the substrate, the glass frit configured to seal the laminated structure.

According to another aspect of the embodiment, there is provided an organic thin film photovoltaic device comprising: a substrate; a first electrode layer disposed on the substrate; a hole transport layer disposed on the first electrode layer; a bulk heterojunction organic active layer disposed on the hole transport layer; a second electrode layer disposed on the bulk heterojunction organic active layer; a passivation layer disposed on the second electrode layer; a colored barrier layer disposed on the passivation layer; and a back sheet passivation layer disposed on the colored barrier layer.

According to still another aspect of the embodiment, there is provided an organic thin film photovoltaic device comprising: a substrate; a first electrode layer disposed on the substrate; a hole transport layer disposed on the first electrode layer; a bulk heterojunction organic active layer disposed on the hole transport layer; a second electrode layer disposed on the bulk heterojunction organic active layer; a passivation layer disposed on the second electrode layer; a first extraction terminal electrode disposed in a direction perpendicular to the substrate, the first extraction terminal electrode configured to pass through the passivation layer, the bulk heterojunction organic active layer, and the hole transport layer so as to be connected with the first electrode layer; and a second extraction terminal electrode disposed in the direction perpendicular to the substrate, the second extraction terminal electrode configured to pass through the passivation layer so as to be connected to the second electrode layer.

According to still another aspect of the embodiment, there is provided an organic thin film photovoltaic device comprising: a substrate; a first electrode layer disposed on the substrate; a hole transport layer disposed on the first electrode layer; a bulk heterojunction organic active layer disposed on the hole transport layer; a second electrode layer disposed on the bulk heterojunction organic active layer; a via electrode layer connected to the first electrode layer via a third via hole, the third via hole configured to pass through the hole transport layer and the bulk heterojunction organic active layer in a direction perpendicular to the substrate so as to reach the first electrode layer; a passivation layer disposed on the second electrode layer and the via electrode layer; a first extraction terminal electrode disposed in a direction perpendicular to the substrate, the first extraction terminal electrode configured to pass through the passivation layer so as to be connected to the via electrode layer; and a second extraction terminal electrode configured to pass through the passivation layer so as to be connected to the second electrode layer.

According to still another aspect of the embodiment, there is provided an electronic apparatus comprising the above-mentioned organic thin film photovoltaic device.

According to still another aspect of the embodiment, there is provided an electronic apparatus comprising: a display area; and an organic thin film photovoltaic device formation area and a character formation area disposed at a peripheral part of the display area, wherein the organic thin film photovoltaic device formation area comprises a substrate, a first electrode layer disposed on the substrate, a hole transport layer disposed on the first electrode layer, a bulk heterojunction organic active layer disposed on the hole transport layer, a second electrode layer disposed on the bulk heterojunction organic active layer, a passivation layer disposed on the second electrode layer, a first extraction terminal electrode disposed in a direction perpendicular to the substrate, the first extraction terminal electrode configured to pass through the passivation layer, the bulk heterojunction organic active layer, and the hole transport layer so as to be connected with the first electrode layer; and a second extraction terminal electrode disposed in the direction perpendicular to the substrate, the second extraction terminal electrode configured to pass through the passivation layer so as to be connected to the second electrode layer, wherein the display area and the character formation area comprise the substrate, the first electrode layer disposed on the substrate, and the passivation layer disposed on the first electrode layer.

According to still another aspect of the embodiment, there is provided an electronic apparatus comprising: a display area; and an organic thin film photovoltaic device formation area and a character formation area disposed at a peripheral part of the display area, wherein the organic thin film photovoltaic device formation area comprises a substrate, a first electrode layer disposed on the substrate, a hole transport layer disposed on the first electrode layer, a bulk heterojunction organic active layer disposed on the hole transport layer, a second electrode layer disposed on the bulk heterojunction organic active layer, a via electrode layer connected to the first electrode layer via a third via hole, the third via hole configured to pass through the hole transport layer and the bulk heterojunction organic active layer in a direction perpendicular to the substrate so as to reach the first electrode layer; a passivation layer disposed on the second electrode layer and the via electrode layer, a first extraction terminal electrode disposed in a direction perpendicular to the substrate, the first extraction terminal electrode configured to pass through the passivation layer so as to be connected to the via electrode layer, and a second extraction terminal electrode configured to pass through the passivation layer so as to be connected to the second electrode layer, wherein the display area and the character formation area comprise the substrate, the first electrode layer disposed on the substrate, and the passivation layer disposed on the first electrode layer.

According to another aspect of the embodiment, there is provided a fabrication method of an organic thin film photovoltaic device, the method comprising: forming a first electrode on a substrate; forming a hole transport layer on the first electrode layer; forming a bulk heterojunction organic active layer on the hole transport layer; forming a second electrode layer on the bulk heterojunction organic active layer; forming a glass frit on a sealing glass; forming a resin at a tip portion of the glass frit; and opposing the sealing glass and the substrate to each other, and sealing a laminated structure composed of the first electrode layer, the hole transport layer, the bulk heterojunction organic active layer, and the second electrode layer with the glass frit and the resin.

According to another aspect of the embodiment, there is provided an electronic apparatus comprising: a display area; and an organic thin film photovoltaic device formation area and a character formation area disposed at a peripheral part of the display area, wherein the organic thin film photovoltaic device formation area comprises a substrate, a first electrode layer disposed on the substrate, a hole transport layer disposed on the first electrode layer, a bulk heterojunction organic active layer disposed on the hole transport layer, a second electrode layer disposed on the bulk heterojunction organic active layer, a passivation layer disposed on the second electrode layer, a colored barrier layer disposed on the passivation layer, and a back sheet passivation layer disposed on the colored barrier layer, wherein the display area and the character formation area comprise the substrate, the first electrode layer disposed on the substrate, the passivation layer disposed on the first electrode layer, the colored barrier layer disposed on the passivation layer, and the back sheet passivation layer disposed on the colored barrier layer, wherein the colored barrier layer corresponding to the organic thin film photovoltaic device formation area and the colored barrier layer corresponding to the character formation area are colored.

According to the embodiment, there can be provided the inexpensive organic thin film photovoltaic device of which durability is improved, allowing further weight saving and thin-layering, and the fabrication method of such an organic thin film photovoltaic device.

Moreover, according to the embodiment, there can be provided the organic thin film photovoltaic device in which the structure thereof is simple, thereby decreasing the number of fabrication processes, and improving the designedness thereof, allowing further weight saving and thin-layering; the fabrication method of such an organic thin film photovoltaic device; and the electronic apparatus including such an organic thin film photovoltaic device.

Moreover, according to the embodiment, there can be provided the organic thin film photovoltaic device of which electrode extraction structure is improved, wherein the connecting point can be formed in arbitrary positions, without largely changing of the external structure, allowing further weight saving and thin-layering; the fabrication method of such an organic thin film photovoltaic device; and the electronic apparatus including such an organic thin film photovoltaic device.

BRIEF DESCRIPTION OF DRAWINGS

FIG. 9A shows a chemical structural formula of a material, which is an example of MDMO-PPV, used for a solution process, in the organic thin film photovoltaic device according to the first embodiment.

FIG. 9B shows a chemical structural formula of a material, which is an example of PFB, used for a solution process, in the organic thin film photovoltaic device according to the first embodiment.

FIG. 9C shows a chemical structural formula of a material, which is an example of CN-MDMO-PPV, used for a solution process, in the organic thin film photovoltaic device according to the first embodiment.

FIG. 9D shows a chemical structural formula of a material, which is an example of PFO-DBT, used for a solution process, in the organic thin film photovoltaic device according to the first embodiment.

FIG. 9E shows a chemical structural formula of a material, which is an example of F8BT, used for a solution process, in the organic thin film photovoltaic device according to the first embodiment.

FIG. 9F shows a chemical structural formula of a material, which is an example of PCDTBT, used for a solution process, in the organic thin film photovoltaic device according to the first embodiment.

FIG. 9G shows a chemical structural formula of a material, which is an example of $PC_{60}$ BM, used for a solution process, in the organic thin film photovoltaic device according to the first embodiment.

FIG. 9H shows a chemical structural formula of a material, which is an example of $PC_{70}$ BM, used for a solution process, in the organic thin film photovoltaic device according to the first embodiment.

FIG. 61A is a schematic planar pattern configuration diagram showing a state where a colored barrier layer is formed on the passivation layer, in a process of the fabricating process of the organic thin film photovoltaic device according to the third embodiment.

FIG. 61B is a schematic cross-sectional structure diagram taken in the line 61B-61B of FIG. 61A, in a process of the fabrication method of the organic thin film photovoltaic device according to the third embodiment.

FIG. 62A is a schematic planar pattern configuration diagram showing a state where a back sheet passivation layer is formed on the colored barrier layer, in a process of the fabrication method of the organic thin film photovoltaic device according to the third embodiment.

FIG. 62B is a schematic cross-sectional structure diagram taken in the line 62B-62B of FIG. 62A, in a process of the fabrication method of the organic thin film photovoltaic device according to the third embodiment.

FIG. 63A is a schematic planar pattern configuration diagram showing a state of forming the first via hole and the second via hole, in a process of the fabricating process of the organic thin film photovoltaic device according to the third embodiment.

FIG. 63B is a schematic cross-sectional structure diagram taken in the line 63B-63B of FIG. 63A, in a process of the fabrication method of the organic thin film photovoltaic device according to the third embodiment.

FIG. 64 is a flow chart showing producing steps of the organic thin film photovoltaic device according to the third embodiment.

FIG. 65A is a schematic planar pattern configuration diagram of an organic thin film photovoltaic device according to a modified example 1 of the third embodiment.

FIG. 65B is a schematic cross-sectional structure diagram taken in the line 65B-65B of FIG. 65A.

FIG. 65C is a circuit representation of the organic thin film photovoltaic device according to the modified example 1 of the third embodiment.

FIG. 66A is a schematic cross-sectional structure diagram showing a state where the transparent electrode layer is pattern-formed on the substrate, in a process of the fabrication method of the organic thin film photovoltaic device according to the third embodiment.

FIG. 66B is a schematic cross-sectional structure diagram showing a state where the hole transport layer is formed as a film on the transparent electrode layer, in a process of the fabrication method of the organic thin film photovoltaic device according to the third embodiment.

Figure 66A:
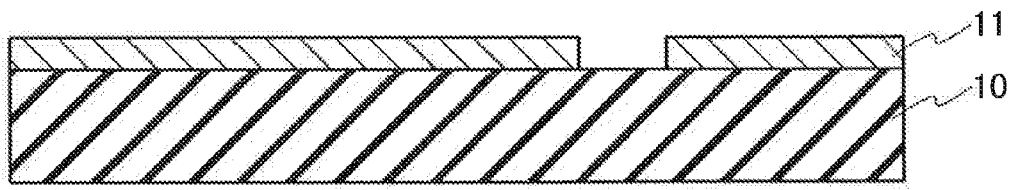
Figure 66B:
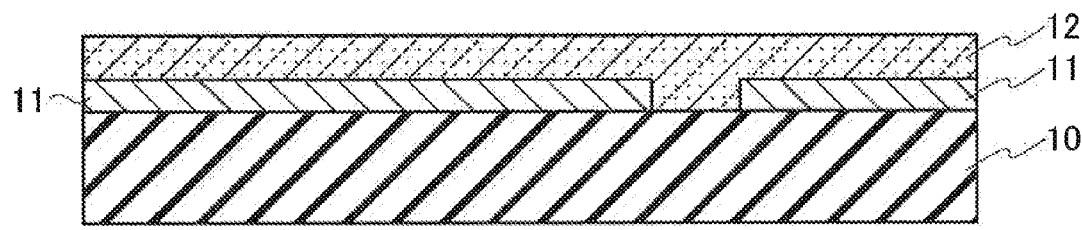
Figure 66C:
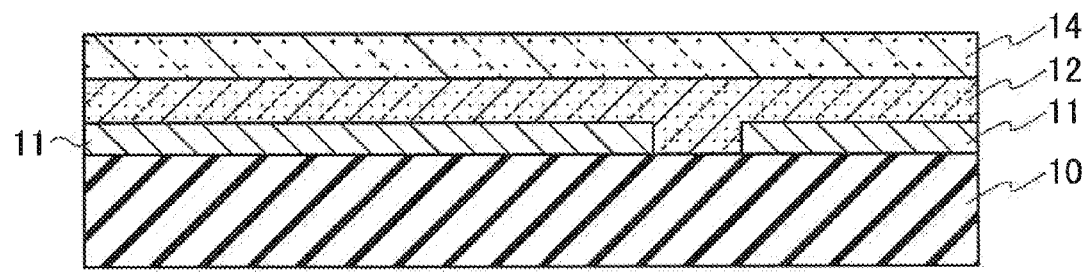

FIG. 66C is a schematic cross-sectional structure diagram showing a state where the bulk heterojunction organic active layer is formed as a film on the hole transport layer, in a process of the fabrication method of the organic thin film photovoltaic device according to the third embodiment.

Figure 66D:
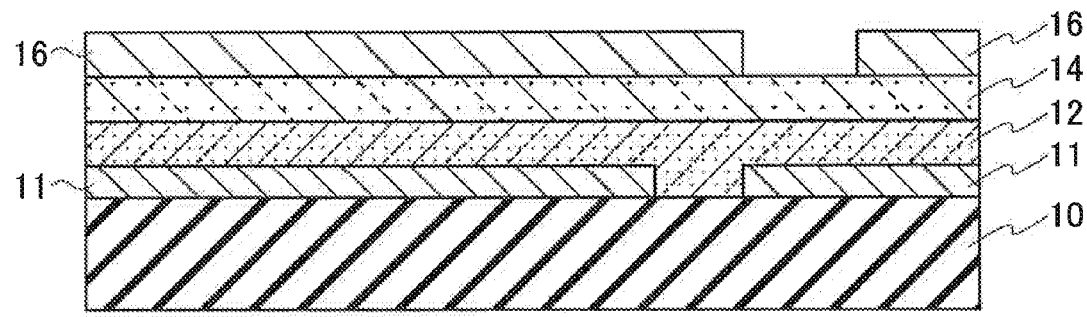

FIG. 66D is a schematic cross-sectional structure diagram showing a state where the second electrode layer is pattern-formed on the bulk heterojunction organic active layer, in a process of the fabrication method of the organic thin film photovoltaic device according to the third embodiment.

Figure 67A:
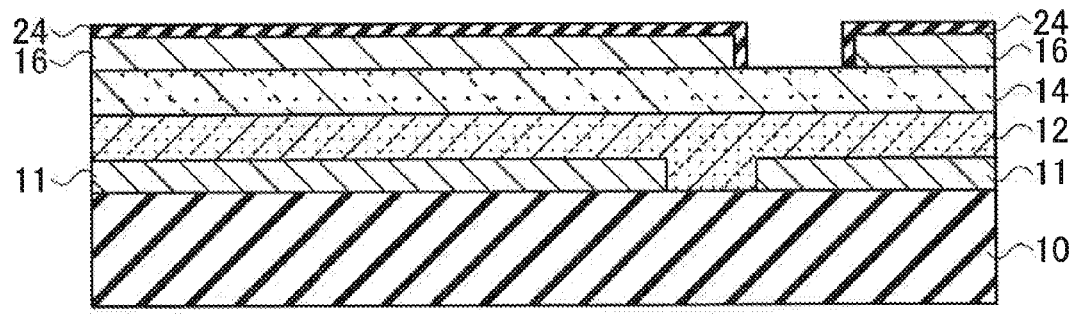

FIG. 67A is a schematic cross-sectional structure diagram showing a state where an oxide layer is formed on the surface of the second electrode layer by using oxygen plasma treatment, in a process of the fabrication method of the organic thin film photovoltaic device according to the third embodiment.

Figure 67B:
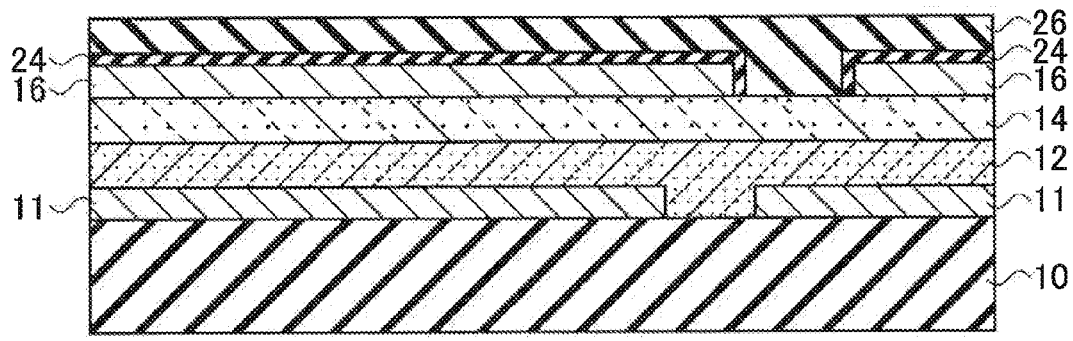

FIG. 67B is a schematic cross-sectional structure diagram showing a state where the passivation layer is formed all over the device, in a process of the fabricating method of the organic thin film photovoltaic device according to the third embodiment.

Figure 67C:
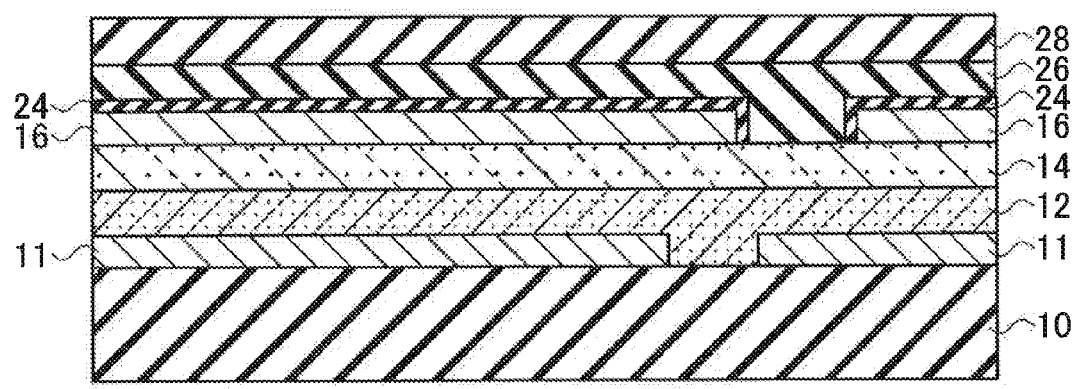

FIG. 67C is a schematic cross-sectional structure diagram showing a state where the colored barrier layer is formed on the passivation layer, in a process of the fabrication method of the organic thin film photovoltaic device according to the third embodiment.

Figure 68A:
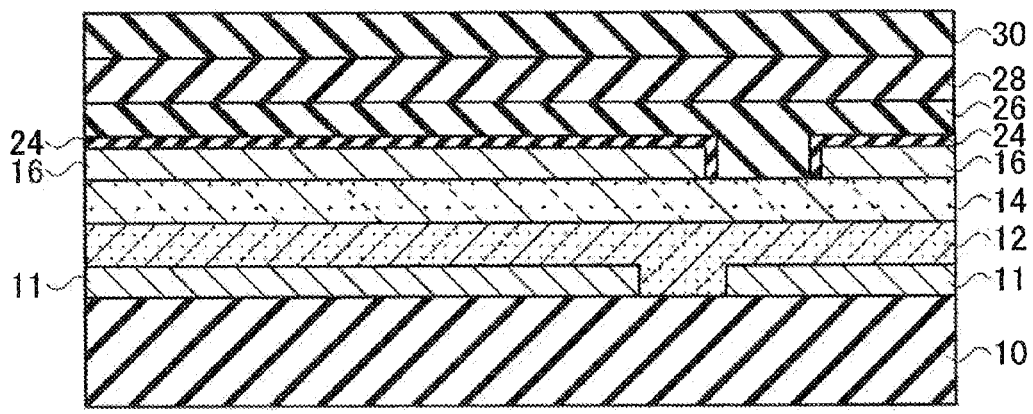

FIG. 68A is a schematic cross-sectional structure diagram showing a state where the back sheet passivation layer is formed on the colored barrier layer, in a process of the fabrication method of the organic thin film photovoltaic device according to the third embodiment.

Figure 68B:
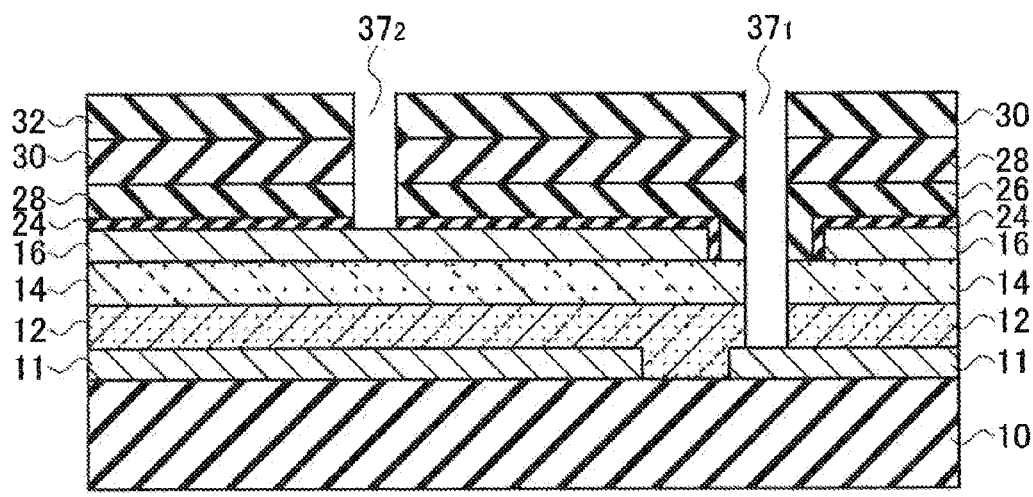

FIG. 68B is a schematic cross-sectional structure diagram showing a state where the first via hole and the second via hole are formed, in a process of the fabrication method of the organic thin film photovoltaic device according to the third embodiment.

Figure 69A:
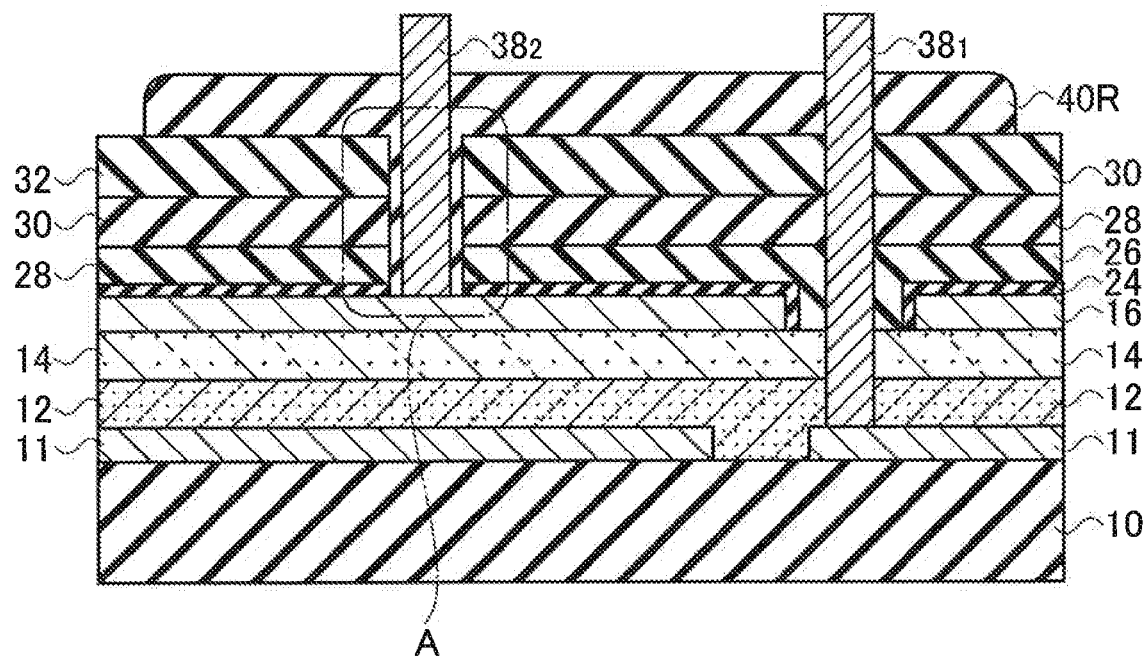

FIG. 69A is a schematic cross-sectional structure diagram showing a state where the first terminal electrode and the second terminal electrode are formed, in a process of the fabrication method of the organic thin film photovoltaic device according to the third embodiment.

Figure 69B:
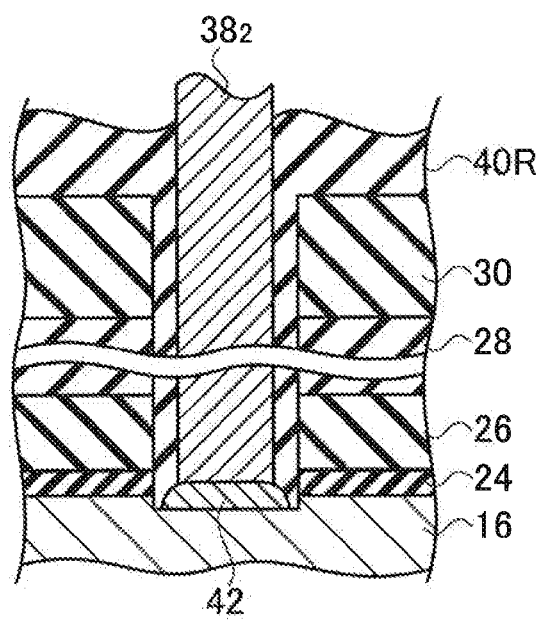

FIG. 69B is an enlarged view of the portion A of FIG. 69A, in a process of the fabrication method of the organic thin film photovoltaic device according to the third embodiment.

Figure 70:
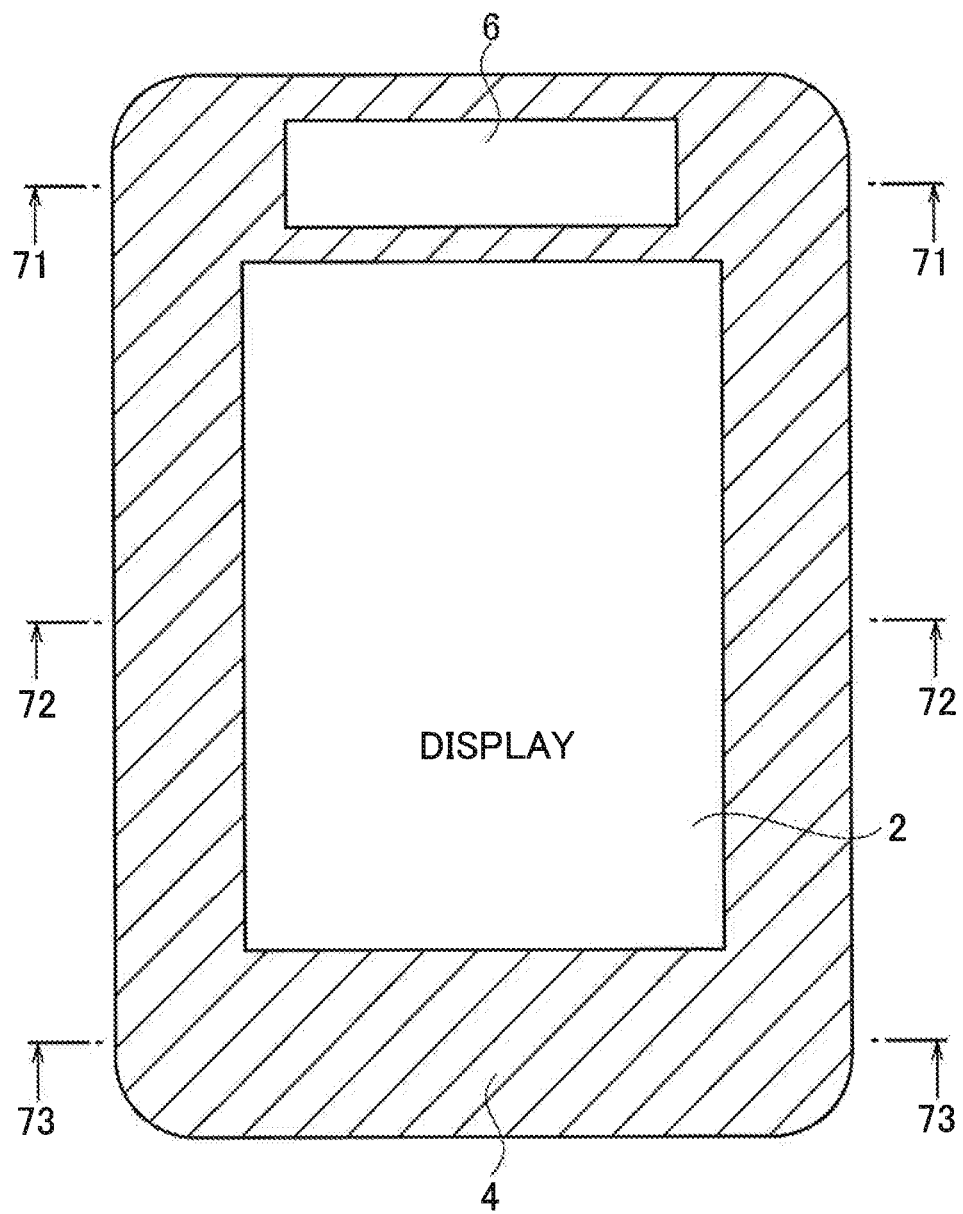

FIG. 70 is a schematic plane configuration diagram of an electronic apparatus to which the organic thin film photovoltaic device according to the third embodiment is applied.

Figure 71:
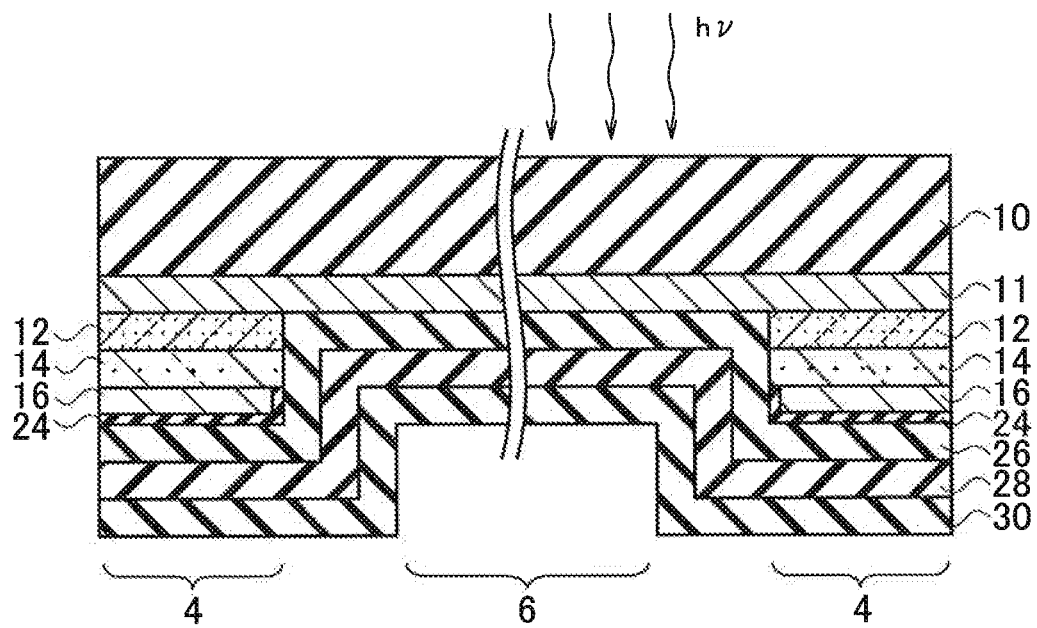

FIG. 71 is a schematic cross-sectional structure diagram taken in the line 71-71 of FIG. 70.

Figure 72:
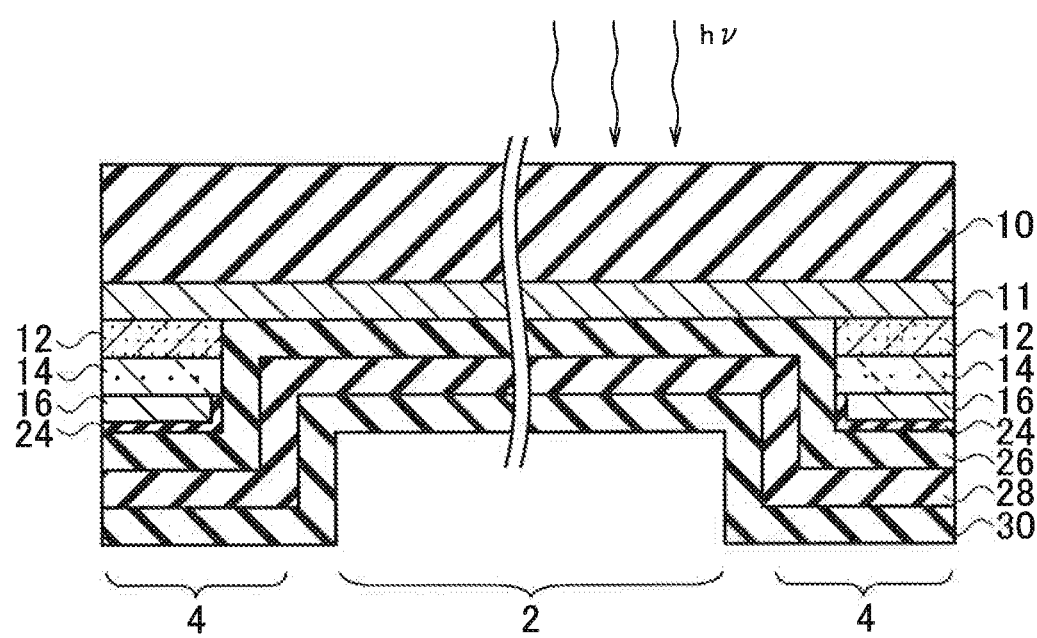

FIG. 72 is a schematic cross-sectional structure diagram taken in the line 72-72 of FIG. 70.

Figure 73:
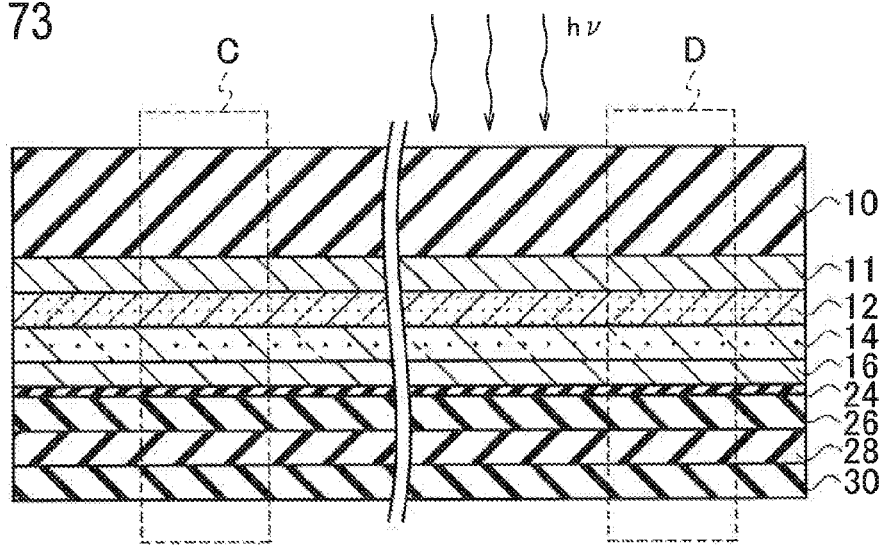

FIG. 73 is a schematic cross-sectional structure diagram taken in the line 73-73 of FIG. 70.

Figure 74A:
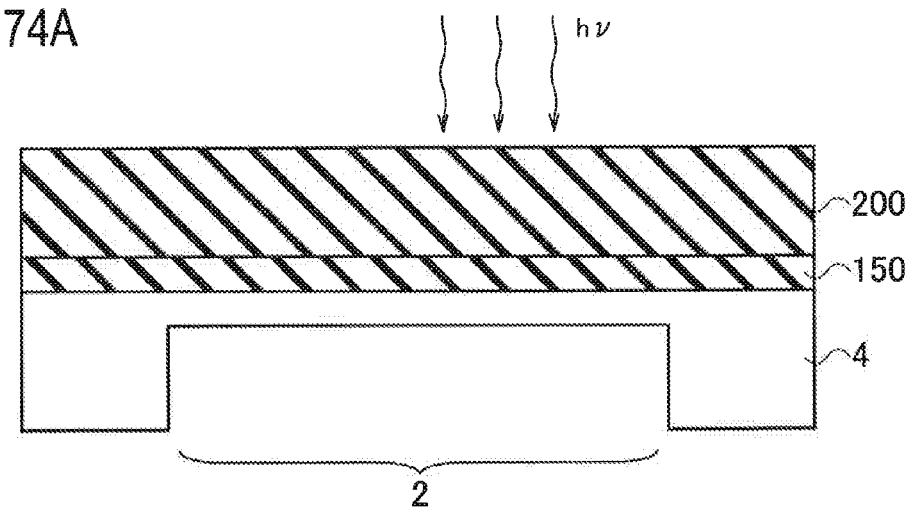

FIG. 74A is a schematic cross-sectional structure diagram of a tandem-structured electronic apparatus to which the organic thin film photovoltaic device according to the third embodiment is applied.

Figure 74B:
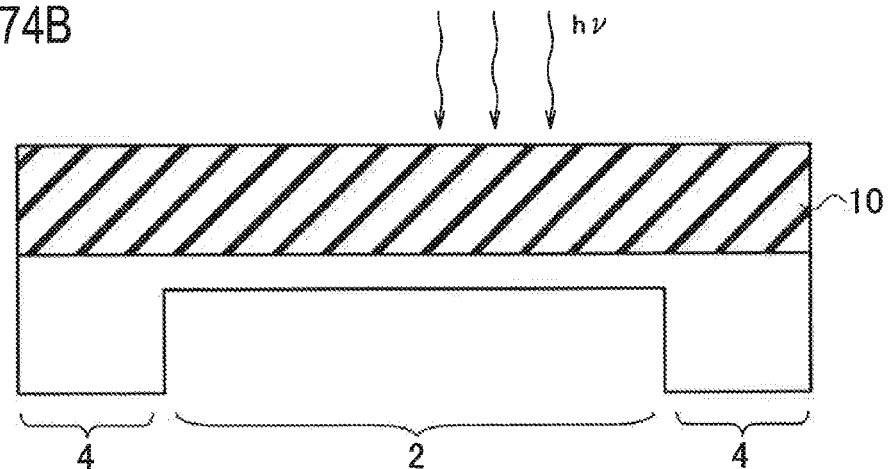

FIG. 74B is a schematic cross-sectional structure diagram of an in-cell structured electronic apparatus to which the organic thin film photovoltaic device according to the third embodiment is applied.

Figure 75A:
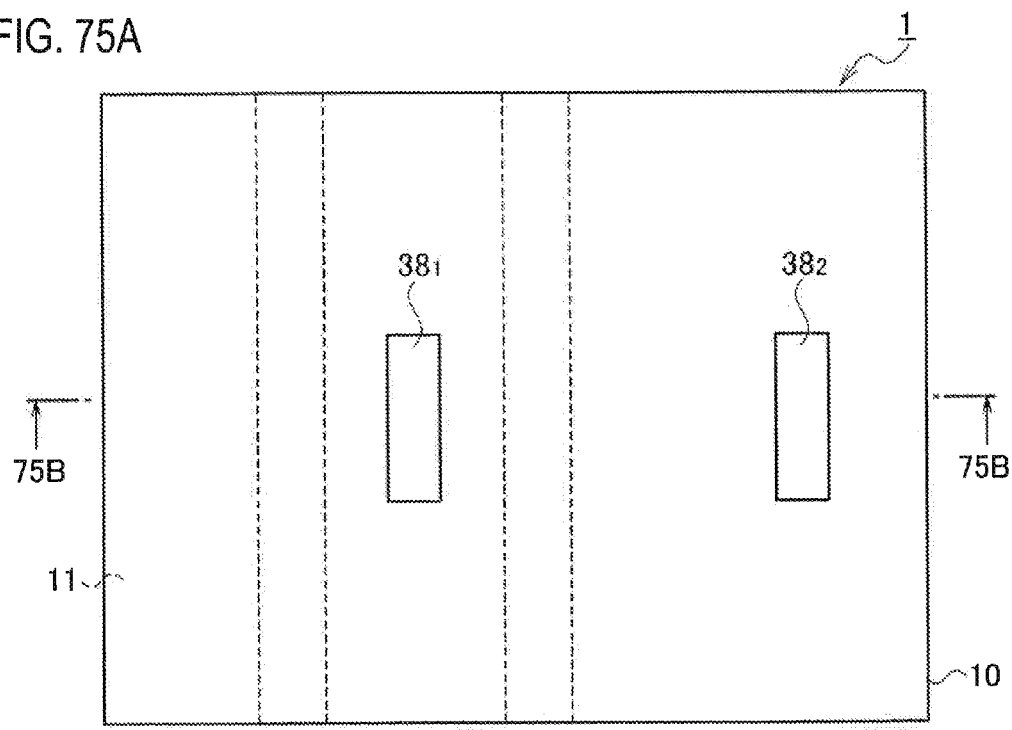

FIG. 75A is a schematic planar pattern configuration diagram of an organic thin film photovoltaic device according to a modified example 2 of the third embodiment.

Figure 75B:
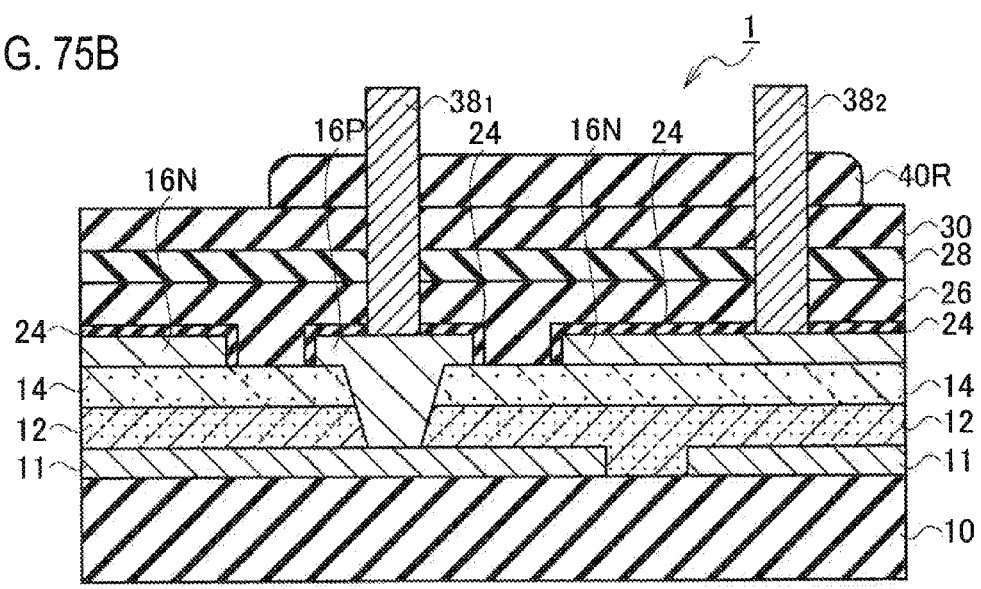

FIG. 75B is a schematic cross-sectional structure diagram taken in the line 75B-75B of FIG. 75A.

Figure 75C:
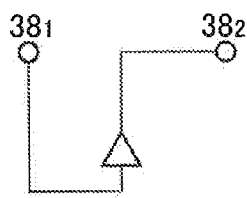

FIG. 75C shows a circuit representation corresponding to that shown in FIGS. 75A and 75B.

Figure 76A:
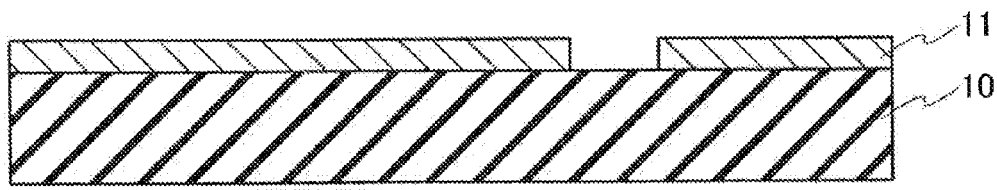

FIG. 76A is a schematic cross-sectional structure diagram showing a state where the transparent electrode layer is pattern-formed on the substrate, in a process of the fabrication method of the organic thin film photovoltaic device according to a modified example 2 of the third embodiment.

Figure 76B:
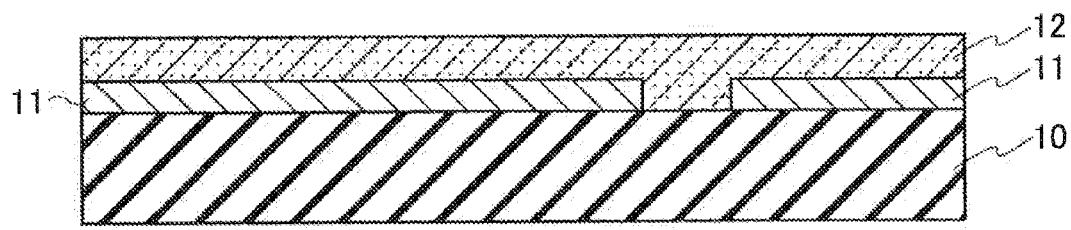

FIG. 76B is a schematic cross-sectional structure diagram showing a state where the hole transport layer is formed as a film on the transparent electrode layer, in a process of the fabrication method of the organic thin film photovoltaic device according to the modified example 2 of the third embodiment.

Figure 76C:
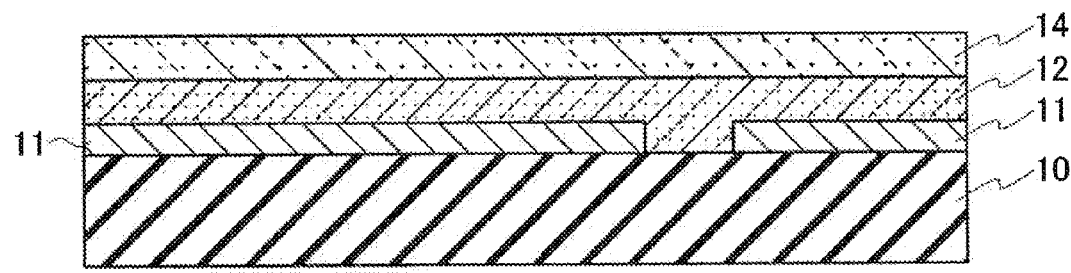

FIG. 76C is a schematic cross-sectional structure diagram showing a state where the bulk heterojunction organic active layer is formed as a film on the hole transport layer, in a process of the fabrication method of the organic thin film photovoltaic device according to the modified example 2 of the third embodiment.

Figure 76D:
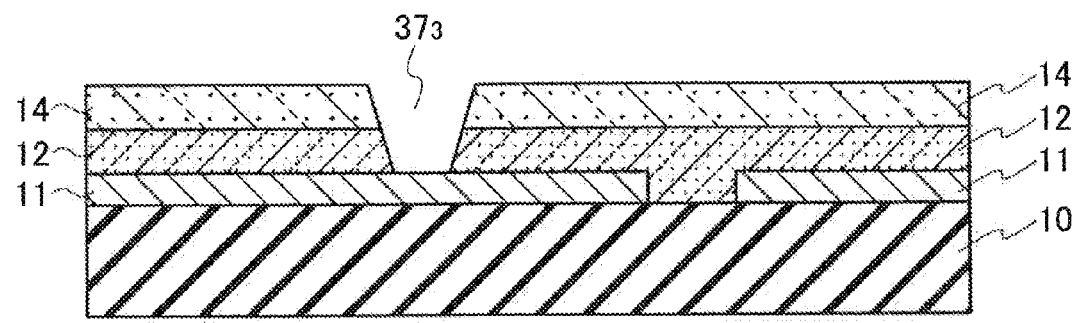

FIG. 76D is a schematic cross-sectional structure diagram showing a state of forming a third via hole configured to pass through the hole transport layer and the bulk heterojunction organic active layer in a direction perpendicular to the substrate so as to reach the first electrode layer, in a process of the fabrication method of the organic thin film photovoltaic device according to the modified example 2 of the third embodiment.

Figure 77A:
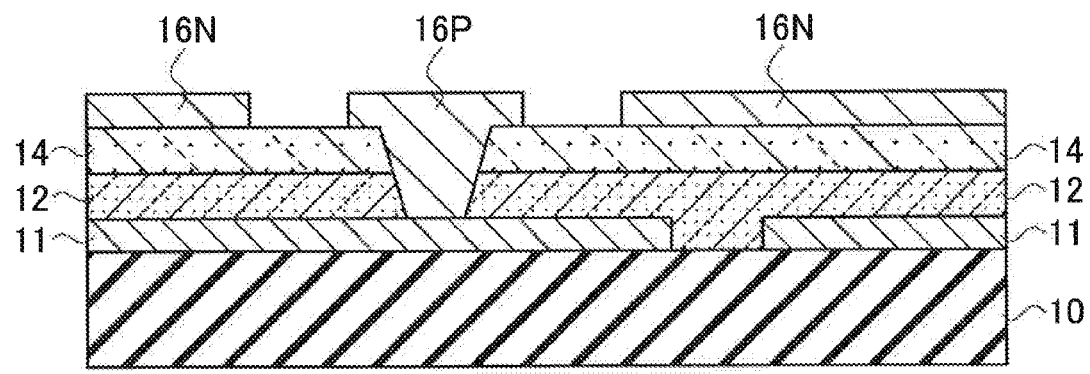

FIG. 77A is a schematic cross-sectional structure diagram showing a state forming pattern-forming a second electrode layer on the bulk heterojunction organic active layer and forming a via electrode layer connected to the first electrode layer via the third via hole, in a process of the fabrication method of the organic thin film photovoltaic device according to the modified example 2 of the third embodiment.

Figure 77B:
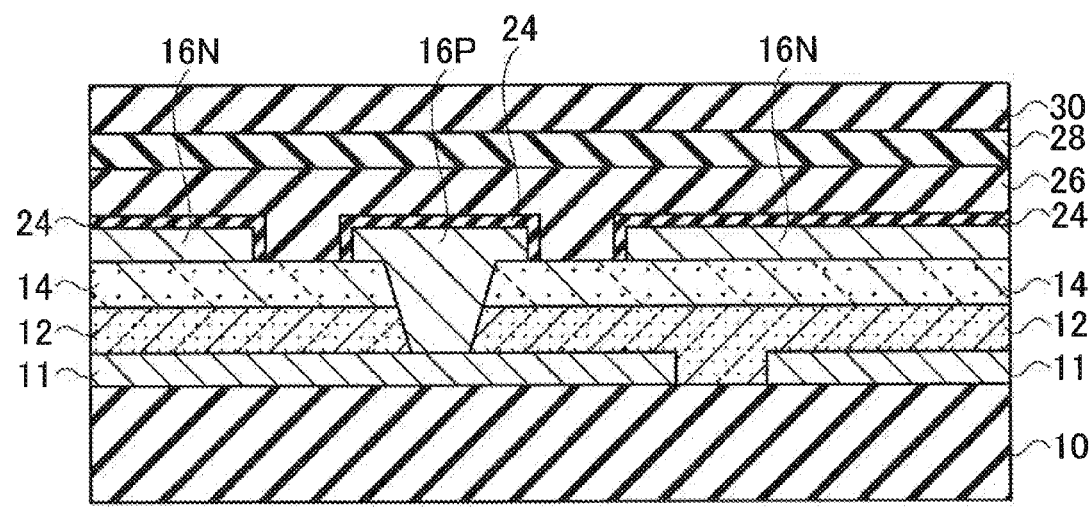

FIG. 77B is a schematic cross-sectional structure diagram showing a state where the passivation layer, the colored barrier layer, and the back sheet passivation layer are formed on the second electrode layer and the via electrode layer after forming the oxide layer on the surface of the second electrode layer and the via electrode layer by using oxygen plasma treatment, in a process of the fabrication method of the organic thin film photovoltaic device according to the modified example 2 of the third embodiment.

Figure 78:
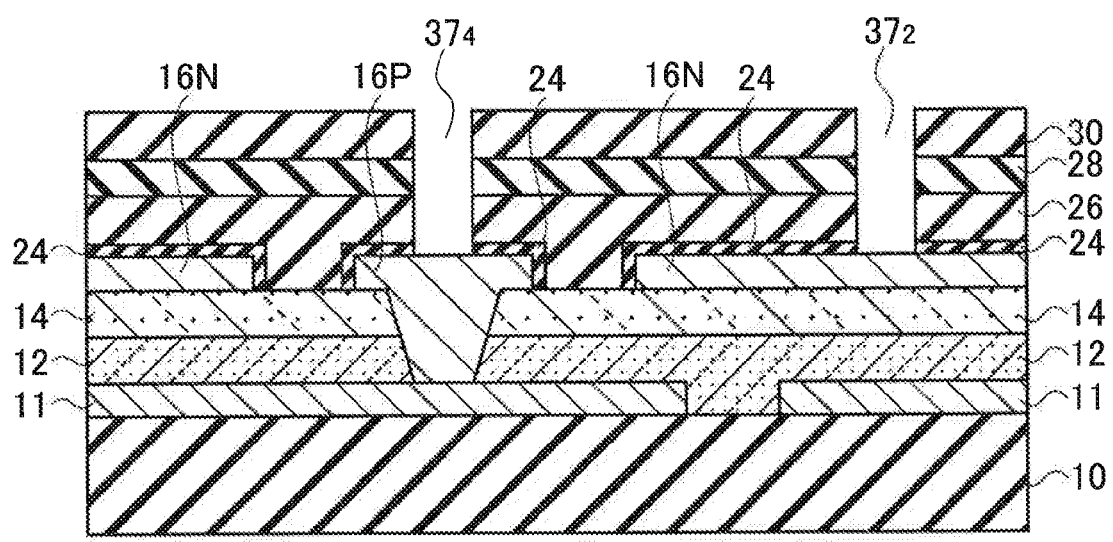

FIG. 78 is a schematic cross-sectional structure diagram showing a state of forming a fourth via hole and the second via hole each configured to pass through the back sheet passivation layer, the colored barrier layer, and the passivation layer in the direction perpendicular to the substrate, wherein the fourth via hole is configured to reach the via electrode layer and the second via hole is configured to reach the second electrode layer, in a process of the fabrication method of the organic thin film photovoltaic device according to the modified example 2 of the third embodiment.

DESCRIPTION OF EMBODIMENTS

Next, the embodiments will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from an actual thing. Therefore, detailed thickness and size should be determined in consideration of the following explanation.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

In the organic thin film photovoltaic devices according to the first to third embodiments, "transparent" is defined as that the transmissivity thereof is not less than approximately 50%. In the organic thin film photovoltaic devices according to the embodiments, the "transparent" is used for the purpose of being transparent and colorless with respect to visible light. The visible light is equivalent to light having a wavelength of approximately 360 nm to approximately 830 nm and energy of approximately 3.4 eV to approximately 1.5 eV, and it can be said that it is transparent if the transmission rate is not less than 50% in such a region.

[First Embodiment]

Figure 1:
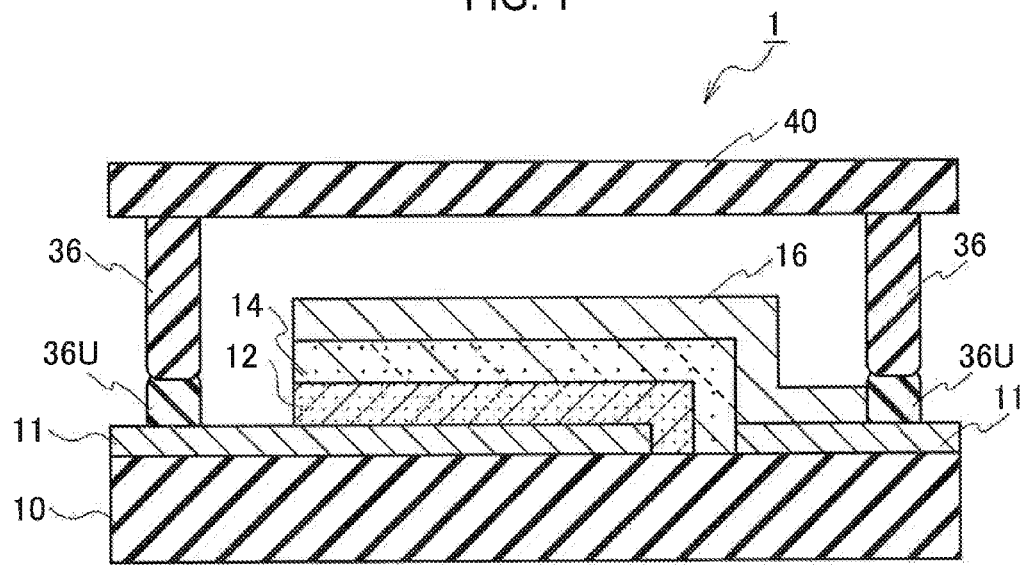
FIG. 1 is a schematic cross-sectional structure diagram of an organic thin film photovoltaic device according to a first embodiment.

As shown in FIG. 1, an organic thin film photovoltaic device 1 according to the first embodiment includes; a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a sealing glass 40 configured to be opposed to the substrate 10, and configured to seal a laminated structure composed of the first electrode layer 11, the hole transport layer 12, the bulk heterojunction organic active layer 14, and the second electrode layer 16; and a glass frit 36 disposed between the sealing glass 40 and the substrate 10 and configured to seal the above-mentioned laminated structure.

As shown in FIG. 1, an organic thin film photovoltaic device 1 according to the first embodiment is made by laminating the organic layer (12, 14) having a thickness of approximately several 100 nm used for a power generation layer (photovoltaic layer) on the glass substrate 10 with ITO, and by evaporating a metal layer, e.g. an aluminum, as the second electrode layer 16. Since a pure aluminum formed as the second electrode layer 16 is easily oxidized, a passive state film may be formed or a passivation film, e.g. SiN and SiON, may be laminated, in order to improve durability.

In the embodiment, the glass frit 36 is disposed on the sealing glass 40. Thereby, damage to organic layers, e.g. the hole transport layer 12 and the bulk heterojunction organic active layer 14, due to high-temperature sintering of the glass frit is avoided since the organic layers are disposed on the substrate 10.

In the organic thin film photovoltaic device 1 according to the embodiment, glass frit paste which can be coated as arbitrary patterns using screen printing technology or a dispenser can be coated/high-temperature fired thereon, thereby forming the glass frit 36.

The height of the glass frit 36 is approximately 1 μm to approximately 100 μm, for example, and the width of the glass frit 36 is approximately 0.2 mm to approximately 2.0 mm, for example. Contact between the sealing glass 40 and the internal elements can be avoided by disposing the glass frit 36.

In the organic thin film photovoltaic device 1 according to the first embodiment, as shown in FIG. 1, a resin 36U for bonding the surface of the glass frit 36 is provided in order to bond the sealing glass 40 and the substrate 10 on which the elements are formed to each other.

Thermosetting resins or UV curing resins are applicable to the resin 36U. It is preferable to use the UV curing resin in order to avoid heat shock to be given to the elements. If the UV curing resin is used, it is effective to use a transparent glass frit which passes through the ultraviolet rays. As glass frit materials having high whole energy spectrum line transmittance with respect to the UV light (e.g., equal to or greater than 90%), Zn based glasses can be applied thereto, for example. Moreover, the glass frit can be composed of Bi—B—Si based powdered oxide. The glass frit composed of the Bi—B—Si based oxide has the property of absorbing infrared rays, producing heat, and fusing. Accordingly, it is possible to weld by irradiating a pasty burning body containing such a glass frit with infrared laser (e.g., the wavelength is 1064 nm).

Figure 2:
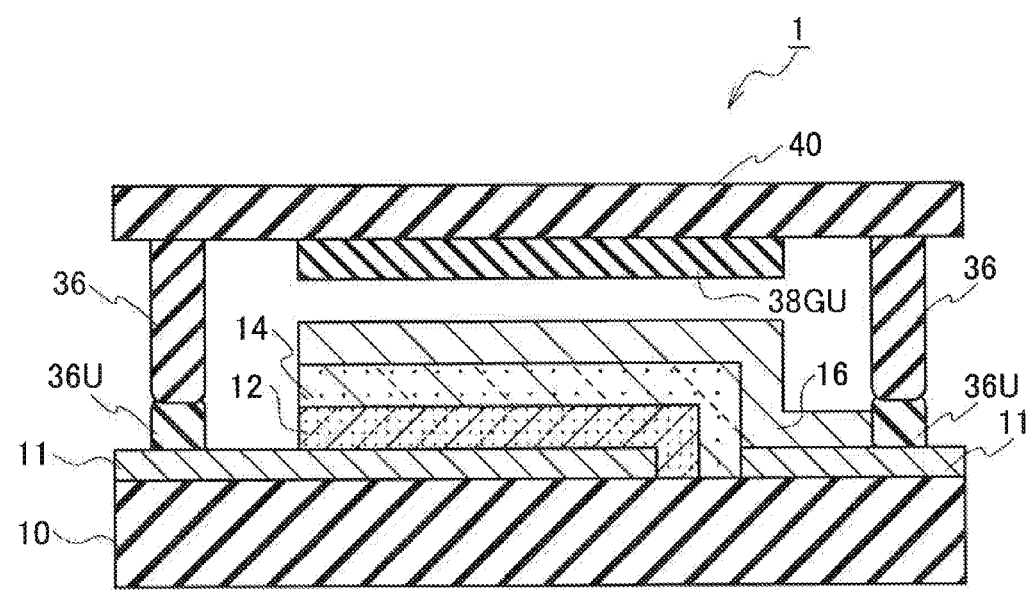
FIG. 2 is another schematic cross-sectional structure diagram of the organic thin film photovoltaic device according to the first embodiment.

In the organic thin film photovoltaic device according to the first embodiment, as shown in FIG. 2, oxygen ($O_2$) getter action may be improved by providing gettering sheet desiccant 38GU on the internal wall surface of the sealing glass 40. As the gettering sheet desiccant, oxygen ($O_2$) based gettering agents, e.g., strontium oxide, (SrO), calcium oxide (CaO), etc. can be applied.

(Comparative Example)

Figure 3:
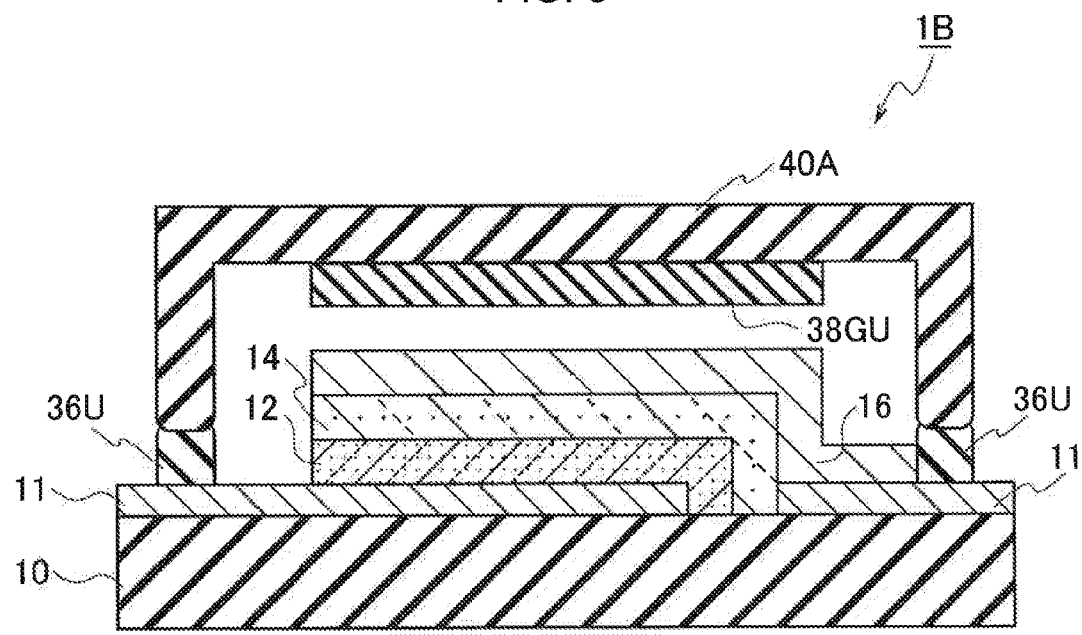
FIG. 3 is a schematic cross-sectional structure diagram of an organic thin film photovoltaic device according to a comparative example.

As shown in FIG. 3, an engraved glass 40A is applied to sealing an organic thin film photovoltaic device 1B according to a comparative example. The thickness of the outside shape of the engraved glass 40A is approximately 0.7 mm, for example, and the depth of an engraved portion for containing the element part is approximately 0.3 mm, for example. When arbitrary patterns are engraved, in the engraved glass 40A, it is necessary to create a version of a mask for creating an engraved portion for each pattern. In order to form such an engraved portion, etching with fluoric acid is needed, thereby needing cost and time and effort. Moreover, sealing using the engraved glass 40A is expensive, and the module is increased in thickness and weight.

On the other hand, the organic thin film photovoltaic device according to the embodiment uses for sealing the sealing glass 40 and the transparent glass frit 36 annealed on the sealing glass 40. As the sealing glass 40, alkali-free tempered glasses approximately 0.1 mm to approximately 0.2 mm in thickness can be applied, for example.

Moreover, the glass frit 36 is formed by sintering for approximately 30 minutes at approximately 500 degrees C. to 590 degrees C., after coating glass frit paste (organic solvent+glass frit) with a screen printing to the sealing glass 40 and then drying the organic solvent at approximately 100 degrees C. The thickness of the glass frit 36 is approximately 5 µm to approximately 20 µm, for example. Moreover, the thickness of the resin 36U for the purpose of bonding between the glass frit 36 and the substrate 10 is also approximately 5 µm to approximately 20 µm, for example.

The glass frit 36 can be formed on the sealing glass 40 without using dangerous chemicals since the patterns can be freely drawn by using dispenser coating. Moreover, further weight saving and thin-layering of the module in the organic thin film photovoltaic device according to the embodiment can be realized by using a relatively thin cover glass (sealing glass 40) compared with the engraved glass 40A.

(Operational Principle)

Figure 4:
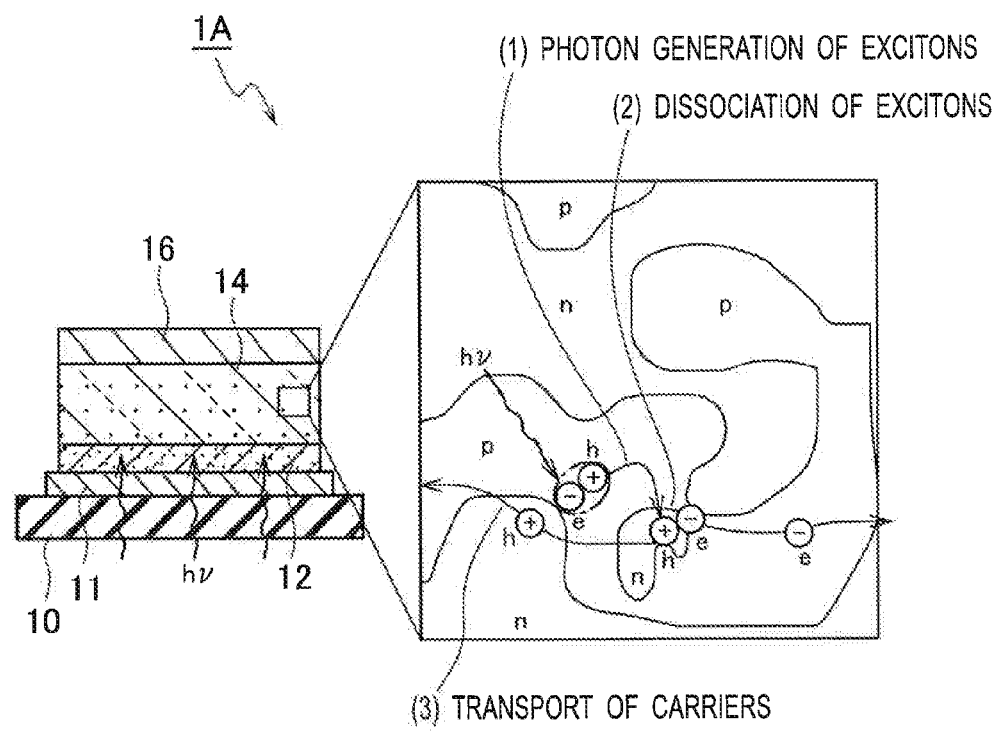
FIG. 4 is a schematic diagram for explaining a theoretic configuration and operation of the organic thin film photovoltaic device according to the first embodiment.
Figure 5:
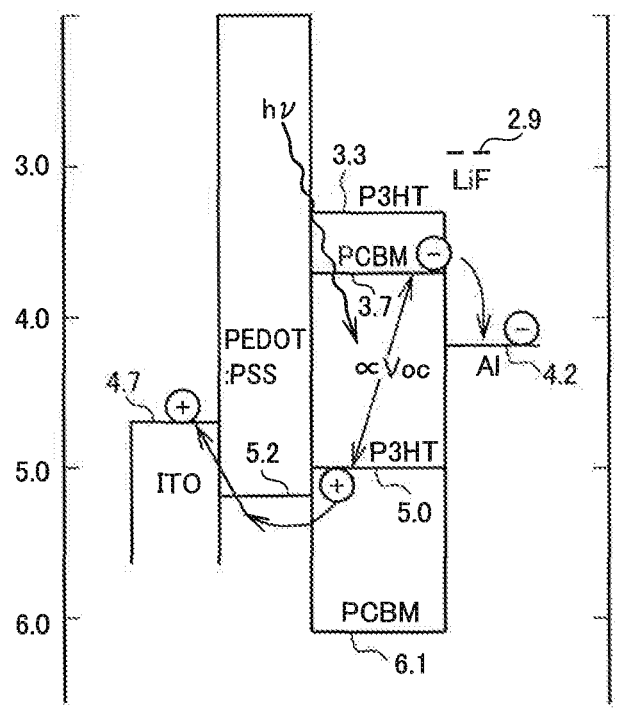
FIG. 5 is a diagram of energy band structure of various kinds of materials of the organic thin film photovoltaic device shown in FIG. 4.

A schematic diagram for explaining an operational principle of the organic thin film photovoltaic device 1A is expressed as shown in FIG. 4. Moreover, an energy band structure of various kinds of materials used for the organic thin film photovoltaic device 1A shown in FIG. 4 is expressed as shown in FIG. 5. With reference to FIGS. 4 and 5, there will now be explained theoretic configuration and operation of the organic thin film photovoltaic device 1A according to the first embodiment.

As shown in the left-hand side of FIG. 4, the organic thin film photovoltaic device 1A according to the first embodiment includes: a substrate 10; an optically transmissive electrode layer 11 disposed on the substrate 10; a hole transport layer 12 disposed on the optically transmissive electrode layer 11; a bulk heterojunction organic active layer 14 disposed on the hole transport layer 12; and a second electrode layer 16 disposed on the bulk heterojunction organic active layer 14. The second electrode layer 16 is formed of aluminum (Al), for example, and used for cathode electrode layer.

In this case, the bulk heterojunction organic active layer 14 forms a complicated bulk hetero pn junction such that p type organic active layer regions and n type organic active layer regions are existed, as shown in the right-hand side of FIG. 3. In the embodiment, a p type organic active layer region is formed of P3HT (poly(3-hexylthiophene-2,5diyl)), for example, and an n-type organic active layer region is formed of PCBM (6,6-phenyl-C61-butyric acid methyl ester), for example.

(a) Firstly, when light is absorbed, photon generation of excitons occur in the bulk heterojunction organic active layer 14.

(b) Next, the excitons are dissociated to free carriers of electrons (e−) and holes (h+) by spontaneous polarization, in the pn junction interfaces in the bulk heterojunction organic active layer 14.

(c) Next, the dissociated holes (h+) travel towards the optically transmissive electrode layer 11 acting as an anode electrode, and the dissociated electrons (e−) travel towards the cathode electrode layer 16.

(d) As a result, between the cathode electrode layer 16 and the optically transmissive electrode layer 11, a reverse current conducts and an open circuit voltage Voc occurs, and thereby the organic thin film photovoltaic device 1A can be obtained.

Figure 6A:
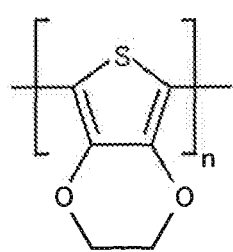
FIG. 6A shows a chemical structural formula of PEDOT applied to the organic thin film photovoltaic device according to the first embodiment.
Figure 6B:
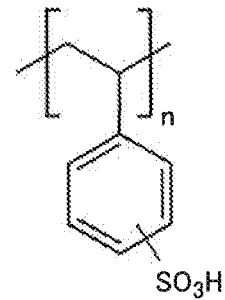
FIG. 6B shows a chemical structural formula of PSS applied to the organic thin film photovoltaic device according to the first embodiment.

In the organic thin film photovoltaic device 1A, a chemical structural formula of PEDOT is expressed as shown in FIG. 6A, and a chemical structural formula of PSS is expressed as shown in FIG. 6B, among PEDOT:PSS applied to the hole transport layer 12.

Figure 7A:
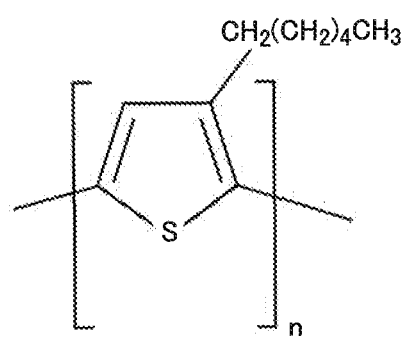
FIG. 7A shows a chemical structural formula of P3HT used as a p type material applied to the organic thin film photovoltaic device according to the first embodiment.
Figure 7B:
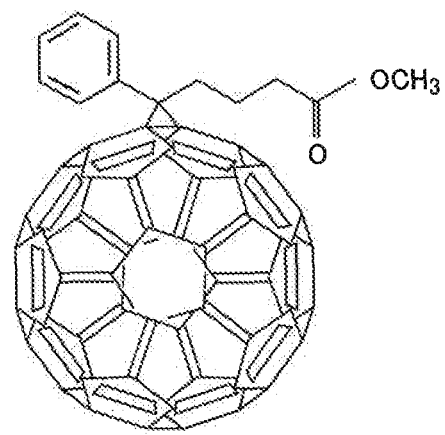
FIG. 7B shows a chemical structural formula of PCBM used as a n type material applied to the organic thin film photovoltaic device according to the first embodiment.

In the organic thin film photovoltaic device 1A according to the first embodiment, a chemical structural formula of P3HT applied to the bulk heterojunction organic active layer 14 is expressed as shown in FIG. 7A, and a chemical structural formula of PCBM applied to the bulk heterojunction organic active layer 14 is expressed as shown in FIG. 7B.

Figure 8A:
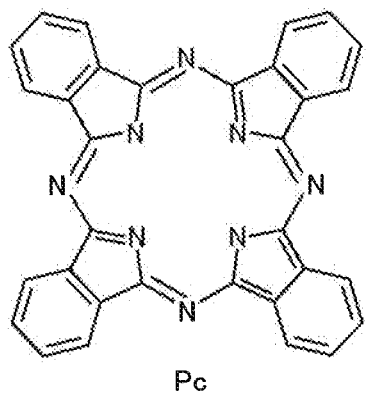
FIG. 8A shows a chemical structural formula of a material, which is an example of Pc: phthalocyanine, used for vacuum evaporation, in the organic thin film photovoltaic device according to the first embodiment.
Figure 8B:
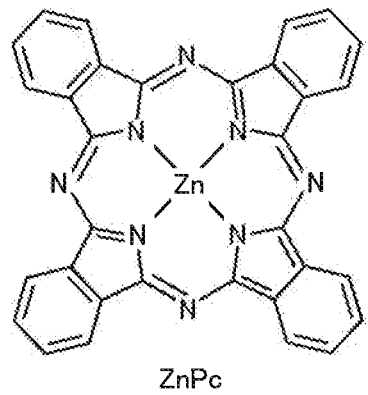
FIG. 8B shows a chemical structural formula of a material, which is an example of ZnPc: zinc phthalocyanine, used for vacuum evaporation, in the organic thin film photovoltaic device according to the first embodiment.
Figure 8C:
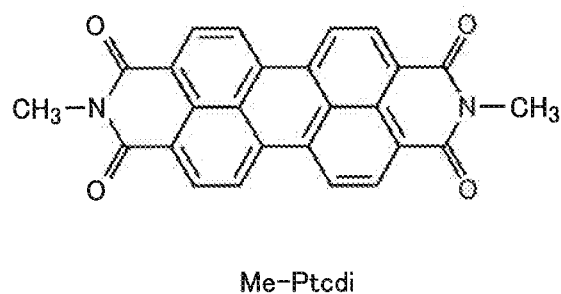
FIG. 8C shows a chemical structural formula of a material, which is an example of Me-Ptcdi, used for vacuum evaporation, in the organic thin film photovoltaic device according to the first embodiment.
Figure 8D:
FIG. 8D shows a chemical structural formula of a material, which is an example of $C_{60}$: fullerene, used for vacuum evaporation, in the organic thin film photovoltaic device according to the first embodiment.

In the organic thin film photovoltaic device 1A, examples of chemical structural formulas of materials used with a vacuum deposition is as follows: That is, an example of phthalocyanine (Pc: Phthalocyanine) is expressed as shown in FIG. 8A, an example of zinc phthalocyanine (ZnPc: Zinc-phthalocyanine) is expressed as shown in FIG. 8B, an example of Me-Ptcdi (N,N'-dimethyl perylene-3,4,9,10-dicarboximide) is expressed as shown in FIG. 8C, and an example of fullerene ($C_{60}$: Buckminster fullerene) is expressed as shown in FIG. 8D.

In the organic thin film photovoltaic device 1A, examples of chemical structural formulas of materials used with a solution process is as follows: That is, an example of MDMO-PPV (poly[2-methoxy-5-(3,7-dimethyl octyloxy)]-1,4-phenylene vinylene) is expressed as shown in FIG. 9A. An example of PFB (poly(9,9'-dioctylfluorene-co-bis-N,N'-(4-butylphenyl)-bis-N,N'-phenyl-1,4-phenylenediamine)) is expressed as shown in FIG. 9B. An example of CN-MDMO-PPV (poly-[2-methoxy-5-(2'-ethylhexyloxy)-1,4-(1-cyanovinylene)-phenylene]) is expressed as shown in FIG. 9C. An example of PFO-DBT (poly[2,7-(9,9-dioctyl-fluorene)-alt-5,5-(4',7'-di-2-thienyl-2',1',3'-benzothiadiazole)]) is expressed as shown in FIG. 9D.

Also, an example of F8BT (poly(9,9'-dioctyl fluorenecobenzothiadiazole)) is expressed as shown in FIG. 9E, and an example of PCDTBT (poly[N-9'-hepta-decanyl-2,7-carbazole-alt-5,5-(4',7'-di-thienyl-2',1',3'-benzothiadiazole)]) is expressed as shown in FIG. 9F.

Yet also, an example of $PC_{60}BM$ (6,6-phenyl-C61-butyric acid methyl ester) is expressed as shown in FIG. 9G, and an example of $PC_{70}BM$ (6,6-phenyl-C71-butyric acid methyl ester) is expressed as shown in FIG. 9H.

Figure 10:
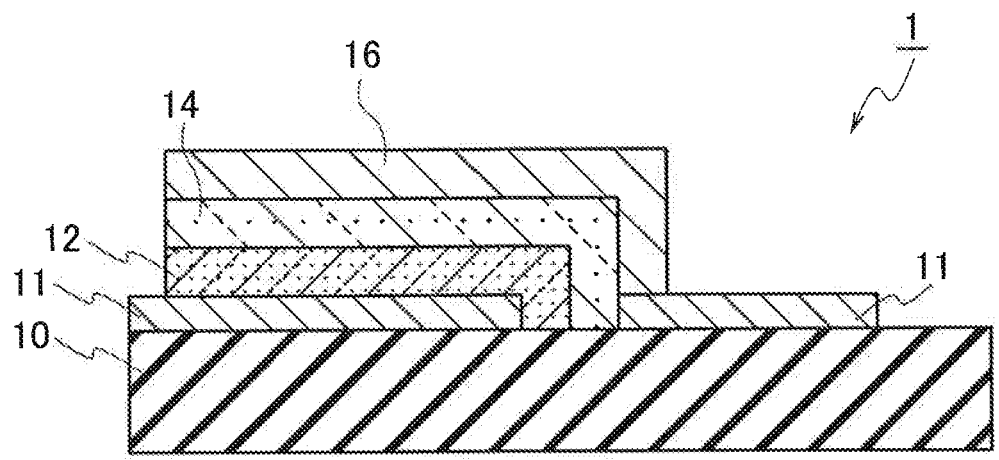
FIG. 10 is a schematic cross-sectional structure diagram showing a laminated structure portion of the organic thin film photovoltaic device according to the first embodiment.

As shown in FIG. 10, a laminated structure portion of the organic thin film photovoltaic device 1 according to the first embodiment includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; and a cathode electrode layer (second electrode layer) 16 disposed on the bulk heterojunction organic active layer 14.

Figure 11:
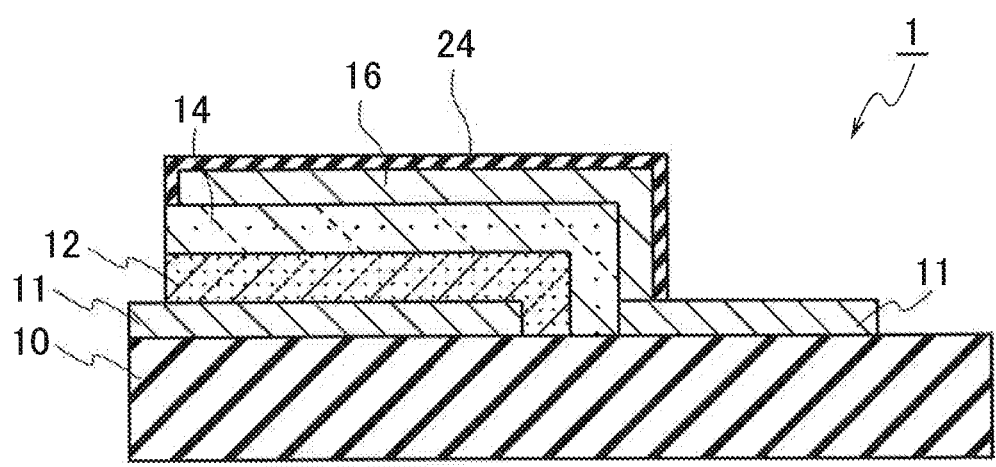
FIG. 11 is a schematic cross-sectional structure diagram showing a laminated structure portion of an organic thin film photovoltaic device according to a modified example of the first embodiment.

Moreover, a laminated structure portion of the organic thin film photovoltaic device 1 according to a modified example of the first embodiment further includes a passive state film 24 disposed on the surface of the second electrode layer 16, as shown in FIG. 11. In the embodiment, the passive state film 24 is composed of an oxide film of the second electrode layer 16. Moreover, the oxide film of the second electrode layer 16 can be formed with oxygen plasma treatment applied on the surface of the second electrode layer 16. The thickness of the passive state film 24 is from approximately 10 angstroms to approximately 100 angstroms, for example. In addition, a passivation film (not illustrated) disposed on the passive state film 24 may be provided. The passivation film can be composed of an SiN film or an SiON film, for example.

The second electrode layer 16 may be composed of any one of metals, such as Al, W, Mo, Mn, or Mg. If the second electrode layer 16 is formed of Al, the passive state film 24 is an alumina ($Al_2O_3$) film.

As shown in FIG. 11, even in the case where moisture or oxygen is infiltrated into the bulk heterojunction organic active layer 14, the organic thin film photovoltaic device 1 including a passive state film 24 on the surface of the second electrode layer 16 can prevent a situation where a second electrode layer 16 is oxidized due to the moisture or oxygen. Accordingly, degradation of the organic solar cell can be reduced, thereby improving the durability thereof.

(Fabrication Method)

Figure 12A:
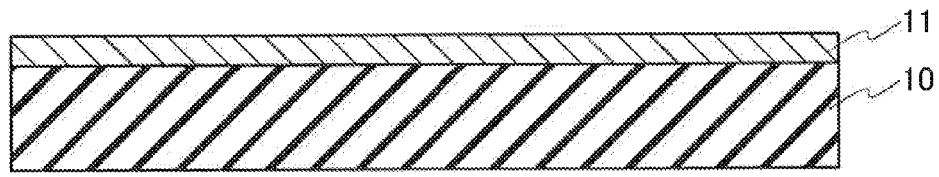
FIG. 12A is a process chart of preparing an ITO substrate on which a transparent electrode layer is formed on the substrate, in a process of a fabrication method of the organic thin film photovoltaic device according to the first embodiment.
Figure 12B:
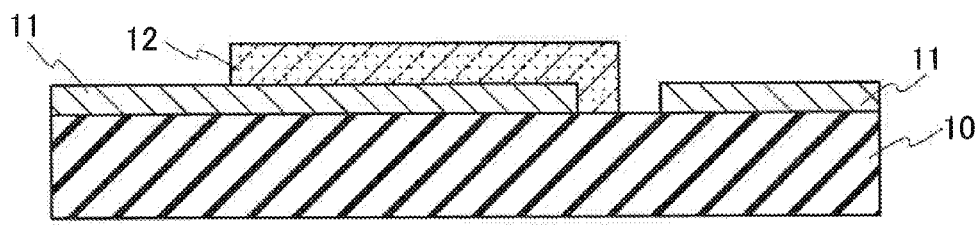
FIG. 12B is a process chart of pattern-forming a hole transport layer on a transparent electrode layer after patterning the transparent electrode layer, in a process of the fabrication method of the organic thin film photovoltaic device according to the first embodiment.
Figure 12C:
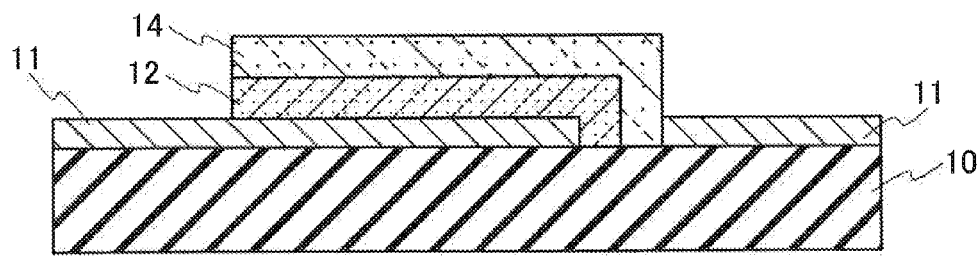
FIG. 12C is a process chart of pattern-forming a bulk heterojunction organic active layer on the hole transport layer, in a process of the fabrication method of the organic thin film photovoltaic device according to the first embodiment.

In a process of a fabrication method of the organic thin film photovoltaic device according to the first embodiment, a process of preparing an ITO substrate on which the transparent electrode layer 11 is formed on the substrate 10 is expressed as shown in FIG. 12A. Moreover, a process of pattern-forming the hole transport layer 12 on the transparent electrode layer 11 after patterning the transparent electrode layer 11 is expressed as shown in FIG. 12B, a process of pattern-forming the bulk heterojunction organic active layer 14 on the hole transport layer 12 is expressed as shown in FIG. 12C, and a process of pattern-forming the second electrode layer 16 on the bulk heterojunction organic active layer 14 is expressed as shown in FIG. 12D.

Figure 13A:
FIG. 13A is a process chart of preparing a sealing glass, in a process of the fabrication method of the organic thin film photovoltaic device according to the first embodiment.
Figure 13B:
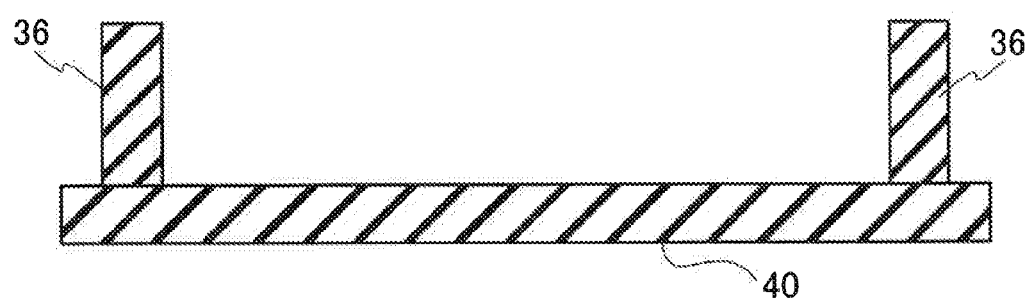
FIG. 13B is a process chart of forming a glass frit on the sealing glass, in a process of the fabrication method of the organic thin film photovoltaic device according to the first embodiment.

In a process of the fabrication method of the organic thin film photovoltaic device according to the first embodiment, a process of preparing the sealing glass 40 is expressed as shown in FIG. 13A. Moreover, a process of forming the glass frit 36 on the sealing glass 40 is expressed as shown in FIG. 13B, and a process of forming the resin 36U at a tip portion of the glass frit 36 is expressed as shown in FIG. 13C.

Figure 12D:
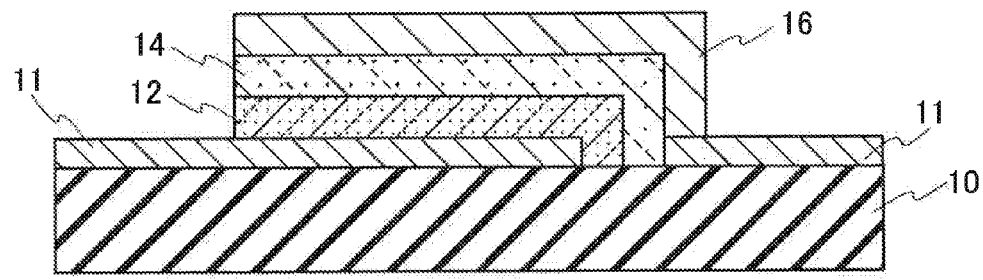
FIG. 12D is a process chart of pattern-forming a second electrode layer on the bulk heterojunction organic active layer, in a process of the fabrication method of the organic thin film photovoltaic device according to the first embodiment.
Figure 13C:
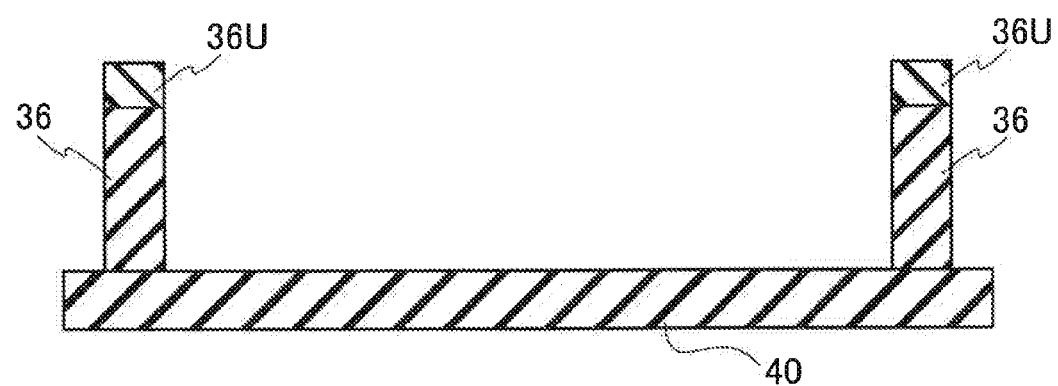
FIG. 13C is a process chart of forming an ultraviolet (UV) curing resin at a tip portion of the glass frit, in a process of the fabrication method of the organic thin film photovoltaic device according to the first embodiment.
Figure 14A:
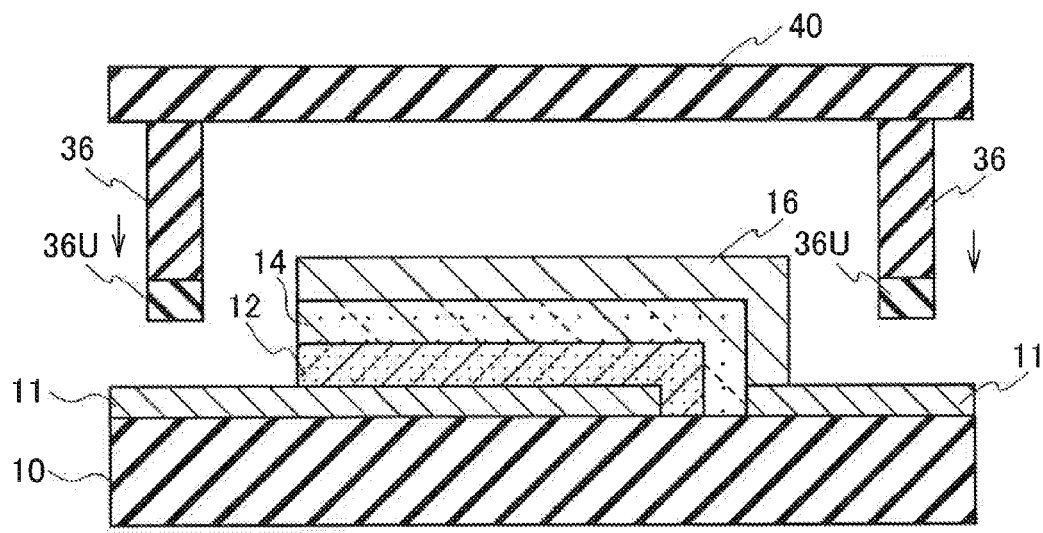
FIG. 14A is a process chart of opposing the ITO substrate after the process shown in FIG. 12D and the sealing glass after the process shown in FIG. 13C to each other, in a process of the fabrication method of the organic thin film photovoltaic device according to the first embodiment.
Figure 14B:
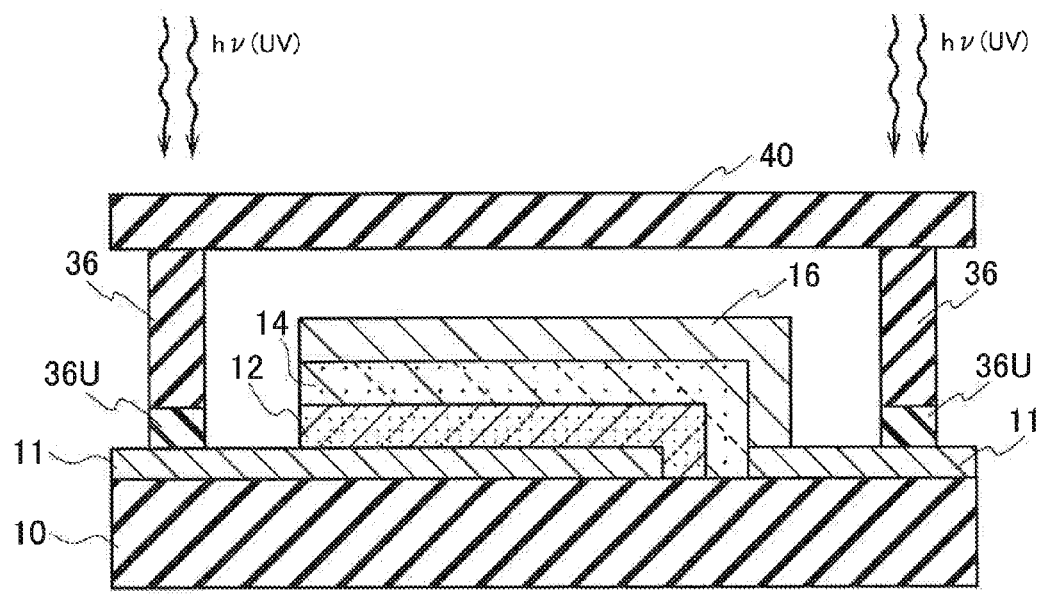
FIG. 14B is a process chart of adhering the ITO substrate and the sealing glass to be sealed via the glass frit and the UV curing resin after the process shown in FIG. 14A, in a process of the fabrication method of the organic thin film photovoltaic device according to the first embodiment.

In a process of the fabrication method of the organic thin film photovoltaic device according to the first embodiment, a process chart of opposing the ITO substrate after the process shown in FIG. 12D and the sealing glass after the process shown in FIG. 13C to each other is expressed as FIG. 14A. A process chart of adhering the ITO substrate 10 and the sealing glass 40 to be sealed via the glass frit 36 and the UV curing resin 36U after the process shown in FIG. 14A is expressed as shown in FIG. 14B.

As shown in FIGS. 12-14, the fabrication method of the organic thin film photovoltaic device 1 according to the first embodiment includes: preparing the substrate 10; forming the first electrode layer 11 on the substrate 10; forming the hole transport layer 12 on the first electrode layer 11; forming the bulk heterojunction organic active layer 14 on the hole transport layer 12; forming the second electrode layer 16 on the bulk heterojunction organic active layer 14; forming the glass frit 36 on the sealing glass 40; forming the resin 36U at the tip portion of the glass frit 36; and opposing the sealing glass 40 and the substrate 10 to each other, and sealing a laminated structure composed of the first electrode layer 11, the hole transport layer 12, the bulk heterojunction organic active layer 14, and the second electrode layer 16 with the glass frit 36 and the resin 36U.

With reference to FIGS. 12-14, there will now be explained the fabrication method of the organic thin film photovoltaic device according to the first embodiment.

(a) Firstly, as shown in FIG. 12A, the transparent electrode layer 11 composed of ITO, for example, is formed on the substrate 10.

(b) Next, as shown in FIG. 12B, the hole transport layer 12 is pattern-formed on the transparent electrode layer 11 after patterning the transparent electrode layer 11. Wet etching technology, oxygen plasma etching technology, laser patterning technology, nano-imprint technology, etc. are applicable to the patterning of the transparent electrode layer 11. Spin coating technology, spray technology, screen printing technology, etc. are applicable to the formation of the hole transport layer 12. In this case, in the process for forming the hole transport layer 12, PEDOT:PSS may be formed with spin coating, for example, and annealing may be performed for approximately 10 minutes at 120 degrees C. for the purpose of water removal.

(c) Next, as shown in FIG. 12C, the bulk heterojunction organic active layer 14 used as a power generation layer (photovoltaic layer) is formed on the hole transport layer 12. In the formation process of the bulk heterojunction organic active layer 14, P3HT is formed with spin coating, for example. In the formation of the bulk heterojunction organic active layer 14, after forming the bulk heterojunction organic active layer 14 in film form using ink-jet processing, it is heated at approximately 100-120 degrees C. for approximately 10-30 minutes in order to dry the organic solvent.

(d) Next, as shown in FIG. 12D, the cathode electrode layer 16 is formed on the bulk heterojunction organic active layer 14. The cathode electrode layer 16 can be formed of a metal layer, e.g. Al, W, Mo, Mn, Mg, etc., for example, with vacuum thermal vapor deposition. Moreover, screen printing technology may be applied thereto.

(e) Next, as shown in FIG. 13A, the sealing glass 40 is prepared. As the sealing glass 40, alkali-free tempered glasses approximately 0.1 mm to approximately 0.2 mm in thickness can be applied, for example.

(f) Next, as shown in FIG. 13B, the glass frit 36 is formed on the sealing glass 40. Moreover, the glass frit 36 is formed by sintering for approximately 30 minutes at approximately 500 degrees C. to 590 degrees C., after coating glass frit paste (organic solvent+glass frit) with a screen printing to the sealing glass 40 and then drying the organic solvent at approximately 100 degrees C. The thickness of the glass frit 36 is approximately 5 µm to approximately 20 µm, for example. The glass frit 36 can be formed on the sealing glass 40 without using dangerous chemicals since the patterns can be freely drawn by using dispenser coating.

(g) Next, as shown in FIG. 13C, the resin 36U for the purpose of bonding between the glass frit 36 and the substrate 10 is formed at the tip portion of the glass frit 36. The thickness of the resin 36U is also approximately 5 µm to approximately 20 µm, for example. The resin 36U may be formed of an ultraviolet (UV) curing resin. Moreover, the resin 36U may be formed of a thermosetting resin. However, the temperature of the heat curing is preferably equal to or less than a temperature of the degree that a damage is not given to the hole transport layer 12 and the bulk heterojunction organic active layer 14, e.g., approximately 100 degrees C. to approximately 120 degrees C.

(h) Next, as shown in FIG. 14A, the ITO substrate 10 after the process shown in FIG. 12D and the sealing glass 40 after the process shown in FIG. 13C are opposed to each other.

(i) Next, as shown in FIG. 14B, the whole element is sealed with the sealing glass (cover glass) 40, and the glass frit 36 and resin 36U. The glass frit 36 and the transparent electrode layer (ITO) 11 are bonded to each other with the resin 36U. The sealing process is effective to be performed under the nitrogen atmosphere in order to avoid degradation due to moisture or oxygen in the atmospheric air.

According to the above-mentioned processes, the organic thin film photovoltaic device 1 according to the first embodiment can be obtained.

In addition, the oxide film (passive state film) 24 may be formed on the surface of the second electrode layer 16. Moreover, the passive state film 24 can be formed by applying oxygen plasma treatment to the second electrode layer 16. Using oxygen plasma, an unnecessary organic layer is removed and them oxide film treatment is applied to a reexposed aluminum surface. Moreover, the silicon nitride film etc. may be formed with Chemical Vapor Deposition (CVD) as a passivation film on the aluminum surface. The thickness of the silicon nitride film is approximately 0.5 µm to approximately 1.5 µm, for example. Coating protection of the internal elements is performed with the silicon nitride film, thereby further improving the durability thereof.

Moreover, an affect due to moisture or oxygen may be further avoided by disposing the gettering sheet desiccant 38GU on the internal wall surface of the sealing glass 40. Still higher durability is securable by coating/forming a resin desiccant or an oxygen getter around the sealed part.

It is effective to implement UV irradiation from the sealing glass 40 side when curing the UV curing resin 36U with the UV irradiation by inside $N_2$ or vacuum decompression. This is because the element parts can be protected since the aluminum serves as a reflecting layer to the UV irradiation.

(Configuration Example of Sealed Part)

Figure 15A:
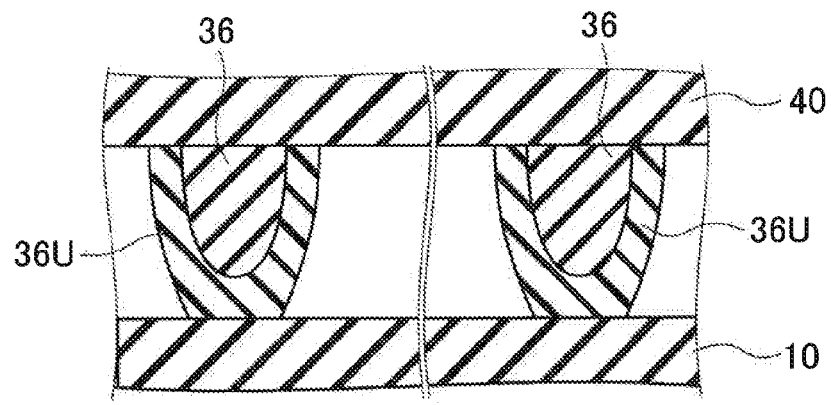
FIG. 15A is a schematic cross-sectional structure diagram showing a configuration in which the glass frit is covered with the UV curing resin, in the configuration of the sealed part of the organic thin film photovoltaic device according to the first embodiment.
Figure 15B:
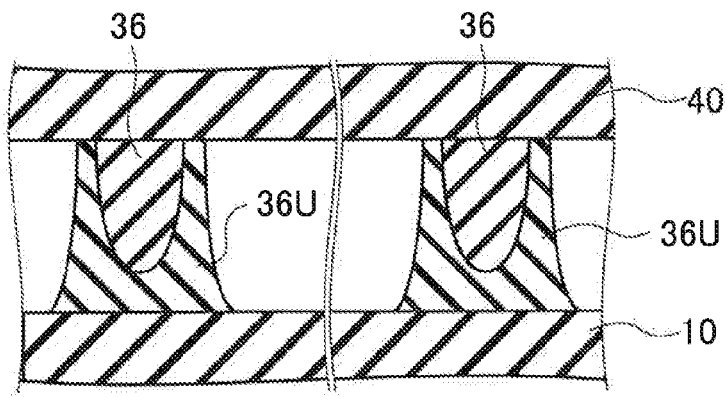
FIG. 15B is a schematic cross-sectional structure diagram showing another configuration in which the glass frit is covered with the UV curing resin, in the configuration of the sealed part of the organic thin film photovoltaic device according to the first embodiment.

As shown in FIG. 15A, the sealed part in the organic thin film photovoltaic device according to the first embodiment may be provided with a configuration in which the glass frit 36 is covered with the UV curing resin 36U. Furthermore, as shown in FIG. 15B, the sealed part in the organic thin film photovoltaic device according to the embodiment may be provided with a configuration in which a glass frit 36 is covered with the UV curing resin 36U, and a contact area between the UV curing resin 36U and the substrate 10 is increased as compared with the configuration of FIG. 15A.

Figure 16:
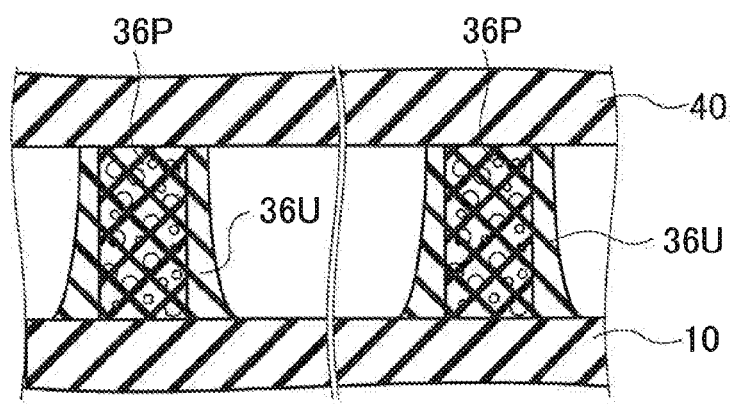
FIG. 16 is a schematic cross-sectional structure diagram showing a configuration in which a porous glass frit is covered with the UV curing resin, in the configuration of the sealed part of the organic thin film photovoltaic device according to the first embodiment.

Moreover, as shown in FIG. 16, the sealed part in the organic thin film photovoltaic device according to the first embodiment may be provided with a configuration in which a porous glass frit 36P is covered with UV curing resin 36U. That is, porous materials may be used for the glass frit. If applying the porous glass frit 36P, harder adhesion can be realized since the glass frit 36P is impregnated with the resin 36U and thereby an "anchor effect" can be obtained.

Moreover, the glass frit 36 in the organic thin film photovoltaic device according to the first embodiment may have a wedge shape, a taper shape, or a spindle-formed taper shape to which a cross-sectional area becomes small as away from the sealing glass 40.

Moreover, a plurality of the glass frits 36 may be formed thereon.

Figure 17A:
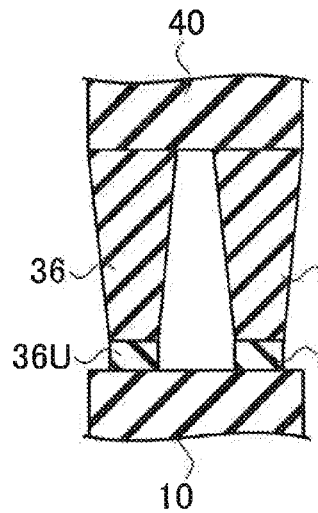
FIG. 17A is a schematic cross-sectional structure diagram showing a configuration in which two glass frits formed therein have a wedge shape, in the configuration of the sealed part of the organic thin film photovoltaic device according to the first embodiment.
Figure 17B:
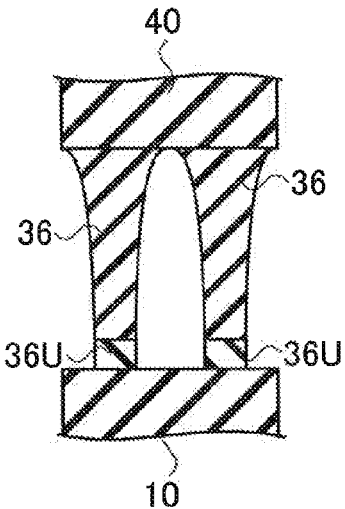
FIG. 17B is a schematic cross-sectional structure diagram showing a configuration in which two glass frits formed therein have a taper shape, in the configuration of the sealed part of the organic thin film photovoltaic device according to the first embodiment.
Figure 17C:
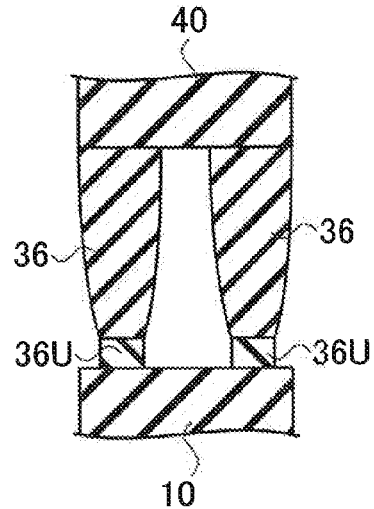
FIG. 17C is a schematic cross-sectional structure diagram showing a configuration in which the two glass frits formed therein have a spindle-formed taper shape of which the cross-sectional area becomes smaller as away from the sealing glass, in a configuration of the sealed part of the organic thin film photovoltaic device according to the first embodiment.

FIG. 17A shows a configuration in which two glass frits 36 formed therein have a wedge shape, in the configuration of the sealed part of the organic thin film photovoltaic device according to the first embodiment. Moreover, a configuration example in which two glass frits 36 formed therein have a taper shape is expressed as shown in FIG. 17B. Moreover, FIG. 17C shows a configuration in which the two glass frits 36 formed therein have a spindle-formed taper shape of which the cross-sectional area becomes smaller as away from the sealing glass 40.

Figure 18A:
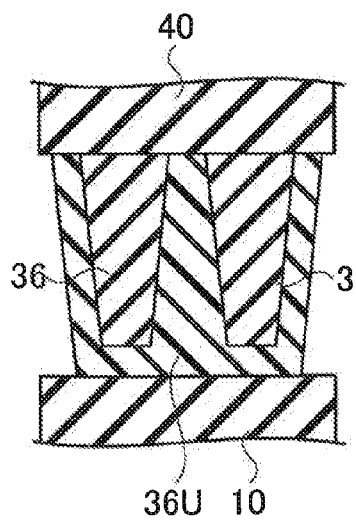
FIG. 18A is a schematic cross-sectional structure diagram showing a configuration in which the two glass frits formed therein have a wedge shape and are covered with the UV curing resin, in the configuration of the sealed part of the organic thin film photovoltaic device according to the first embodiment.
Figure 18B:
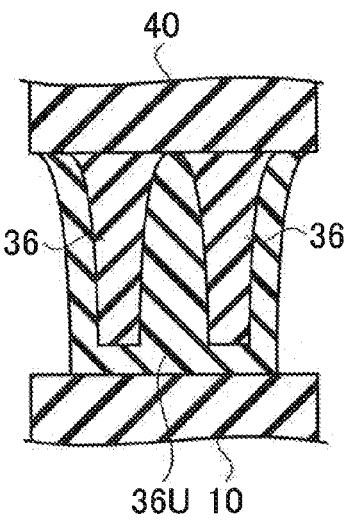
FIG. 18B is a schematic cross-sectional structure diagram showing a configuration in which the two glass frits formed therein have a taper shape and are covered with the UV curing resin, in the configuration of the sealed part of the organic thin film photovoltaic device according to the first embodiment.
Figure 18C:
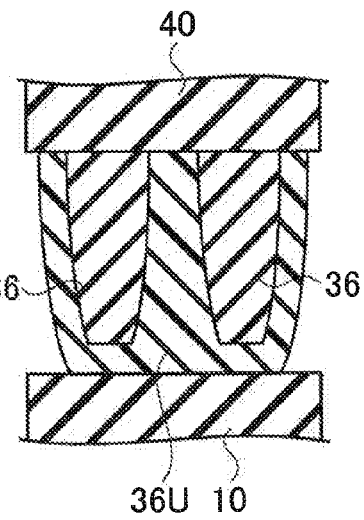
FIG. 18C is a schematic cross-sectional structure diagram showing a configuration which the two glass frits formed therein have a spindle-formed taper shape of which the cross-sectional area becomes smaller as away from the sealing glass, and the two glass frits are covered with the UV curing resin, in the configuration of the sealed part of the organic thin film photovoltaic device according to the first embodiment.

Moreover, FIG. 18A shows a configuration in which two glass frits 36 formed therein have a wedge shape and are covered with the UV curing resin 36U, in the configuration of the sealed part of the organic thin film photovoltaic device according to the first embodiment. Moreover, FIG. 18B shows a configuration example in which two glass frits 36 formed therein have a taper shape and are covered with the UV curing resin 36U. Moreover, FIG. 18C shows a configuration which two glass frits 36 formed therein have a spindle-formed taper shape of which the cross-sectional area becomes smaller as away from the sealing glass 40, and the two glass frits are covered with the UV curing resin 36.

(Fabrication Method)

Figure 19A:
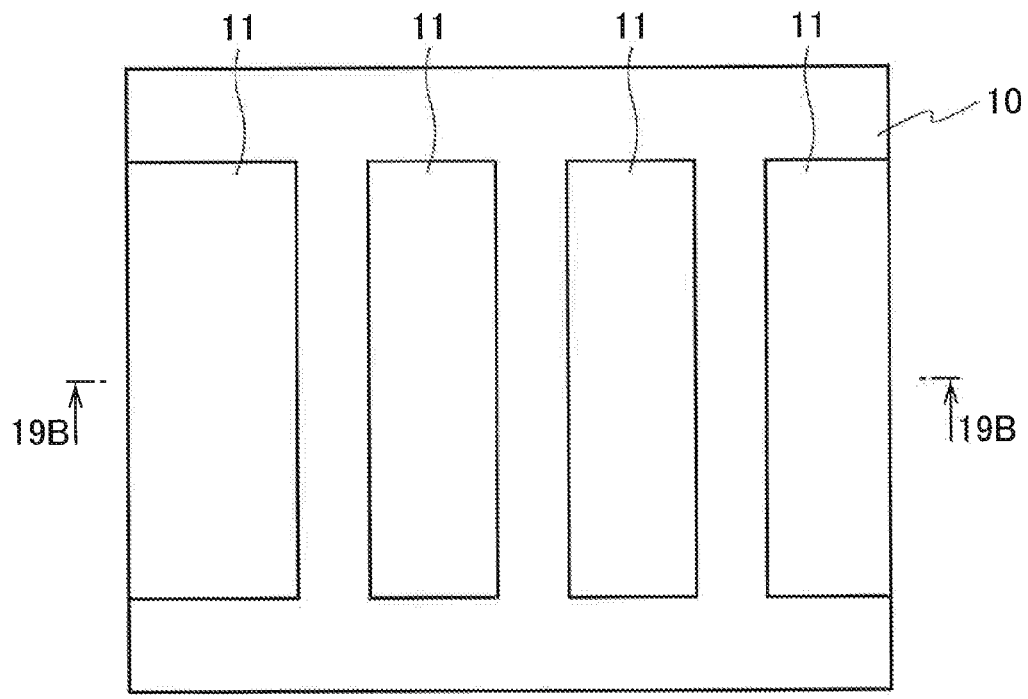
FIG. 19A is a schematic planar pattern configuration diagram showing a state where the transparent electrode layer is formed on the substrate, in a process of the fabrication method of the organic thin film photovoltaic device according to the first embodiment.
Figure 19B:
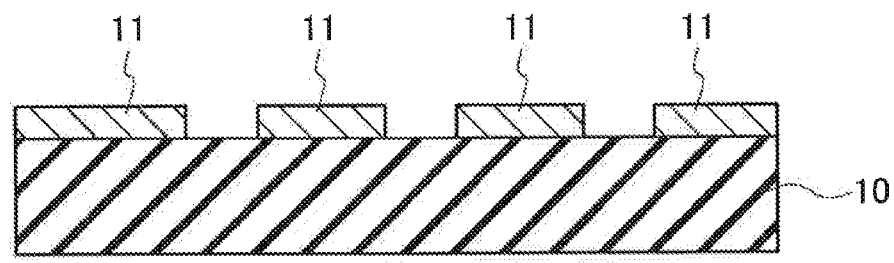
FIG. 19B is a schematic cross-sectional structure diagram taken in the line 19B-19B of FIG. 19A, in a process of the fabrication method of the organic thin film photovoltaic device according to the first embodiment.

FIG. 19A shows a schematic planar pattern configuration of a state where the transparent electrode layer 11 is formed on the substrate 10, in a process of the fabrication method of the organic thin film photovoltaic device according to the first embodiment. FIG. 19B shows a schematic cross-sectional structure taken in the line 19B-19B of FIG. 19A.

Figure 20A:
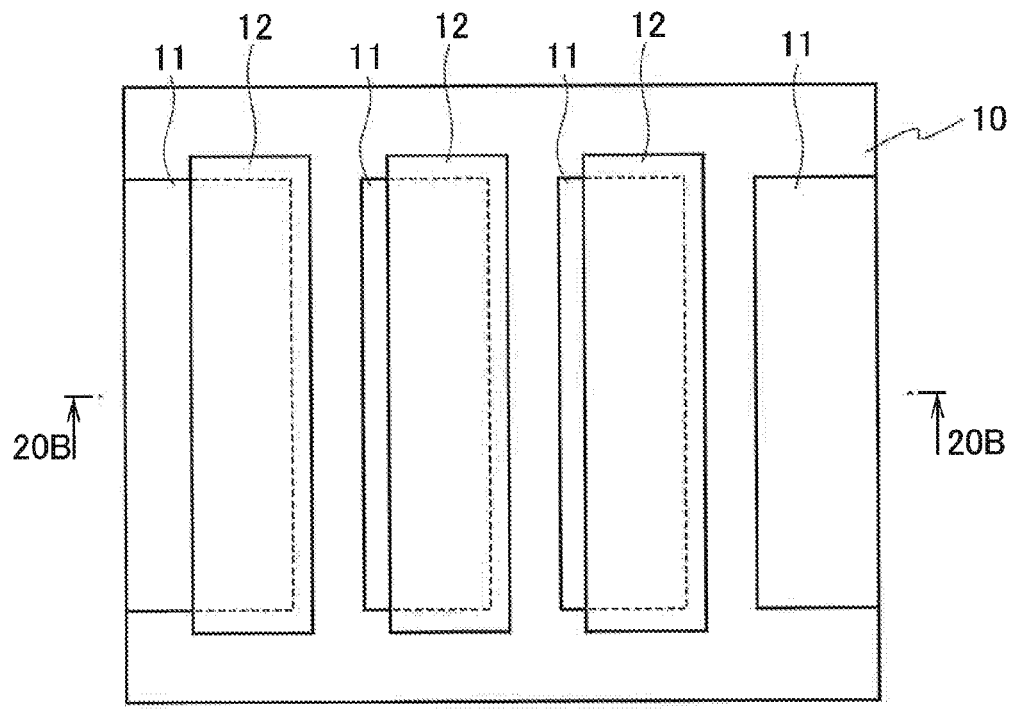
FIG. 20A is a schematic planar pattern configuration diagram showing a state where the hole transport layer is formed as a film on the transparent electrode layer, in a process of the fabrication method of the organic thin film photovoltaic device according to the first embodiment.
Figure 20B:
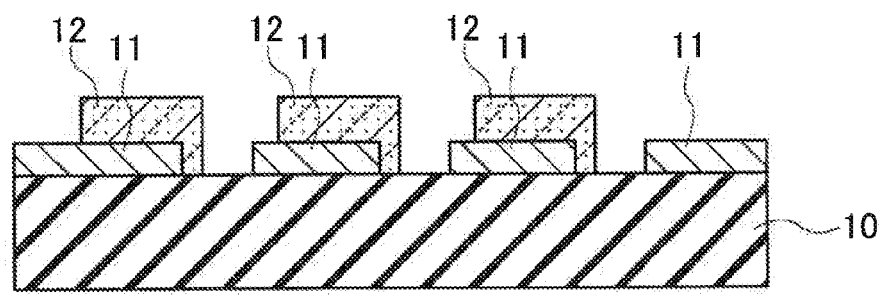
FIG. 20B is a schematic cross-sectional structure diagram taken in the line 20B-20B of FIG. 20A, in a process of the fabrication method of the organic thin film photovoltaic device according to the first embodiment.

Moreover, a schematic planar pattern configuration showing a state where the hole transport layer 12 is formed as a film on the transparent electrode layer 11 is expressed as shown in FIG. 20A, and a schematic cross-sectional structure taken in the line 20B-20B of FIG. 20A is expressed as shown in FIG. 20B.

Figure 21A:
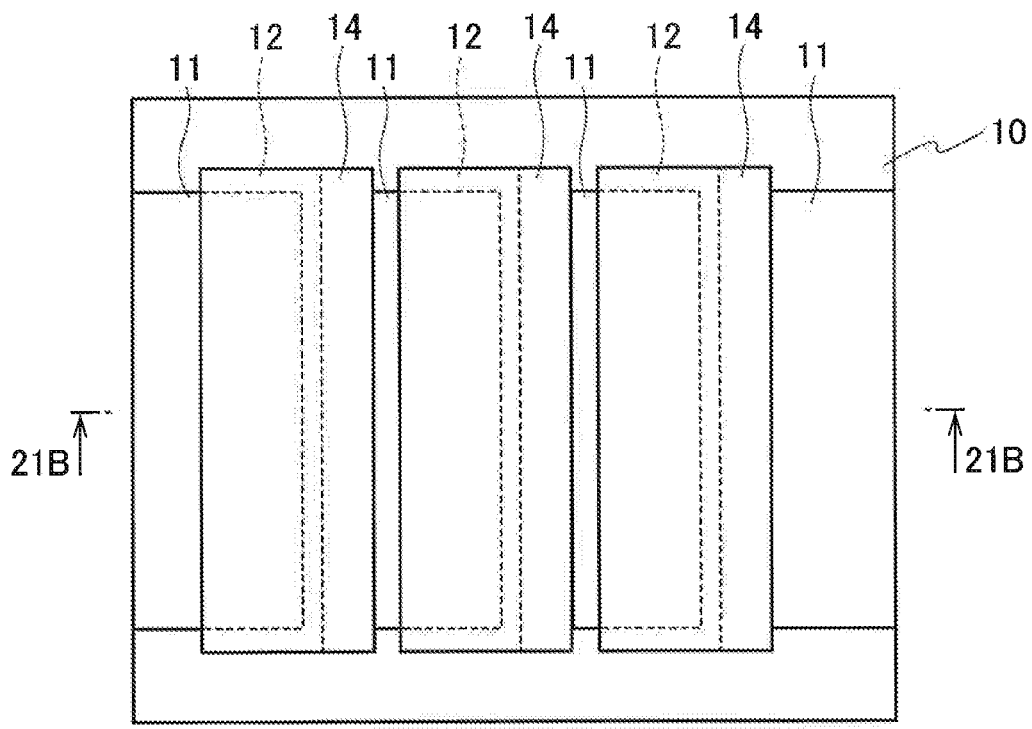
FIG. 21A is a schematic planar pattern configuration diagram showing a state where the bulk heterojunction organic active layer is formed as a film on the hole transport layer, in a process of the fabrication method of the organic thin film photovoltaic device according to the first embodiment.
Figure 21B:
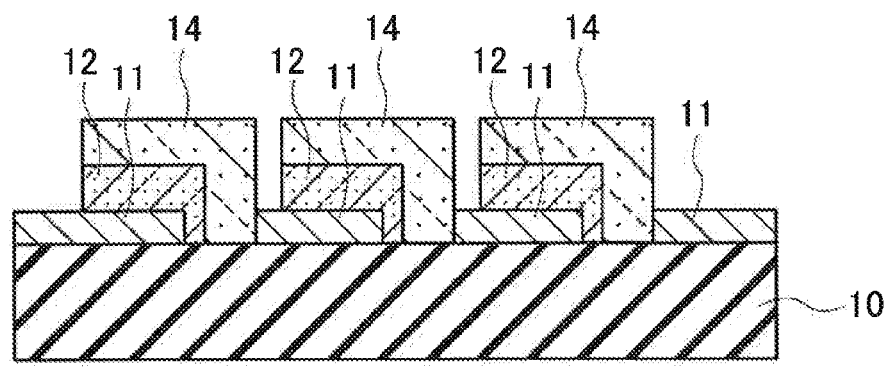
FIG. 21B is a schematic cross-sectional structure diagram taken in the line 21B-21B of FIG. 21A, in a process of the fabrication method of the organic thin film photovoltaic device according to the first embodiment.

Moreover, a schematic planar pattern configuration showing a state where the bulk heterojunction organic active layer 14 is formed as a film on the hole transport layer 12 is expressed as shown in FIG. 21A, and a schematic cross-sectional structure taken in the line 21B-21B of FIG. 21A is expressed as shown in FIG. 21B.

Figure 22A:
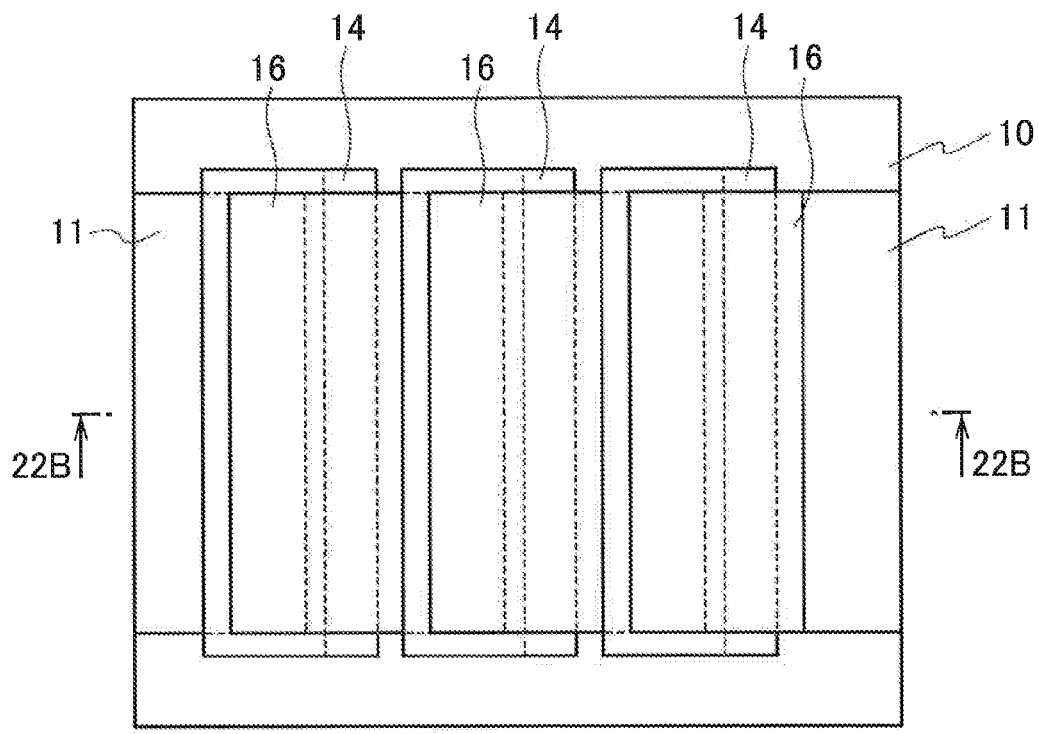
FIG. 22A is a schematic planar pattern configuration diagram showing a state where the second electrode layer is formed on the bulk heterojunction organic active layer, in a process of the fabrication method of the organic thin film photovoltaic device according to the first embodiment.
Figure 22B:
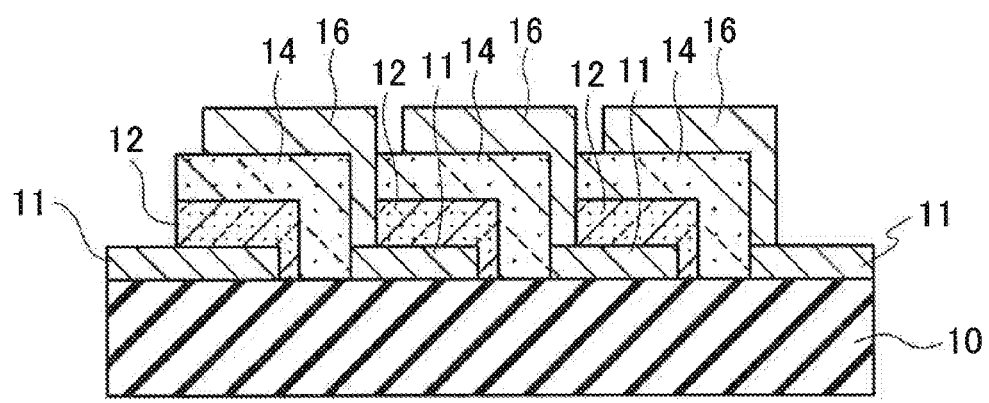
FIG. 22B is a schematic cross-sectional structure diagram taken in the line 22B-22B of FIG. 22A, in a process of the fabrication method of the organic thin film photovoltaic device according to the first embodiment.

Moreover, a schematic planar pattern configuration showing a state where the second electrode layer 16 is formed on the bulk heterojunction organic active layer 14 is expressed as shown in FIG. 22A, and a schematic cross-sectional structure taken in the line 22B-22B of FIG. 22A is expressed as shown in FIG. 22B.

Figure 23A:
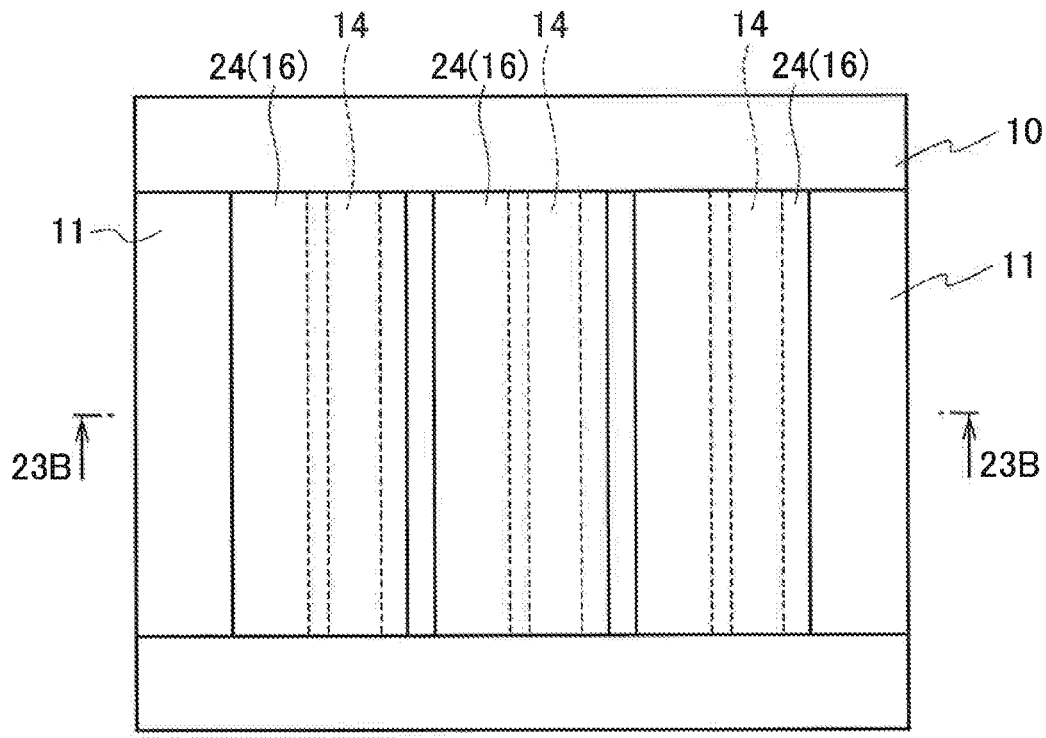
FIG. 23A is a schematic planar pattern configuration diagram showing a state where an unnecessary organic layer is etched by using oxygen plasma treatment, and an oxide layer is formed on the surface of the second electrode layer, in a process of the fabrication method of the organic thin film photovoltaic device according to the first embodiment.
Figure 23B:
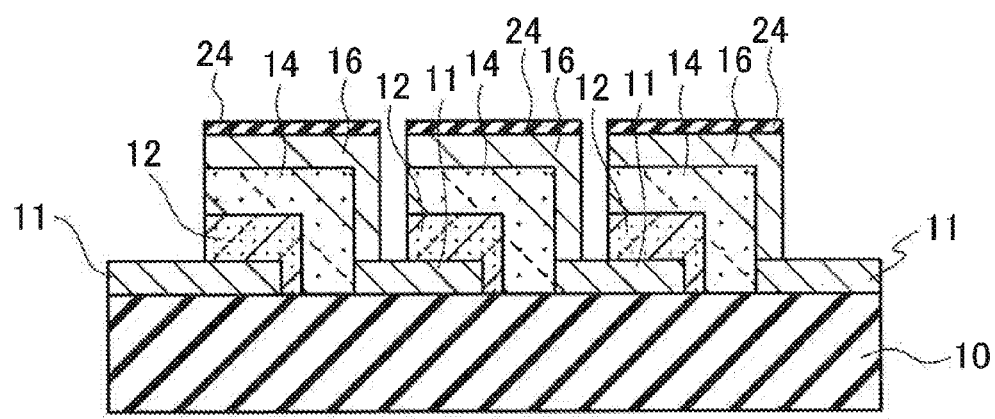
FIG. 23B is a schematic cross-sectional structure diagram taken in the line 23B-23B of FIG. 23A, in a process of the fabrication method of the organic thin film photovoltaic device according to the first embodiment.

Moreover, FIG. 23A shows a schematic planar pattern configuration of a state where an unnecessary organic layer of the hole transport layer 12 and the bulk heterojunction organic active layer 14 is etched by using oxygen plasma treatment, and the passive state film (oxide film) 24 is formed on the surface of the second electrode layer 16. A schematic cross-sectional structure taken in the line 23B-23B of FIG. 23A is expressed as shown in FIG. 23B.

Figure 24A:
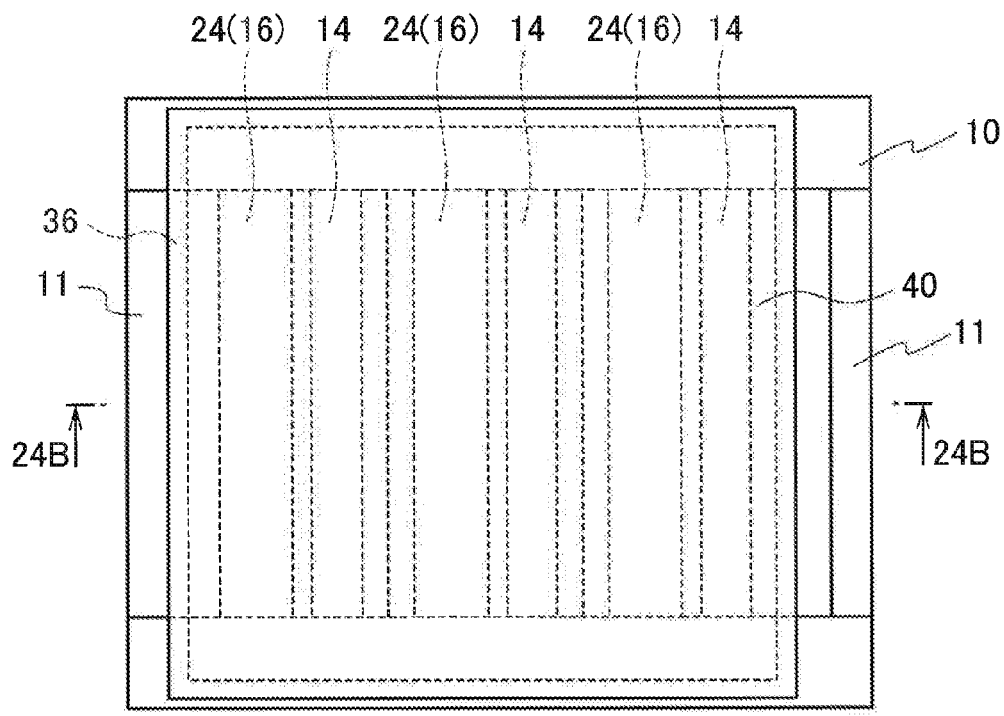
FIG. 24A is a schematic planar pattern configuration diagram showing a state of being sealed with the sealing glass, the glass frit and the UV curing resin, in a process of the fabricating process of the organic thin film photovoltaic device according to the first embodiment.
Figure 24B:
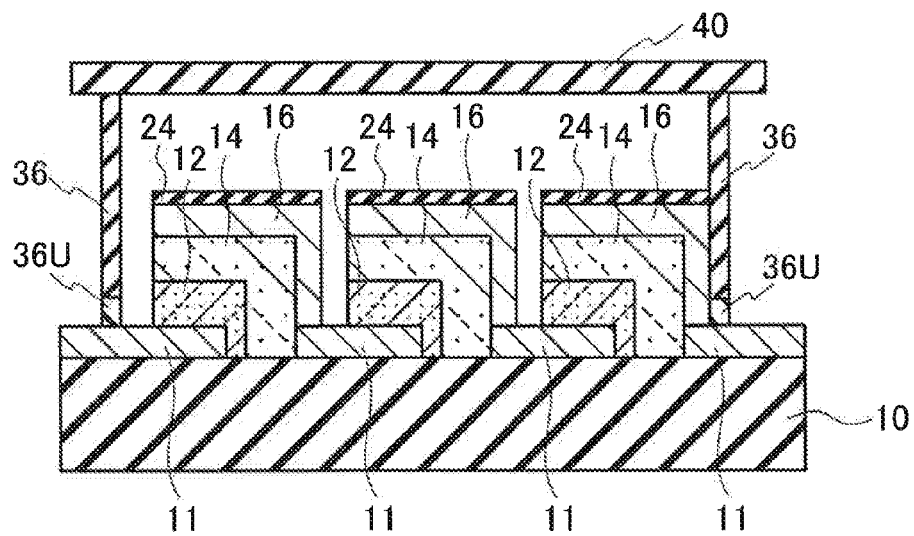
FIG. 24B is a schematic cross-sectional structure diagram taken in the line 24B-24B of FIG. 24A, in a process of the fabrication method of the organic thin film photovoltaic device according to the first embodiment.

Moreover, a schematic planar pattern configuration showing a state of being sealed with the sealing glass 40, the glass frit 36, and the UV curing resin 36U is expressed as shown in FIG. 24A, and a schematic cross-sectional structure taken in the line 24B-24B of FIG. 24A is expressed as shown in FIG. 24B.

With reference to FIGS. 19-24, there will now be explained the fabrication method of a plurality (three pieces, as an example in drawings) of the organic thin film photovoltaic devices disposed in series according to the embodiment.

(a) Firstly, a glass substrate (of which the size is, for example, 50 mm in length×50 mm in width×10.4 mm in thickness) washed by pure water, acetone and ethanol is inserted into an Inductively Coupled Plasma (ICP) etcher, and adherents on the surface of the glass substrate are removed by $O_2$ plasma (Glass Substrate Surface Treatment). In order to guide the light to the organic active layer efficiently, an antireflection process may be performed to the glass surface of the substrate 10 formed of a glass substrate.

(b) Next, as shown in FIG. 19, the optically transmissive electrode layer 11 composed of, for example, ITO is formed on the glass substrate 10. As shown in FIG. 19, a plurality of the transparent electrode layers 11 are formed in a stripe pattern so as to sandwich a trench region. Oxygen plasma etching technology, laser patterning technology, nano-imprint technology, etc. can be applied to the formation of the trench region.

(c) Next, as shown in FIG. 20, the hole transport layer 12 is formed on each transparent electrode layer 11. Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees C. for the purpose of water removal. Oxygen plasma etching technology, laser patterning technology, nano-imprint technology, etc. can be applied to the formation of the trench region.

(d) Next, as shown in FIG. 21, the bulk heterojunction organic active layer 14 is formed on each hole transport layer 12. In the formation process of the bulk heterojunction organic active layer 14, film formation is performed with spin coating of P3HT, for example.

(e) Next, as shown in FIG. 22, the cathode electrode layer 16 is formed on each bulk heterojunction organic active layer 14. The cathode electrode layer 16 is formed by depositing a metal layer (e.g., Al, W, Mo, Mg) by vacuum thermal vapor deposition, for example. Screen printing technology instead of the vacuum thermal vapor deposition may be applied to the formation of the cathode electrode layer 16.

(f) Next, as shown in FIG. 23, the oxide film (passive state film) 24 is formed on the surface of the cathode electrode layer 16, after the etching process with respect to the bulk heterojunction organic active layer 14 and the hole transport layer 12. Each cell can be separated by performing the etching process of the bulk heterojunction organic active layer 14 and the hole transport layer 12. Moreover, the passive state film 24 can be formed by applying oxygen plasma treatment to the second electrode layer 16. The passive state film 24 can be formed using a high-density plasma etching apparatus, for example. By performing the oxygen plasma treatment of the second electrode layer 16, the bulk heterojunction organic active layer 14 and the hole transport layer 12 can also be etched, in tandem with the forming of the passive state film 24.

(g) Next, as shown in FIG. 24, the whole element is sealed with the sealing glass (cover glass) 40, and the glass frit 36 and UV curing resin 36U. The glass frit 36 and the transparent electrode layer (ITO) 11 are bonded to each other with the UV curing resin 36U. In addition, the sealing process is effective to be performed under the nitrogen atmosphere in order to avoid degradation due to moisture or oxygen in the atmospheric air. Moreover, an affect due to moisture or oxygen may be further avoided by disposing the gettering sheet desiccant 38GU on the internal wall surface of the sealing glass 40.

According to the above-mentioned processes, the organic thin film photovoltaic device 1 according to the embodiment can be obtained.

(State of Sealing Glass being Bent)

Figure 25:
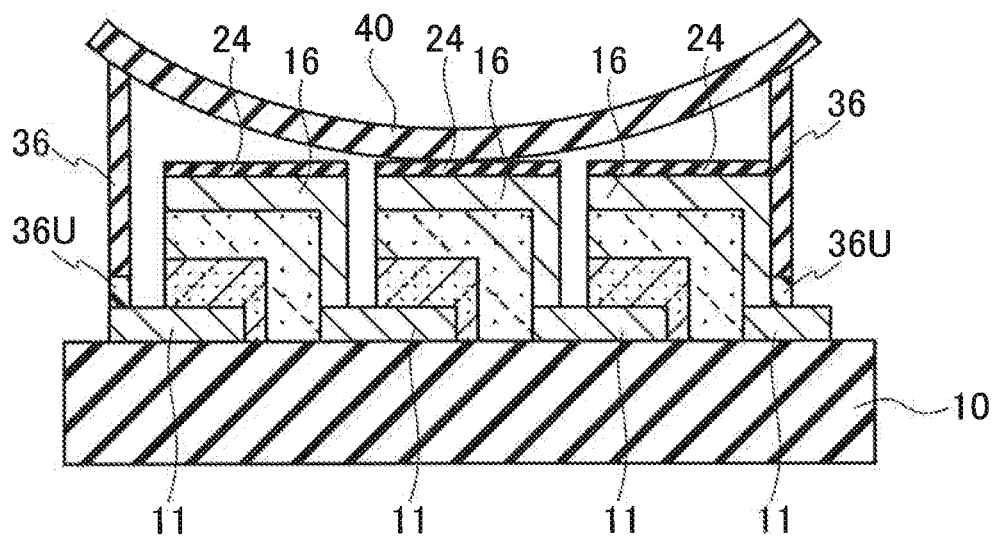
FIG. 25 is a schematic cross-sectional structure diagram showing a state where the sealing glass is bent, in the structure shown in FIG. 24B.

In the structure shown in FIG. 24, a schematic cross-sectional structure example showing a state where the sealing glass 40 bent is expressed as shown in FIG. 25. If the sealing glass 40 is bent, the cell composing the organic thin film photovoltaic device is crushed, and thereby a short circuited state may occur between the anode electrode layer 11 and the cathode electrode layer 16.

(Glass Supporting Stand)

A glass supporting stand 18 may be provided in order to prevent a condition in which the cover glass 40 or the substrate 10 are bent due to pressure from the external after fabricating a module of the organic thin film photovoltaic device according to the first embodiment, and thereby the internal elements are destroyed due to contact between the cover glass 40 and the internal elements. The glass supporting stand 18 can be formed in the same manner as the glass frit 36.

Figure 26A:
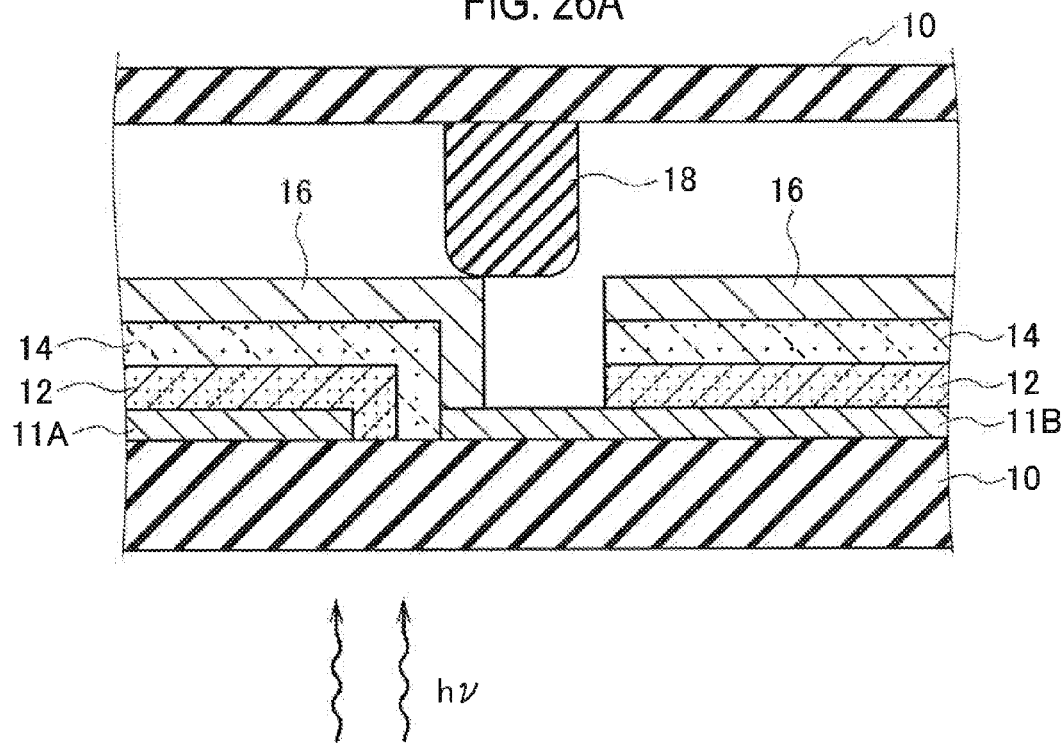
FIG. 26A is a configuration example 1 in which bending of the sealing glass can be reduced by providing a glass supporting stand inside the sealing glass, in a schematic cross-sectional structure diagram of the organic thin film photovoltaic device according to the first embodiment.

FIG. 26A shows a configuration example 1 in which bending of the sealing glass 40 can be reduced by providing the glass supporting stand 18 inside the sealing glass 40, in the organic thin film photovoltaic device according to the first embodiment. Another configuration example 2 is expressed as shown in FIG. 26B.

Figure 27A:
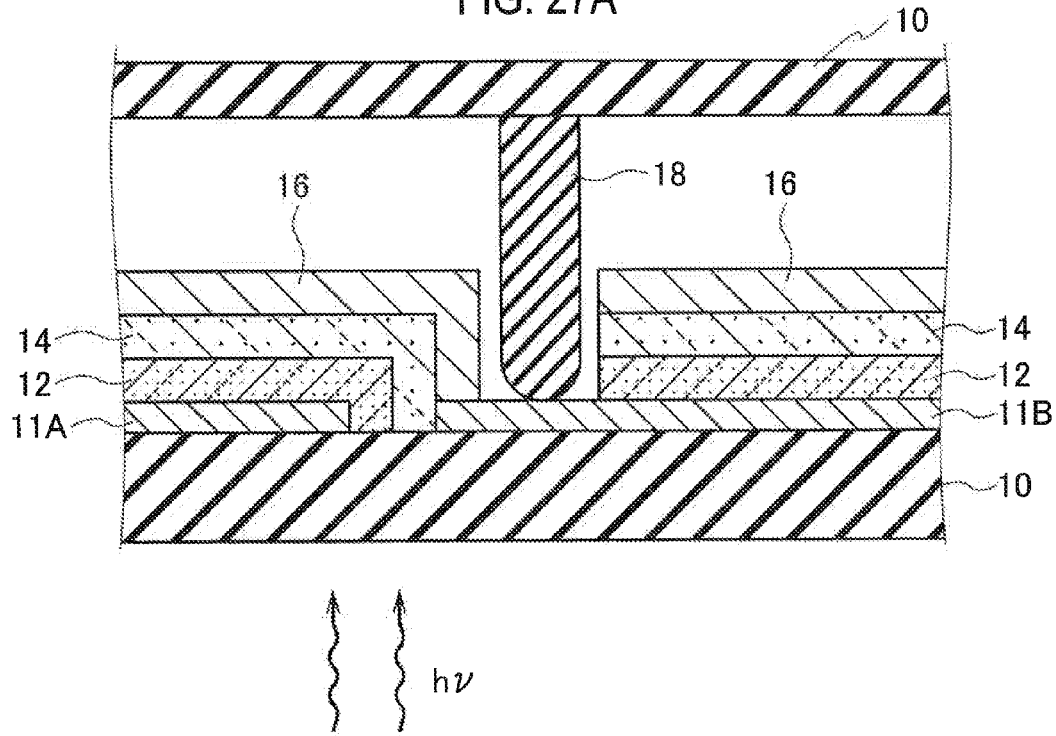
FIG. 27A is a configuration example 3 in which bending of the sealing glass can be reduced by providing a glass supporting stand inside the sealing glass, in a schematic cross-sectional structure diagram of the organic thin film photovoltaic device according to the first embodiment.

FIG. 27A shows a configuration example 1 in which bending of the sealing glass 40 can be reduced by providing the glass supporting stand 18 inside the sealing glass 40, in the organic thin film photovoltaic device according to the first embodiment. Another configuration example 4 is expressed as shown in FIG. 27B.

The glass supporting stand 18 may be disposed in contact with the second electrode layer 16, as shown in FIG. 26A.

Figure 26B:
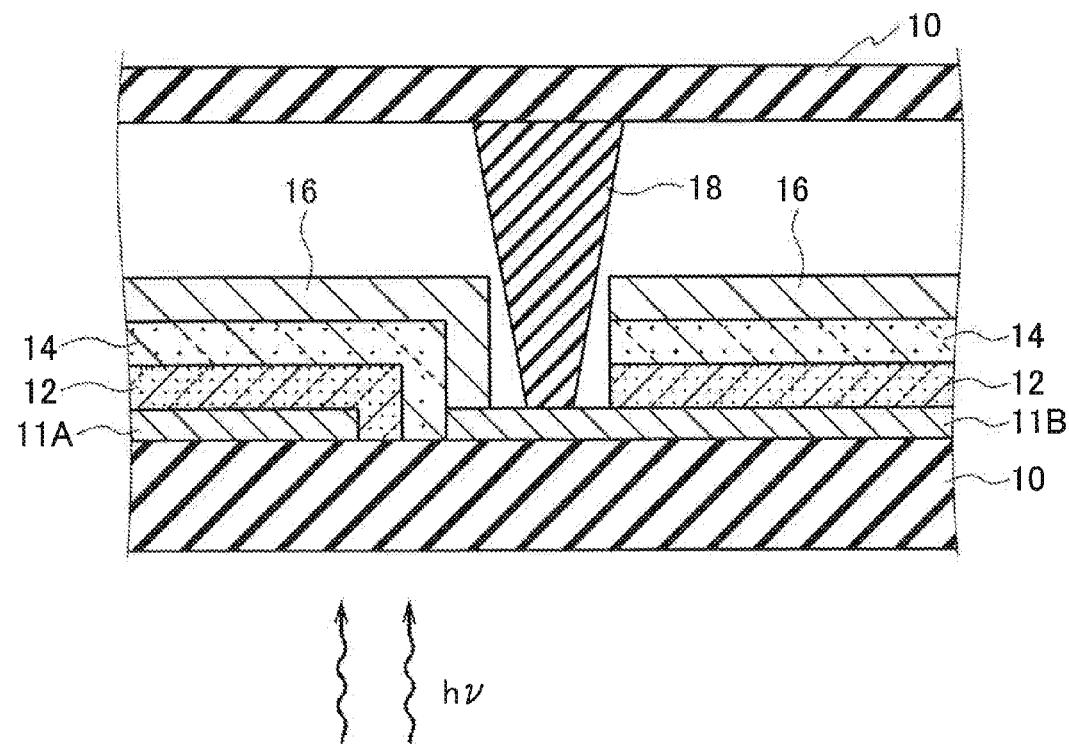
FIG. 26B is another configuration example 2 in which bending of the sealing glass can be reduced by providing a glass supporting stand inside the sealing glass, in a schematic cross-sectional structure diagram of the organic thin film photovoltaic device according to the first embodiment.
Figure 27B:
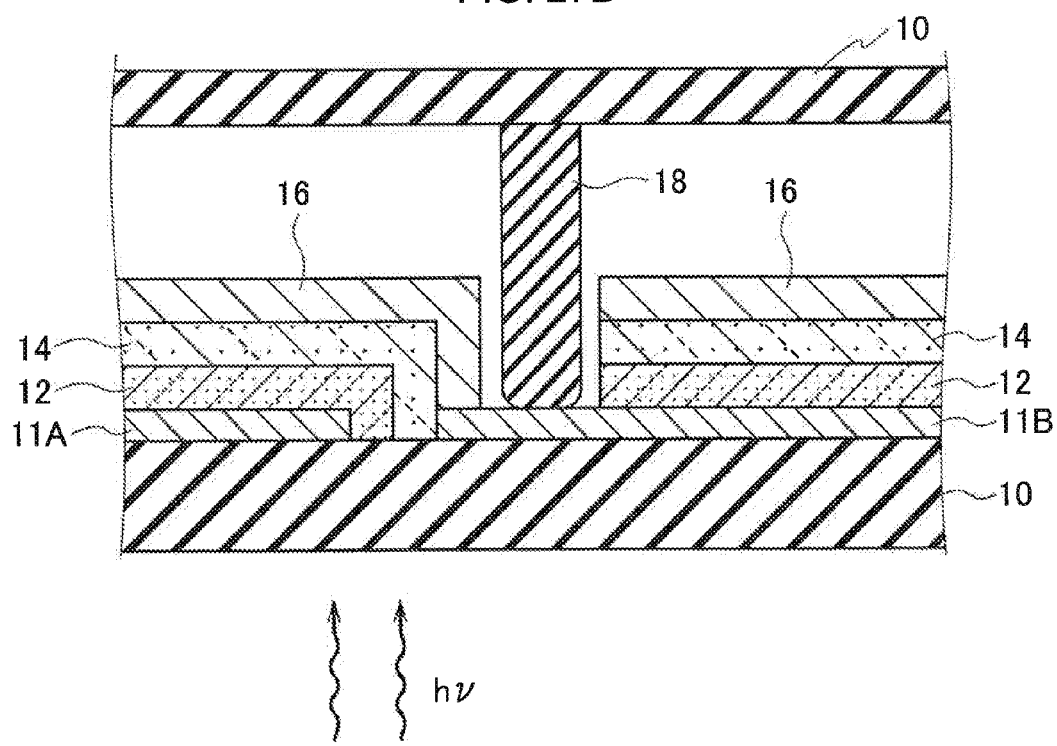
FIG. 27B is another configuration example 4 in which bending of the sealing glass can be reduced by providing a glass supporting stand inside the sealing glass, in a schematic cross-sectional structure diagram of the organic thin film photovoltaic device according to the first embodiment.

Moreover, the glass supporting stand 18 may be disposed in contact with the first electrode layer 11B between cells adjacent to each other, as shown in FIGS. 26B, 27A, and 27B. The first electrode layer 11A denotes a transparent electrode layer in the left-hand sided cell of the adjacent cells, and the first electrode layer 11B denotes a transparent electrode layer in the right-hand sided cell of the adjacent cells.

Thus, the glass supporting stand 18 may be disposed between the plurality of the cells disposed thereon.

Moreover, the glass supporting stand 18 can be formed in a dotted pattern or a stripe pattern on the surface of the substrate 10.

(Gettering Sheet)

Figure 28:
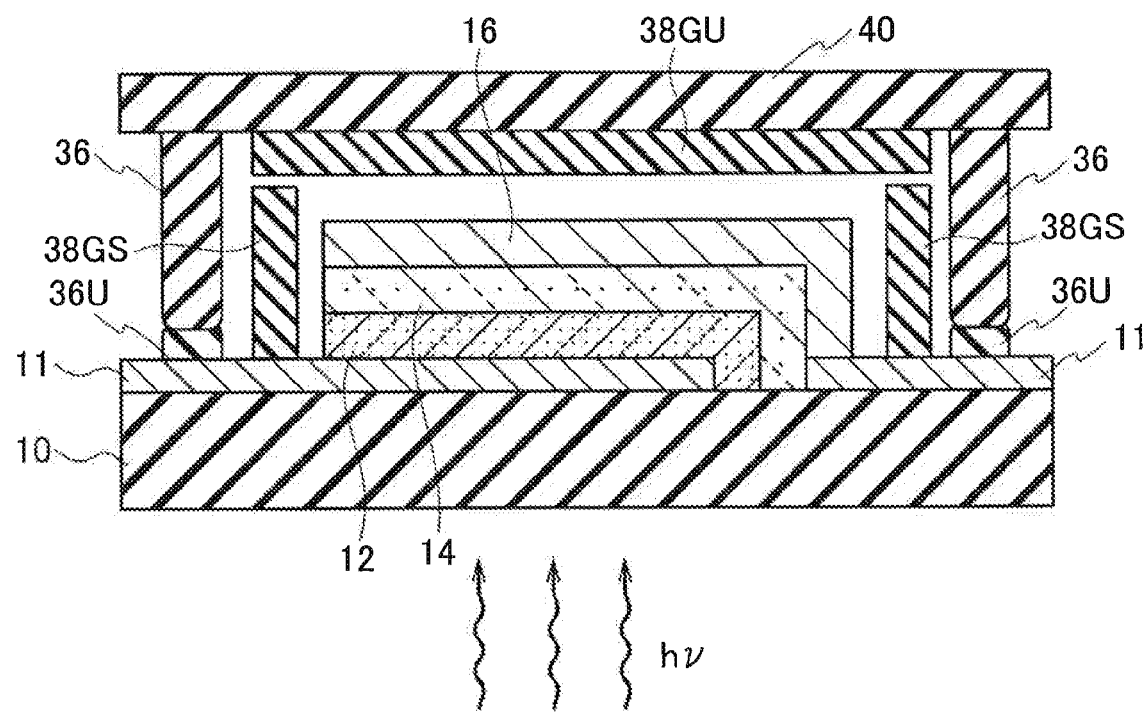
FIG. 28 is a schematic cross-sectional structure diagram in which oxygen ($O_2$) gettering sheets are disposed the inside of a sealing glass and in space between the sealing glass and the ITO substrate, in the organic thin film photovoltaic device according to the first embodiment.

FIG. 28 shows a schematic cross-sectional structure in which an oxygen ($O_2$) gettering sheets 38GU, 38GS are disposed the inside of the sealing glass 40 and in space between the sealing glass 40 and the ITO substrate 10, in the organic thin film photovoltaic device according to the first embodiment.

The gettering sheet desiccants 38GU, 38GS are disposed inside the portion sealed with the substrate 10 and the sealing glass 40.

Moreover, the gettering sheet desiccant 38GU can be disposed on an internal wall surface of the sealing glass 40 opposite to the substrate 10.

Moreover, the gettering sheet desiccant 38GS can be disposed on the substrate 10 inside the portion sealed with the substrate 10 and the sealing glass 40.

(Serially-Arranged Configuration)

Figure 29:
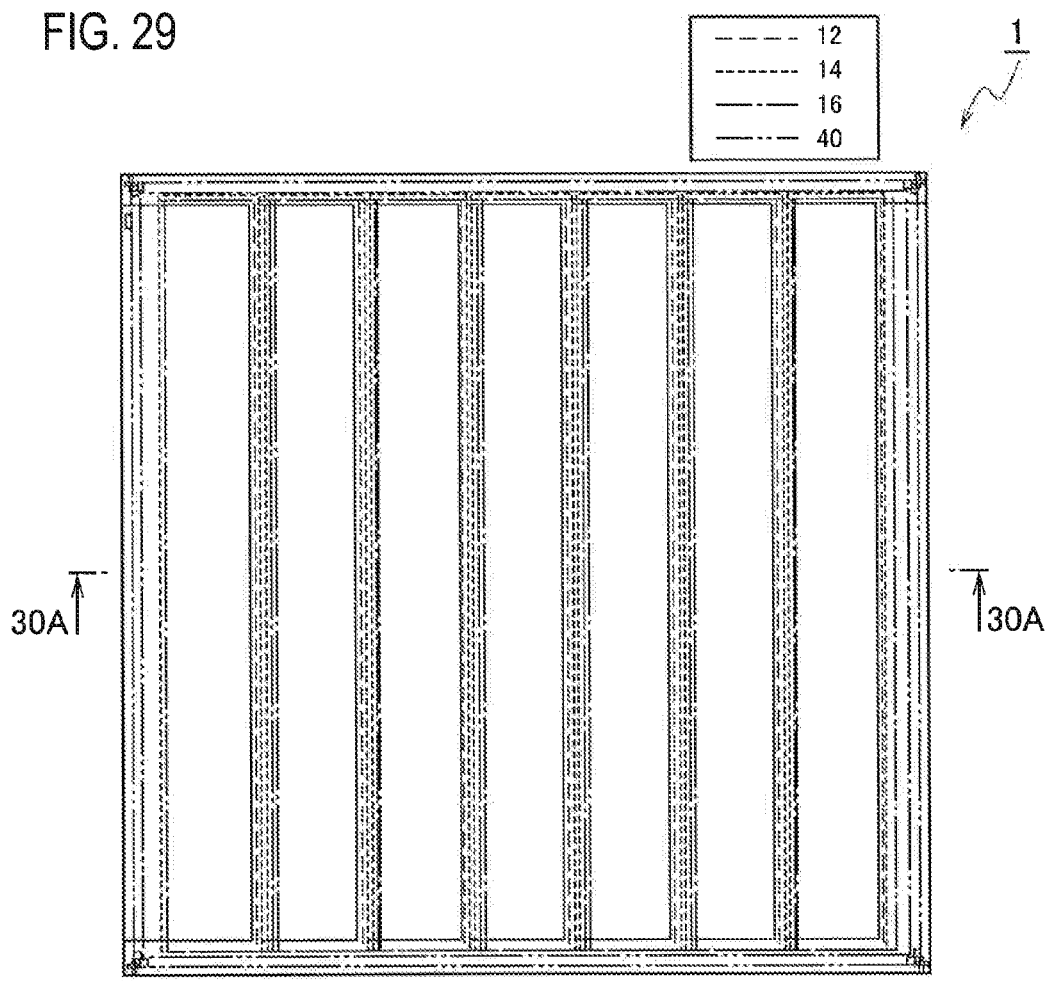
FIG. 29 is a schematic planar pattern diagram showing an example which connects seven pieces of cells in series to be disposed, in the organic thin film photovoltaic device according to the first embodiment of the present invention.
Figure 30A:
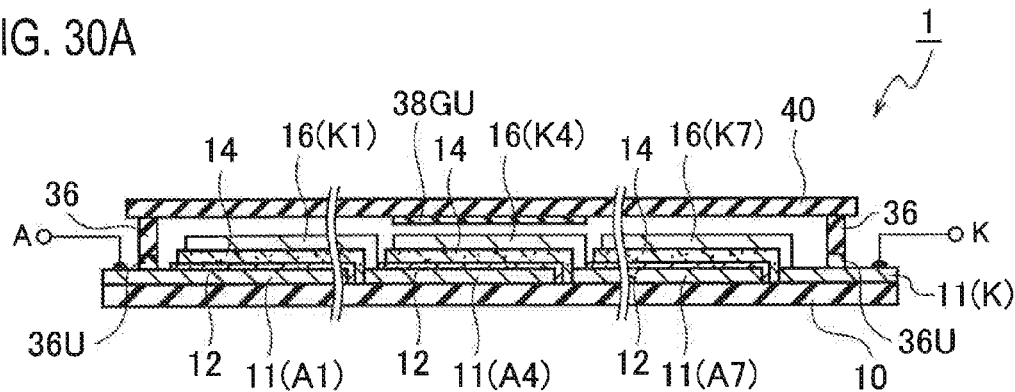
FIG. 30A is a schematic cross-sectional structure diagram taken in the line 30A-30A of FIG. 29.
Figure 30B:
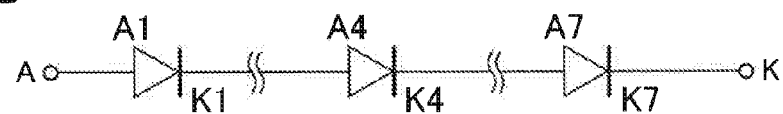
FIG. 30B is an equivalent circuit configuration diagram corresponding to that shown in FIG. 30A.

In the organic thin film photovoltaic device 1 according to the first embodiment, a schematic planar pattern configuration where seven cells are connected in series is expressed as shown in FIG. 29. Moreover, a schematic cross-sectional structure taken in the line 30A-30A of FIG. 29 is expressed as shown in FIG. 30A, and an equivalent circuit configuration corresponding to FIG. 30A is expressed as shown in FIG. 30B.

Each cell includes: a substrate 10; an anode electrode layer 11 disposed on the substrate 10; a hole transport layer 12 disposed on the anode electrode layer 11; a bulk heterojunction organic active layer 14 disposed on the hole transport layer 12; and a cathode electrode layer 16 disposed on the bulk heterojunction organic active layer 14. Furthermore, the whole of the seven cells are hollow-sealed with the sealing glass 40, the glass frit 36, and the UV curing resin 36U. The gettering sheet desiccant 38GU is disposed on the internal wall surface of the sealing glass 40. The passive state film (not illustrated) is formed on the surface of the cathode electrode layer 16.

As clearly from FIG. 30, the anode electrode layer 11 (A1) is connected to the anode terminal A, and the cathode electrode layer 16 (K1) is connected to the anode electrode layer 11 (A2) in the peripheral region of cells. Similarly, the cathode electrode layer 16 (K2) is connected to the anode electrode layer 11 (A3) in a peripheral region of cells, . . . , and the cathode electrode layer 16 (K6) is connected to the anode electrode layer 11 (A7) in the peripheral region of cells. The cathode electrode layer 16 (K7) is connected to the first electrode layer 11 (K1) in the peripheral region of cells, and the first electrode layer 11 (K1) is connected to the cathode terminal K.

As a result, the structure where the seven cells of the organic thin film photovoltaic device are connected in series can be obtained.

As a result, the structure where the seven cells of the organic thin film photovoltaic device are connected in series can be obtained.

Moreover, the glass supporting stand for bending prevention may be provided on an internal wall surface of the sealing glass 40 opposite to the substrate 10. The glass supporting stand may be disposed in contact with the second electrode layer, or may be disposed in contact with the first electrode layer. The glass supporting stand may be disposed between the plurality of the cells disposed thereon.

(Producing Steps of Organic Thin Film Photovoltaic Device)

Figure 31:
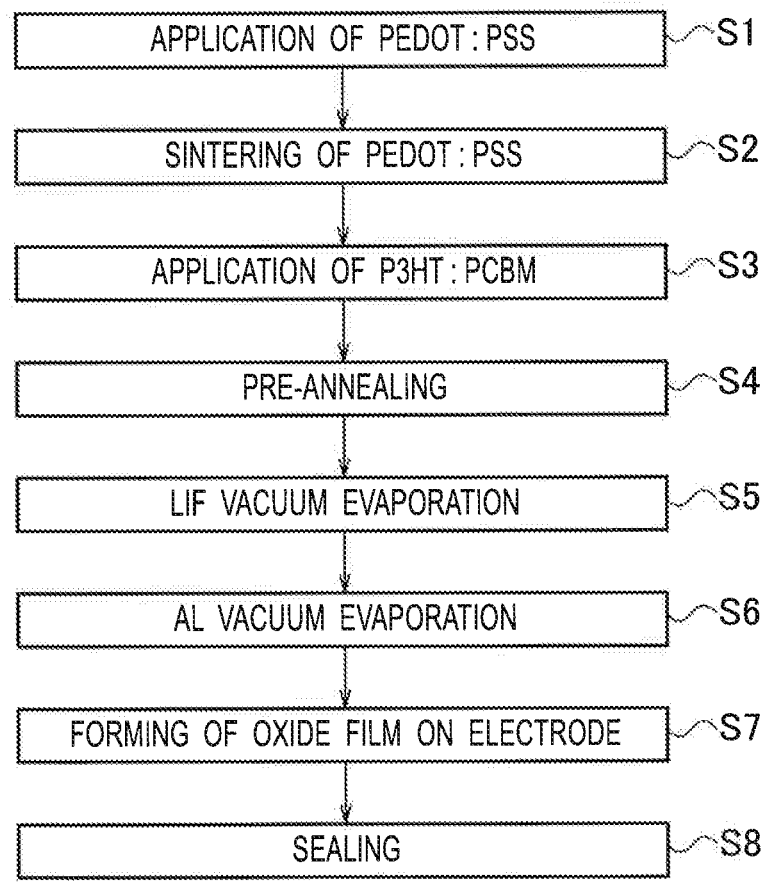
FIG. 31 is a flow chart showing producing steps of the organic thin film photovoltaic device according to the first embodiment.

In accordance with the flow chart shown in FIG. 31, there will now be explained producing steps of the organic thin film photovoltaic device 1 according to the first embodiment.

(a) In Step S1, PEDOT:PSS is coated on the substrate 10. For example, PEDOT:PSS aqueous solution is filtered with a 0.45-μm PTFE membrane filter to remove undissolved matters and impurities, and then the PEDOT:PSS aqueous solution is coated on the ITO substrate 10 with spin coating (for example, 4000 rpm for 30 sec).

(b) The PEDOT:PSS is sintered in Step S2. That is, heat-treatment is performed at 120 degrees C. for 10 minutes for the purpose of water removal, after the film formation. In addition, it is effective to cover a petri dish previously heated by a hot plate so that the heat may be transferred to whole of the substrate 10.

(c) P3HT:PCBM is coated on the substrate 10 in Step S3. Specifically, P3HT 16 mg and PCBM 16 mg are dissolved in dichlorobenzene (o-dichlorobenzene), for example. The solution is subjected to ultrasonic treatment for 1 minute at 50 degrees C., after agitating at 50 degrees C. under nitrogen atmosphere for a night. Spin coating of the solution is performed on the ITO substrate 10 subjected to washing treatment in a glove box replaced with nitrogen (<1 ppmO$_2$, H$_2$O). A rotational frequency of the spin coating is 2000 rpm per 1 sec after 550 rpm per 60 sec.

(d) Pre-annealing is performed in Step S4. That is, heating processing is performed for 10 minutes at 120 degrees C. after the coating of Step S3. In addition, it is effective to cover a petri dish previously heated by a hot plate so that the heat may be transferred to whole of the substrate 10.

(e) LiF vacuum evaporation is performed in Step S5. Specifically, as for LiF (purity: 99.98%), vacuum thermal evaporation is performed with the vacuum degree: $1.1 \times 10^{-6}$ torr and the vacuum evaporation rate: 0.1 angstrom/sec.

(f) In Step S6, Al vacuum evaporation is performed, thereby forming the second electrode layer 16. Specifically, as for Al (purity: 99.999%), vacuum thermal evaporation is performed with the vacuum degree: $1.1 \times 10^{-6}$ torr and the vacuum evaporation rate: more than 2 angstroms/sec.

(g) An oxide film is formed on the second electrode layer 16 in Step S7. Specifically, the surface of the second electrode layer 16 is oxidized with oxygen plasma by using a high-density plasma etching apparatus, thereby forming the oxide film 24.

(h) Sealing is performed in Step S8. Specifically, the elements are fully sealed by using the sealing glass on which the glass frit is formed, forming the UV curing resin at the tip portion of the glass frit to be opposite to the substrate, and performing exposure to light for approximately 10 minutes, for example, in a UV oven.

(Mass Production Process)

As shown in FIGS. 32-36, the organic thin film photovoltaic device according to the first embodiment can also be fabricated with a mass production process by disposing a plurality of cells in a matrix shape.

Hereinafter, the mass production process will now be explained with reference to FIGS. 32-36.

(a) Firstly, a glass substrate 10 washed by pure water, acetone and ethanol are inserted into an ICP etcher, and adherents on the surface of the glass substrate are removed by O$_2$ plasma (Glass Substrate Surface Treatment). In addition, an antireflection process may be applied on the surface of the glass substrate 10 in order to efficiently guide light to the organic active layer.

Figure 32:
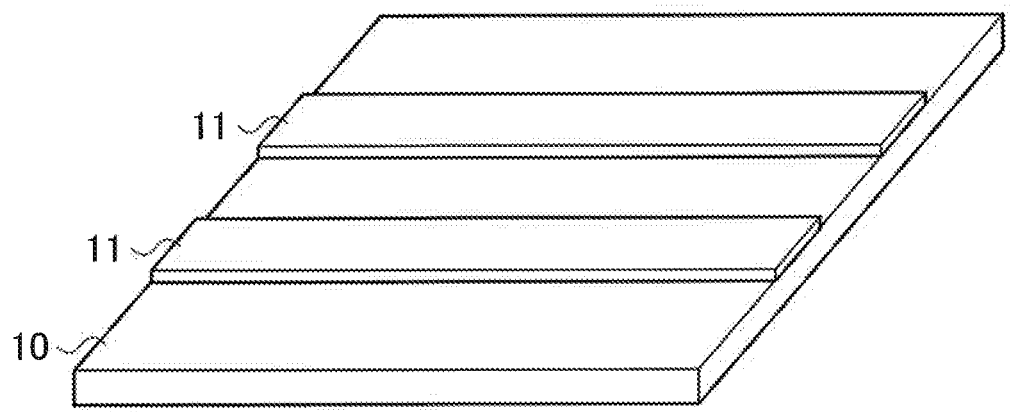
FIG. 32 is a schematic bird's-eye view structure diagram showing a state where a stripe pattern of the transparent electrode layers is formed on the substrate, in a process of the mass production fabricating process of the organic thin film photovoltaic device according to the first embodiment.

(b) Next, as shown in FIG. 32, the optically transmissive electrode layer 11 composed of, for example, ITO is formed on the substrate 10. In an example shown in FIG. 32, a plurality of the transparent electrode layers 11 are formed in a stripe pattern so as to sandwich a gap. Oxygen plasma etching technology, laser patterning technology, nano-imprint technology, etc. can be applied to the formation of the gap.

(c) Next, as shown in FIG. 32, the hole transport layer 12 is formed on the substrate 10 and the transparent electrode layer 11. Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees C. for the purpose of water removal.

Figure 34:
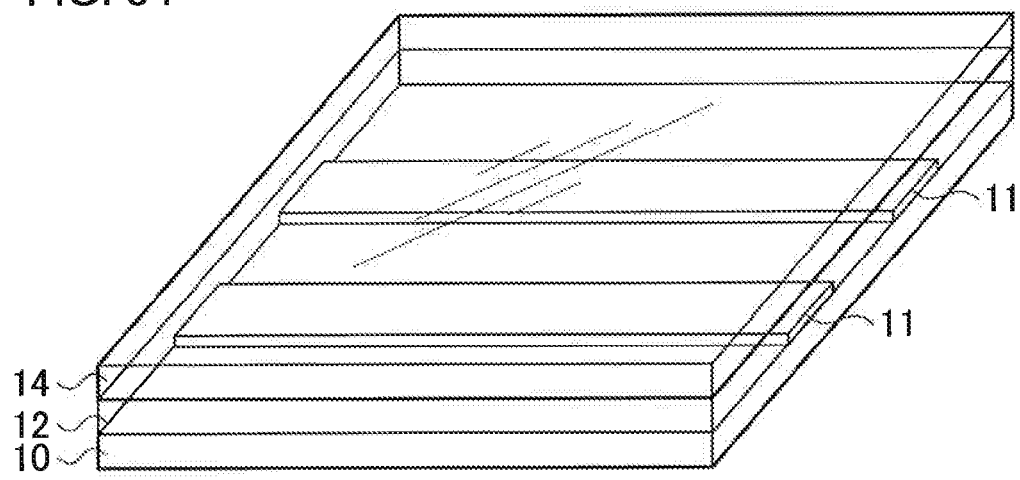
FIG. 34 is a schematic birds-eye view structure diagram showing a state where the bulk heterojunction organic active layer is formed as a film with spin coating on the hole transport layer, in a process of a mass production fabricating process of the organic thin film photovoltaic device according to the first embodiment.

(d) Next, as shown in FIG. 34, the bulk heterojunction organic active layer 14 is formed on the hole transport layer 12. In the formation process of the bulk heterojunction organic active layer 14, film formation is performed with spin coating of P3HT:PCBM, for example. The thickness of the bulk heterojunction organic active layer 14 is approximately 100 nm to approximately 200 nm, for example.

Figure 35:
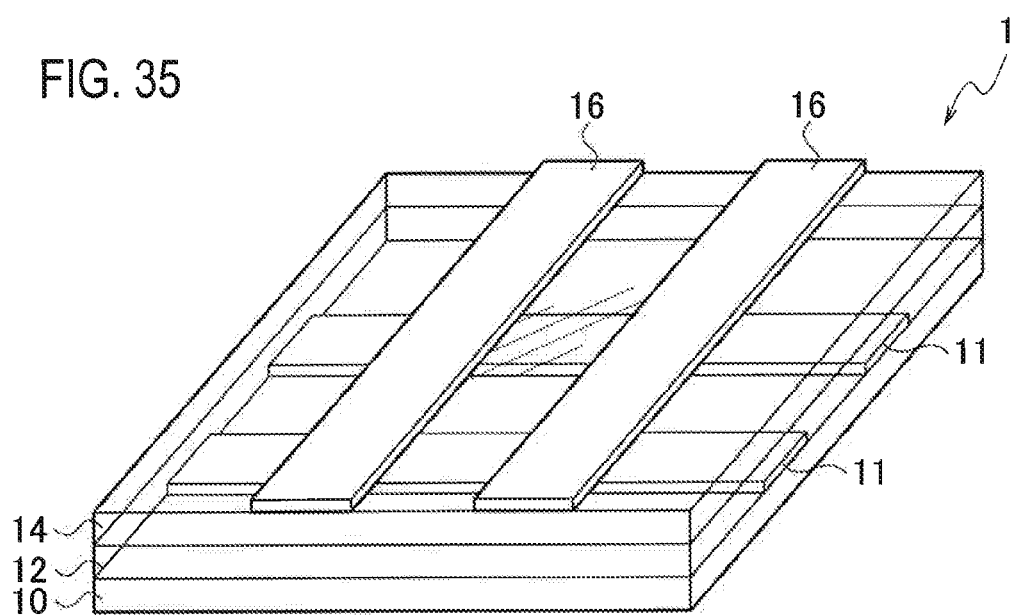
FIG. 35 is a schematic bird's-eye view configuration diagram showing a state where a stripe pattern of the second electrode layer formed so as to be intersected perpendicularly with the stripe-shaped transparent electrode layer on the bulk heterojunction organic active layer, in a process of the mass production fabricating process of the organic thin film photovoltaic device according to the first embodiment.

(e) Next, as shown in FIG. 35, the cathode electrode layers 16 in two-stripes pattern are formed so as to be orthogonal to the transparent electrode layer 11 on the bulk heterojunction organic active layer 14.

The cathode electrode layer 16 is formed by depositing Al, W, Mo, Mg, etc., for example, by vacuum thermal vapor deposition. Screen printing technology instead of the vacuum thermal vapor deposition may be applied to the formation of the cathode electrode layer 16.

(f) Next, an oxide film (passive state film) not illustrated is formed on the surface of the cathode electrode layer 16. The passive state film can be formed by exposing the cathode electrode layer 16 to oxygen plasma. The oxide film with the oxygen plasma can be formed using a plasma etching apparatus, for example.

(g) Next, the whole of the elements are sealed with a sealing glass (cover glass) and a glass frit. In addition, the sealing process is effective to be performed under the nitrogen atmosphere or under vacuum decompression in order to avoid degradation due to moisture or oxygen in the atmospheric air.

According to the above-mentioned processes, the organic thin film photovoltaic device 1 according to the embodiment can be mass-produced.

Figure 36:
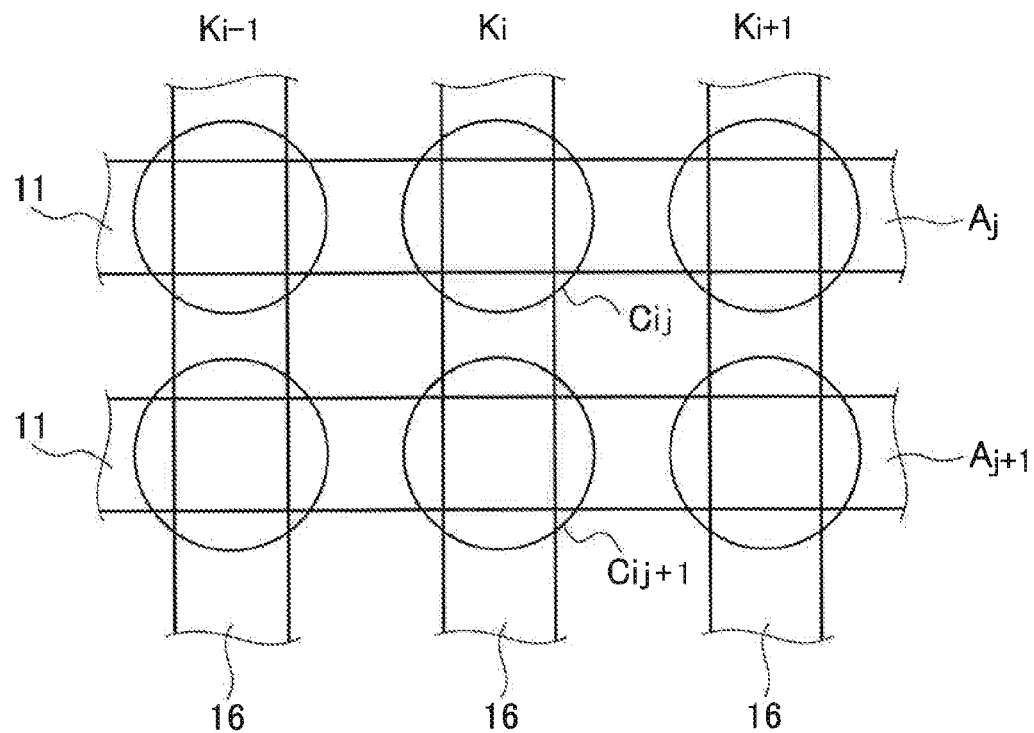
FIG. 36 is a schematic planar pattern configuration diagram showing an example of disposing a plurality of cells $C_{ij}$ in a matrix shape, in the organic thin film photovoltaic device according to the first embodiment.

In the organic thin film photovoltaic device according to the first embodiment, an example of a schematic planar pattern configuration to dispose a plurality of cells $C_{ij}$ in a matrix shape is expressed as shown in FIG. 36. The cells $C_{ij}$, . . . are disposed at intersections between the anode electrode patterns . . . , $A_j$, $A_{j+1}$, . . . formed of the anode electrode layer 11, and the cathode electrode patterns . . . , $K_{i-1}$, $K_i$, $K_{i+1}$, . . . formed of the cathode electrode layer 16 to intersect perpendicularly with the anode electrode patterns . . . , $A_j$, $A_{j+1}$, . . . . The characteristics of each cell $C_{ij}$, . . . disposed on the intersections can also be measured independently by selecting the anode electrode pattern . . . , $A_j$, $A_{j+1}$, . . . and the cathode electrode pattern . . . , $K_{i-1}$, $K_i$, $K_{i+1}$, . . . .

(Spin Coat Method)

Figure 37A:
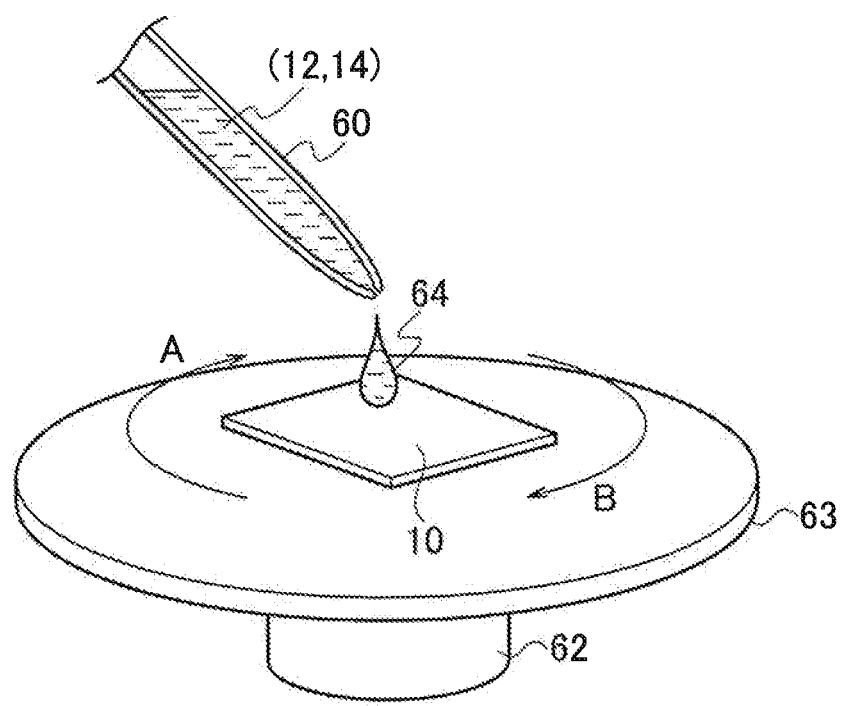
FIG. 37A is a schematic diagram showing a spin coat method at the time of forming the hole transport layer and the bulk heterojunction organic active layer, in the fabrication method of the organic thin film photovoltaic device according to the first embodiment.
Figure 37B:
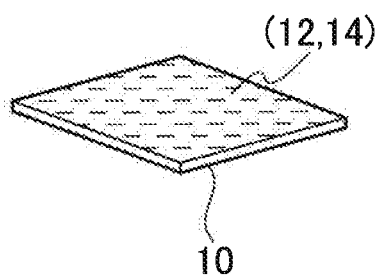
FIG. 37B is a schematic bird's-eye view configuration diagram showing an example of the hole transport layer and the bulk heterojunction organic active layer formed in the fabrication method of the organic thin film photovoltaic device according to the first embodiment.

FIG. 37A is a schematic showing a spin coat method at the time of forming the hole transport layer 12 and the bulk heterojunction organic active layer 14, in the fabrication method of the organic thin film photovoltaic device according to the first embodiment. A schematic birds-eye view configuration showing an example of the formed hole transport layer 12 and the bulk heterojunction organic active layer 14 is expressed as shown in FIG. 37B.

For example, if a relative small-area element is created, a spin coat method as shown in FIG. 37A can be applied, in the organic thin film photovoltaic device 1 according to the first embodiment.

More specifically, a spin coater including a high-speed rotating spindle 62 connected to driving source, e.g. a motor, and a table fixed to the spindle 62, wherein the substrate 10 is mounted on the table is used therefor, as shown in FIG. 37A.

Then, the driving source, e.g. a motor, is worked after the substrate 10 is mounted on the table 63, and then the table 63 is rotated at a high speed, e.g., 2000-4000 rpm, in arrows A, B direction. Subsequently, a droplet 64 of a solution for forming the hole transport layer 12 and the bulk heterojunction organic active layer 14 is dropped thereon using a syringe 60. Thereby, the hole transport layer 12 and the bulk heterojunction organic active layer 14 having uniform thickness (refer to FIG. 37B) can be formed with the droplet 64 on the substrate 10 in accordance with centrifugal force.

As explained above, according to the first embodiment, there can be provided the inexpensive organic thin film photovoltaic device of which the durability is improved, allowing further weight saving and thin-layering, and the fabrication method of such an organic thin film photovoltaic device.

[Second Embodiment]

Figure 38A:
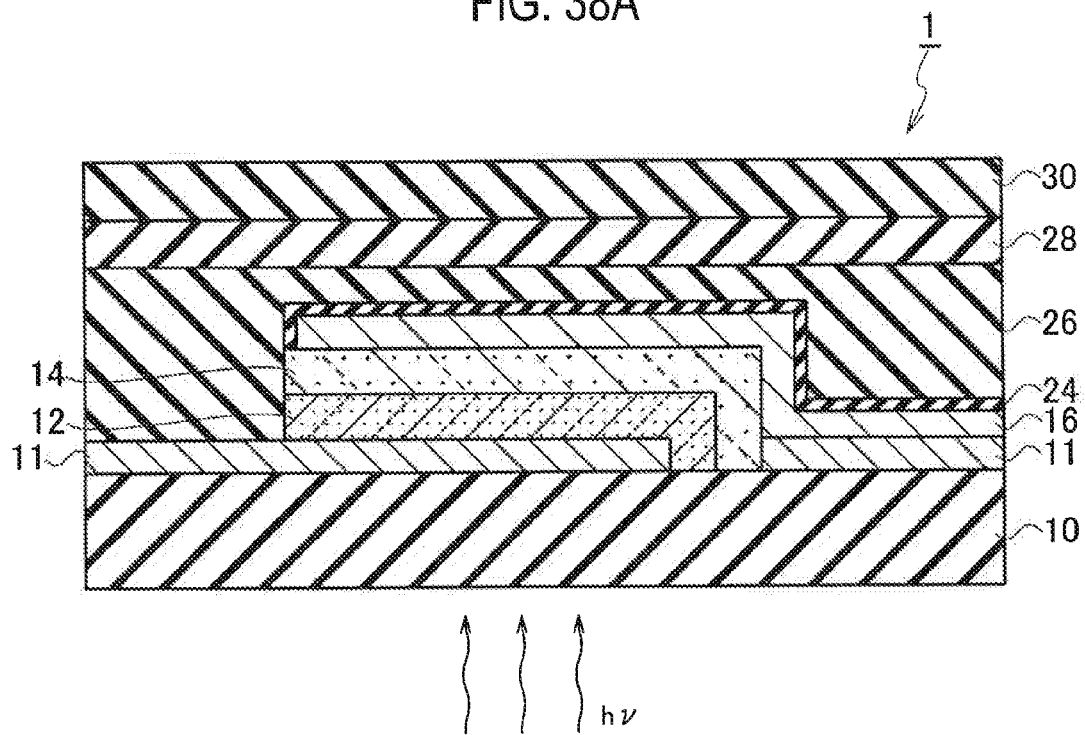
FIG. 38A is a schematic cross-sectional structure diagram of an organic thin film photovoltaic device according to a second embodiment.

As shown in FIG. 38A, an organic thin film photovoltaic device 1 according to a second embodiment includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a passivation layer 26 disposed on the second electrode layer 16; a colored barrier layer 28 disposed on the passivation layer 26; and a back sheet passivation layer 30 disposed on the colored barrier layer 28.

(Comparative Example)

Figure 38B:
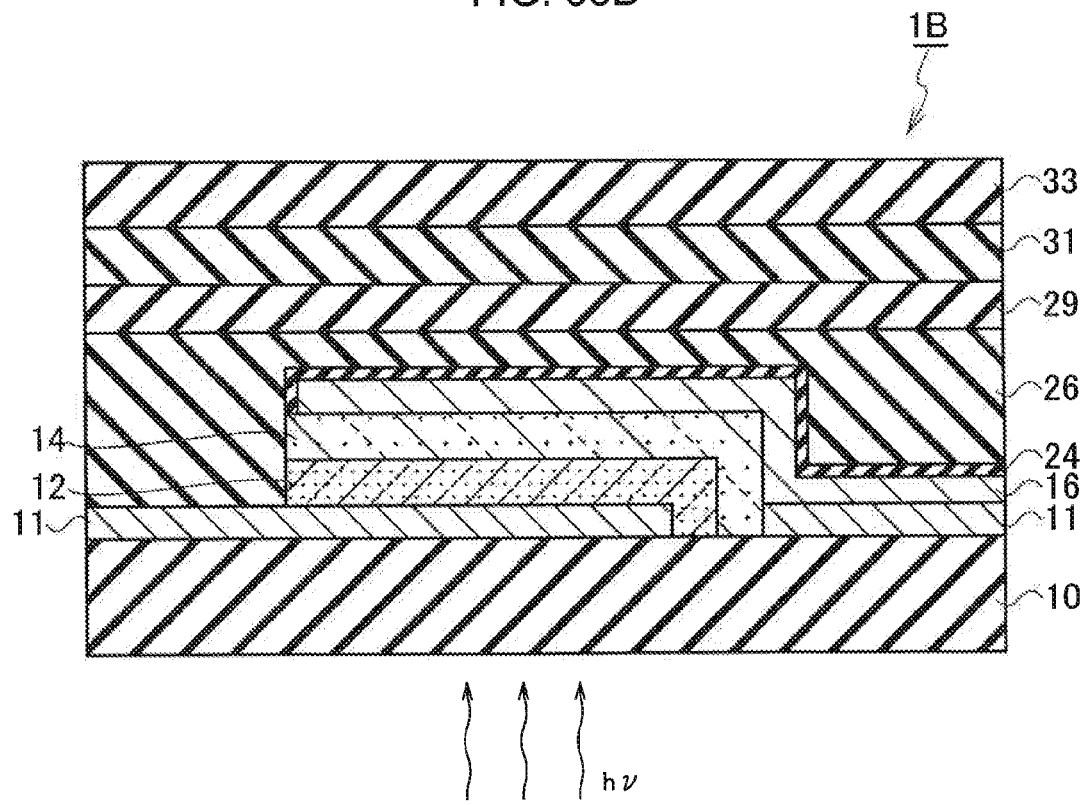
FIG. 38B is a schematic cross-sectional structure diagram of an organic thin film photovoltaic device according to a comparative example.

As shown in FIG. 38B, an organic thin film photovoltaic device 1B according to a comparative example includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a passivation layer 26 disposed on the second electrode layer 16; a barrier layer 29 disposed on the passivation layer 26; a passivation layer 31 disposed on the barrier layer 29; and a back sheet layer 33 disposed on the passivation layer 31. The barrier layer 29 is formed by laminating an inorganic passivation film and a resin protective film, e.g. SiN, SiON, in a multilayer with Chemical Vapor Deposition (CVD) method. Since the transparent resin material used as the resin protective film was transparent except a cell portion, it is necessary to add an unnecessary material, e.g. attaching a color film, as a back sheet layer 33 when coloring the module in accordance with usage.

In solar cells, since the whole module needs to be colored in accordance with a color of a housing for installation and working environment, a white and/or black back sheet is bonded on a back surface of the module.

However, module thickness becomes thicker and cost also be increased by using such a back sheet layer 33.

As shown in FIG. 38A, an organic thin film photovoltaic device 1 according to the second embodiment enables arbitrary coloring to the module, with the layered element structure thinner than that of the comparative example, by using a protection film (colored barrier layer 28) to which a coloring agent is added. More specifically, a color filter enabling arbitrary patterning with UV irradiation is used for the protective layer of the cell, thereby realizing the well-designed protective layer, reducing the number of fabrication processes, and improving the designedness, compared with the comparative example.

As shown in FIG. 38A, the organic thin film photovoltaic device 1 according to the second embodiment is made by laminating the organic layer (12, 14) having a thickness of approximately several 100 nm used for a power generation layer (photovoltaic layer) on the glass substrate 10 with ITO, and by evaporating a metal layer, e.g. an aluminum, as the second electrode layer 16.

Since a pure aluminum formed as the second electrode layer 16 is easily oxidized, a passive state film 24 may be formed on the second electrode layer 16 in order to improve durability, as shown in FIG. 38A.

Since organic layers, e.g. the hole transport layer 12, the bulk heterojunction organic active layer 14, are disposed on the substrate 10, the passive state film 24 formed thereon can prevent the occurrence of damage to the organic layers at the time when forming the passivation layer 26.

The colored barrier layer 28 disposed on the passivation layer 26 has a role of a protective layer used for the cells in the organic thin film photovoltaic device 1 according to the embodiment.

The colored barrier layer 28 can be formed of color filters enabling arbitrary patterning by irradiation with UV rays. Since the color filter enabling such patterning as the protective layer is used for the organic thin film photovoltaic device 1 according to the embodiment, there can be provided the well-designed protective layer, thereby enabling reduction in the number of the fabrication processes, and improvement in the designedness, as compared with comparative example (FIG. 38B).

In the organic thin film photovoltaic device 1 according to the second embodiment, the passivation layer 26 and the colored barrier layer 28 can be formed by laminating an inorganic passivation film and resin protective film, e.g. SiN and SiON, with CVD in a multilayer.

Since the barrier layer 28 can be colored without changing the process of the module, in the organic thin film photovoltaic device 1 according to the second embodiment, a part other than the cell of the module can be arbitrarily colored by adding dye to material(s of the resin protective film. Since such a resin material can leave a pattern in only a portion irradiated with UV rays after coating formation, the back surface can be colored with arbitrary patterns.

For example, carbon black etc. are applicable as a black coloring agent, phthalocyanine-based coating etc. are applicable as a blue coloring agent, and alizarin-based coating etc. are applicable as a red coloring agent.

An example of an organic thin film photovoltaic device module colored with arbitrary patterns and embedded with literal characters will be mentioned later (refer to FIGS. 47-50).

The duplicated description is omitted since the operational principle and composite materials also in the organic thin film photovoltaic device according to the second embodiment of each part are the same as that of the first embodiment.

Figure 39:
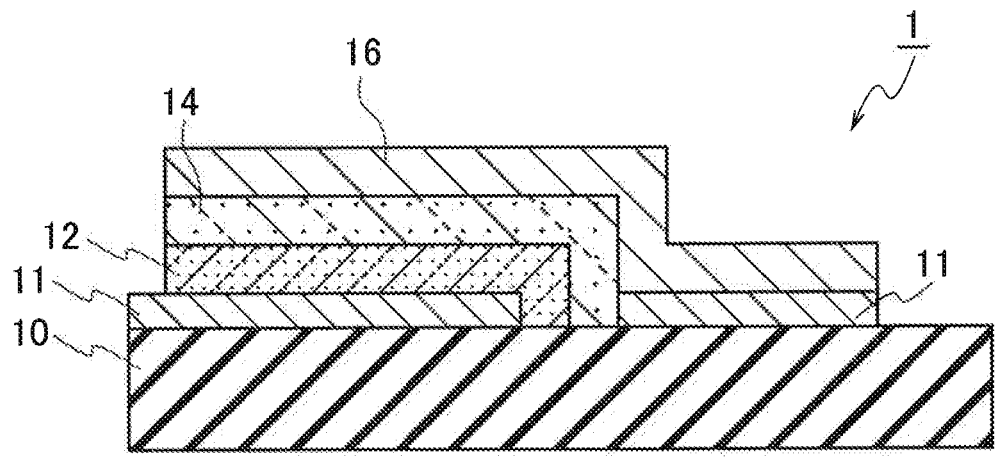
FIG. 39 is a schematic cross-sectional structure diagram showing a laminated structure portion of the organic thin film photovoltaic device according to the second embodiment.

As shown in FIG. 39, the laminated structure portion of an organic thin film photovoltaic device 1 according to the second embodiment includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; and a cathode electrode layer (second electrode layer) 16 disposed on the bulk heterojunction organic active layer 14.

Figure 40:
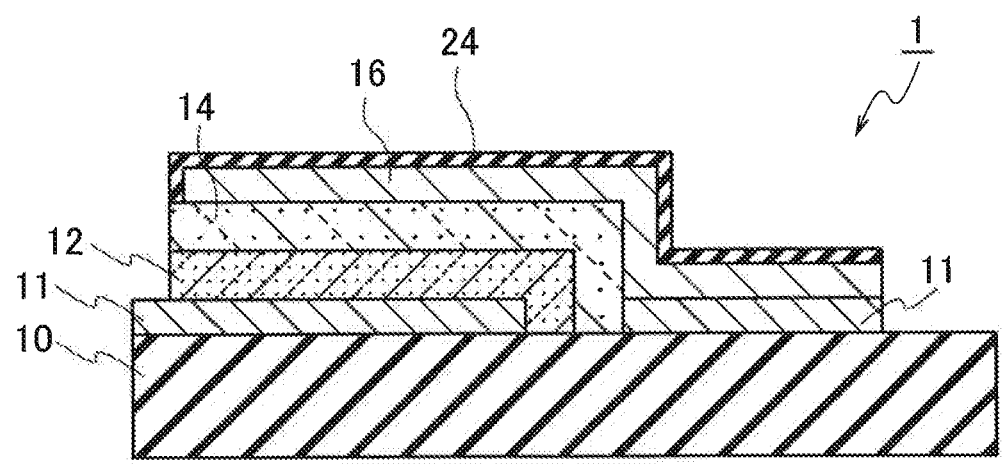
FIG. 40 is a schematic cross-sectional structure diagram showing a laminated structure portion of an organic thin film photovoltaic device according to a modified example of the second embodiment.

Moreover, a laminated structure portion of the organic thin film photovoltaic device 1 according to the second embodiment further includes a passive state film 24 disposed on the surface of the second electrode layer 16, as shown in FIG. 40. In the embodiment, the passive state film 24 is composed of an oxide film of the second electrode layer 16. Moreover, the oxide film of the second electrode layer 16 can be formed with oxygen plasma treatment applied on the surface of the second electrode layer 16. The thickness of the passive state film 24 is from approximately 10 angstroms to approximately 100 angstroms, for example. In addition, a passivation film (not illustrated) disposed on the passive state film 24 may be provided. The passivation film can be composed of an SiN film or an SiON film, for example.

The second electrode layer 16 may be composed of any one of metals, such as Al, W, Mo, Mn, or Mg. If the second electrode layer 16 is formed of Al, the passive state film 24 is an alumina ($Al_2O_3$) film.

As shown in FIG. 40, even in the case where moisture or oxygen is infiltrated into the bulk heterojunction organic active layer 14, the organic thin film photovoltaic device 1 including a passive state film 24 on the surface of the second electrode layer 16 can prevent a situation where a second electrode layer 16 is oxidized due to the moisture or oxygen. Accordingly, degradation of the organic solar cell can be reduced, thereby improving the durability thereof.

(Fabrication Method)

Figure 41A:
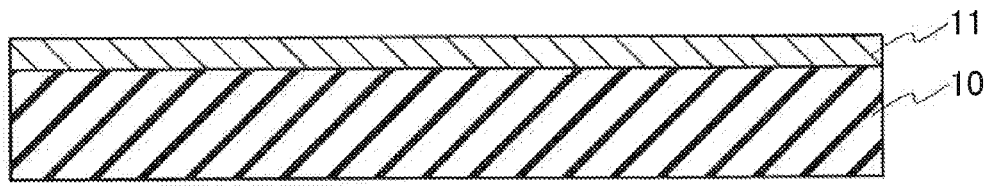
FIG. 41A is a process chart of preparing an ITO substrate on which a transparent electrode layer is formed on the substrate, in a process of a fabrication method of the organic thin film photovoltaic device according to the second embodiment.
Figure 41B:
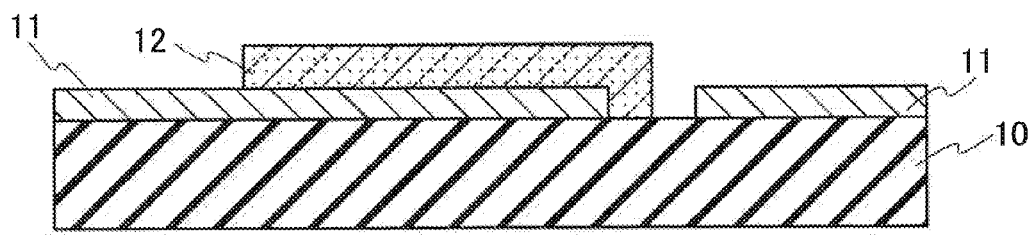
FIG. 41B is a process chart of pattern-forming a hole transport layer on a transparent electrode layer after patterning the transparent electrode layer, in a process of the fabrication method of the organic thin film photovoltaic device according to the second embodiment.
Figure 41C:
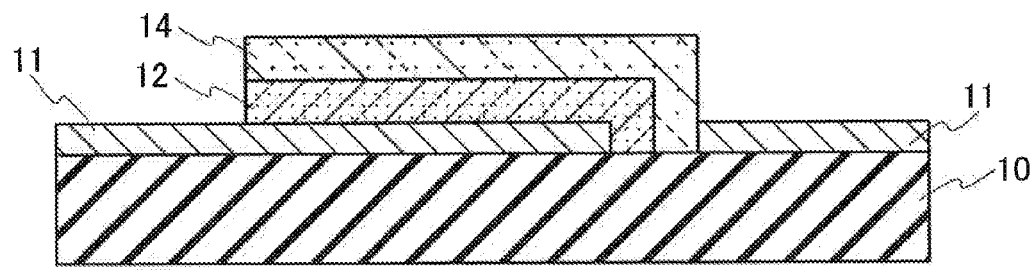
FIG. 41C is a process chart of pattern-forming a bulk heterojunction organic active layer on the hole transport layer, in a process of the fabrication method of the organic thin film photovoltaic device according to the second embodiment.
Figure 41D:
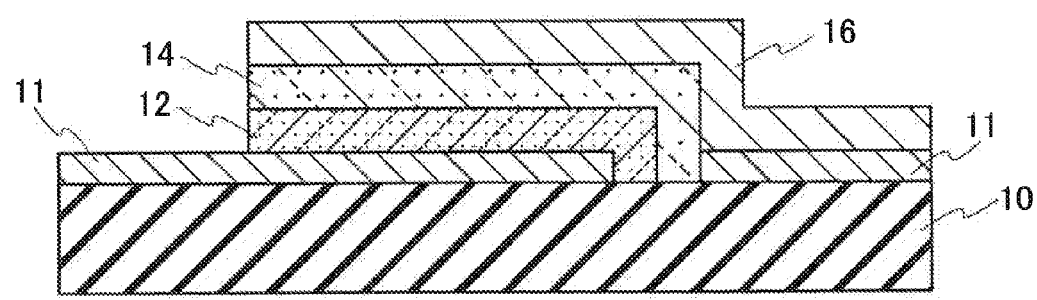
FIG. 41D is a process chart of pattern-forming a second electrode layer on the bulk heterojunction organic active layer, in a process of the fabrication method of the organic thin film photovoltaic device according to the second embodiment.

In a fabrication method of the organic thin film photovoltaic device according to the second embodiment, a process of preparing an ITO substrate on which the transparent electrode layer 11 is formed on the substrate 10 is expressed as shown in FIG. 41A. Moreover, a process of pattern-forming the hole transport layer 12 on the transparent electrode layer 11 after patterning the transparent electrode layer 11 is expressed as shown in FIG. 41B, A process of pattern-forming the bulk heterojunction organic active layer 14 on the hole transport layer 12 is expressed as shown in FIG. 41C, and a process of pattern-forming the second electrode layer 16 on the bulk heterojunction organic active layer 14 is expressed as shown in FIG. 41D.

Figure 42A:
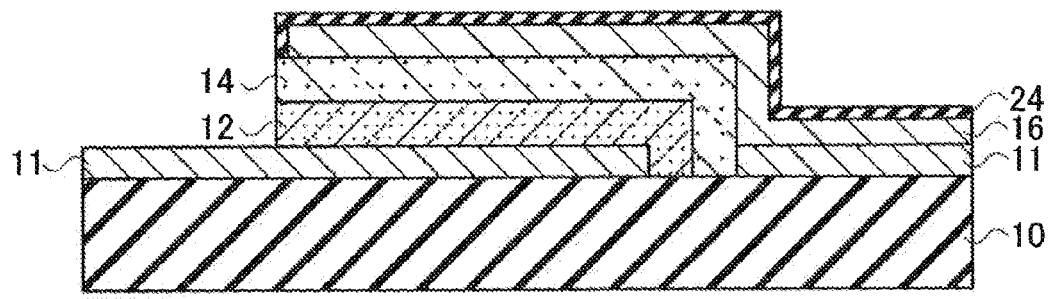
FIG. 42A is a process chart of forming a passive state film (oxide film) on the surface of the second electrode layer, in a process of the fabrication method of an organic thin film photovoltaic device according to the second embodiment.
Figure 42B:
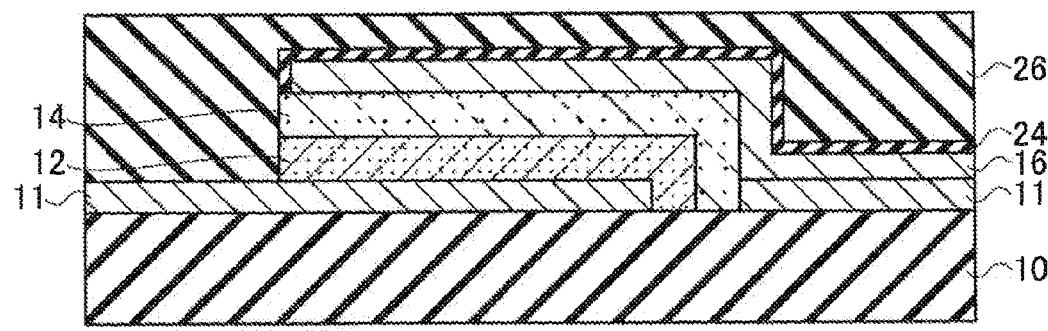
FIG. 42B is a process chart of forming the passivation layer all over the device, in a process of the fabrication method of the organic thin film photovoltaic device according to the second embodiment.
Figure 42C:
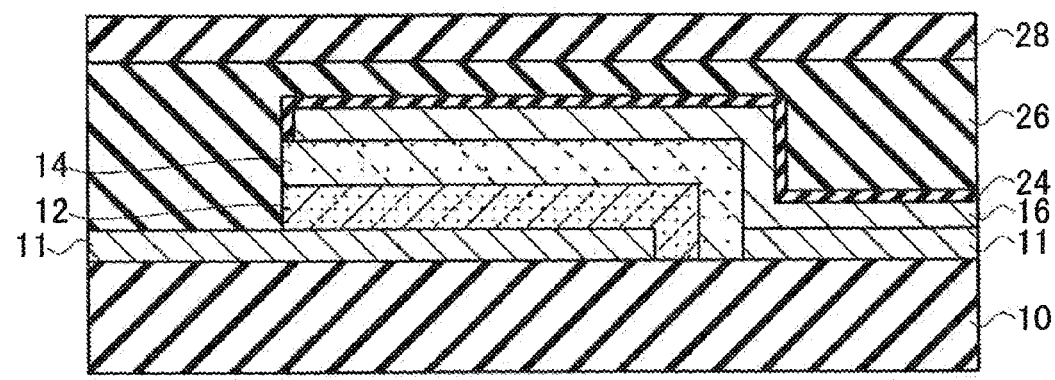
FIG. 42C is a process chart of forming a colored barrier layer on the passivation layer, in a process of the fabrication method of the organic thin film photovoltaic device according to the second embodiment.

Moreover, in the fabrication method of the organic thin film photovoltaic device according to the embodiment, a process of forming the passive state film (oxide film) 24 on the surface of the second electrode layer 16 is expressed as shown in FIG. 42A, a process of forming the passivation layer 26 the entire surface of the device is expressed as shown in FIG. 42B, and a process of forming the colored barrier layer 28 on the passivation layer 26 is expressed as shown in FIG. 42C.

As shown in FIGS. 41, 42, and 1A, the fabrication method of the organic thin film photovoltaic device 1 according to the embodiment includes: preparing the substrate 10; forming the first electrode layer 11 on the substrate 10; forming the hole transport layer 12 on the first electrode layer 11; forming the bulk heterojunction organic active layer 14 on the hole transport layer 12; forming the second electrode layer 16 on the bulk heterojunction organic active layer 14; forming the passivation layer 26 on the second electrode layer 16; forming the colored barrier layer 28 on the passivation layer 26; and forming the back sheet passivation layer 30 on the colored barrier layer 28.

With reference to FIGS. 41, 42, and 38A, the fabrication method of the organic thin film photovoltaic device according to the embodiment will now be explained.

(a) Firstly, as shown in FIG. 41A, the transparent electrode layer 11 composed of ITO, for example, is formed on the substrate 10.

(b) Next, as shown in FIG. 41B, the hole transport layer 12 is pattern-formed on the transparent electrode layer 11 after patterning the transparent electrode layer 11. Wet etching technology, oxygen plasma etching technology, laser patterning technology, nano-imprint technology, etc. are applicable to the patterning of the transparent electrode layer 11. Spin coating technology, spray technology, screen printing technology, etc. are applicable to the formation of the hole transport layer 12. In this case, in the process for forming the hole transport layer 12, PEDOT:PSS may be formed with spin coating, for example, and annealing may be performed for approximately 10 minutes at 120 degrees C. for the purpose of water removal.

(c) Next, as shown in FIG. 41C, the bulk heterojunction organic active layer 14 used as a power generation layer (photovoltaic layer) is formed on the hole transport layer 12. In the formation process of the bulk heterojunction organic active layer 14, P3HT is formed with spin coating, for example. In the formation of the bulk heterojunction organic active layer 14, after forming the bulk heterojunction organic active layer 14 in film form using ink-jet processing, it is heated at approximately 100-120 degrees C. for approximately 10-30 minutes in order to dry the organic solvent.

(d) Next, as shown in FIG. 41D, the cathode electrode layer 16 is pattern-formed on the bulk heterojunction organic active layer 14. The cathode electrode layer 16 can be formed of a metal layer, e.g. Al, W, Mo, Mn, Mg, etc., for example, with vacuum thermal vapor deposition. Moreover, screen printing technology may be applied thereto.

(e) Next, as shown in FIG. 42A, the oxide film (passive state film) 24 is formed on the surface of the second electrode layer 16. Moreover, the passive state film 24 can be formed by applying oxygen plasma treatment to the second electrode layer 16. Using oxygen plasma, an unnecessary organic layer is removed and them oxide film treatment is applied to a reexposed aluminum surface.

(f) Next, as shown in FIG. 42B, the passivation layer 26 is formed on the second electrode layer 16. In this case, the passivation layer 26 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air.

(g) Next, as shown in FIG. 42C, the colored bather layer 28 is formed on the passivation layer 26. In order to eliminate defects, e.g. a spot etc. of the passivation layer 26 formed with the SiN film, and to smooth the back surface of the module, the UV curing resin material is coated with a spin coat method etc., then is cured by the UV irradiation. Coloring arbitrary to the module is enabled in the thin-layered element structure by using the protection film to which a coloring agent is added for the colored barrier layer 28.

(h) Next, as shown in FIG. 38A, the back sheet passivation layer 30 is formed on the colored barrier layer 28. The back sheet passivation layer 30 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air.

According to the above-mentioned processes, the organic thin film photovoltaic device 1 according to the second embodiment can be completed.

In accordance with required module durability, a multi-laminated protection film may be formed by repeatedly performing the process of forming the passivation layers 26, e.g. a silicon nitride film (FIG. 42B), and forming the colored barrier layer 28 on the passivation layer 26 (FIG. 42C).

Moreover, an aperture of the cell is arbitrarily patterned with an ink-jet process etc. Moreover, arbitrary patterning can also be realized with respect to the colored barrier layer 28 (resin protective film) to which dye is added by using the ink-jet process etc. In this case, the aperture of the cell corresponds to the display area 2 or the formation area 6 of literal characters (refer to FIGS. 47-50), for example.

(Fabrication Method)

There will now be explained the fabrication method of a plurality (three pieces, as an example in drawings) of the organic thin film photovoltaic devices disposed in series according to the second embodiment.

A schematic planar pattern configuration of a state where the transparent electrode layer 11 is formed on the substrate 10 is shown similarly to FIG. 19A, in a process of the fabrication method of the organic thin film photovoltaic device according to the second embodiment. A schematic cross-sectional structure taken in the line 19B-19B FIG. 19A is shown similarly to FIG. 19B.

Moreover, a schematic planar pattern configuration showing a state where the hole transport layer 12 is formed as a film on the transparent electrode layer 11 is shown similarly to FIG. 20A, and a schematic cross-sectional structure taken in the line 20B-20B of FIG. 20A is shown similarly to FIG. 20B.

Moreover, a schematic planar pattern configuration showing a state where the bulk heterojunction organic active layer 14 is formed as a film on the hole transport layer 12 is shown similarly to FIG. 21A, and a schematic cross-sectional structure taken in the line 21B-21B of FIG. 21A is shown similarly to FIG. 21B.

Moreover, a schematic planar pattern configuration showing a state where the second electrode layer 16 is formed on the bulk heterojunction organic active layer 14 is shown similarly to FIG. 22A, and a schematic cross-sectional structure taken in the line 22B-22B of FIG. 22A is shown similarly to FIG. 22B.

Figure 43A:
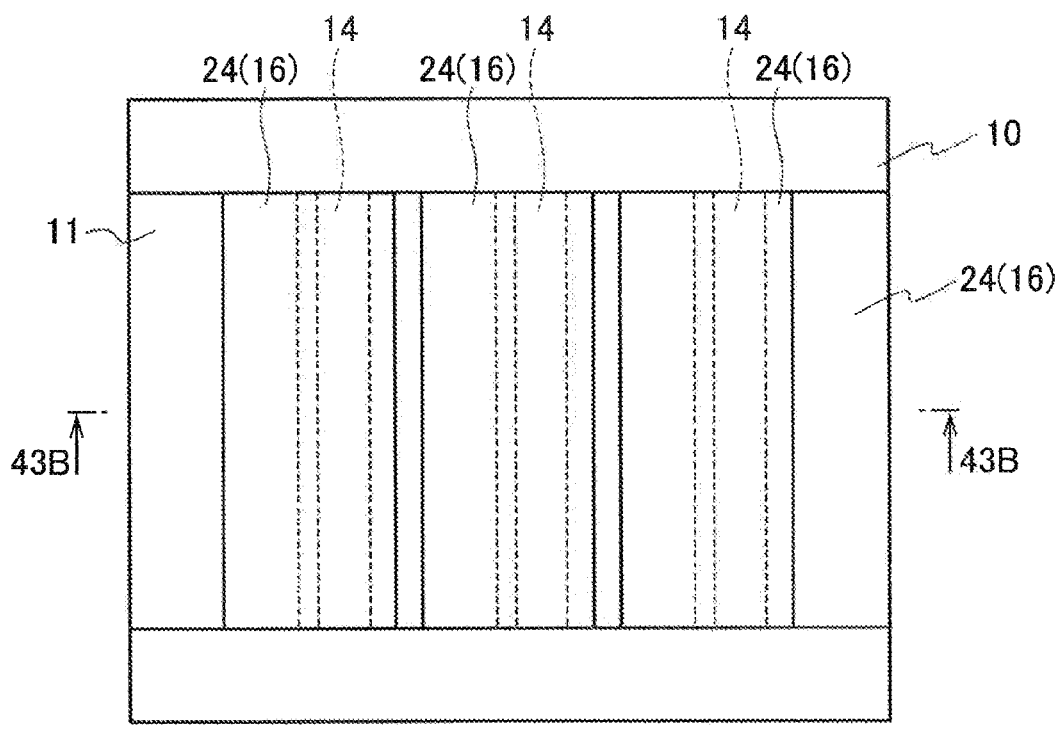
FIG. 43A is a schematic planar pattern configuration diagram showing a state where an unnecessary organic layer is etched by using oxygen plasma treatment, and an oxide layer is formed on the surface of the second electrode layer, in a process of the fabrication method of the organic thin film photovoltaic device according to the second embodiment.
Figure 43B:
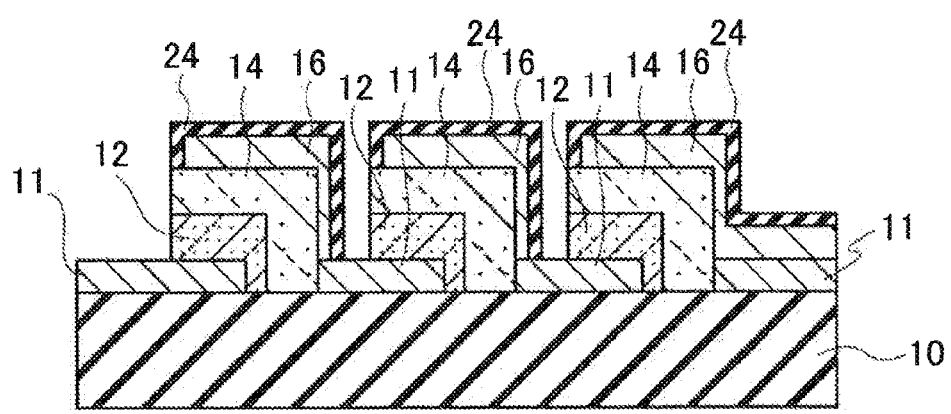
FIG. 43B is a schematic cross-sectional structure diagram taken in the line 43B-43B of FIG. 43A, in a process of the fabrication method of the organic thin film photovoltaic device according to the second embodiment.

Moreover, FIG. 23A shows a schematic planar pattern configuration of a state where an unnecessary organic layer of the hole transport layer 12 and the bulk heterojunction organic active layer 14 is etched by using oxygen plasma treatment, and the passive state film (oxide film) 24 is formed on the surface of the second electrode layer 16. A schematic cross-sectional structure taken in the line 43B-43B of FIG. 43A is expressed as shown in FIG. 43B.

Figure 44A:
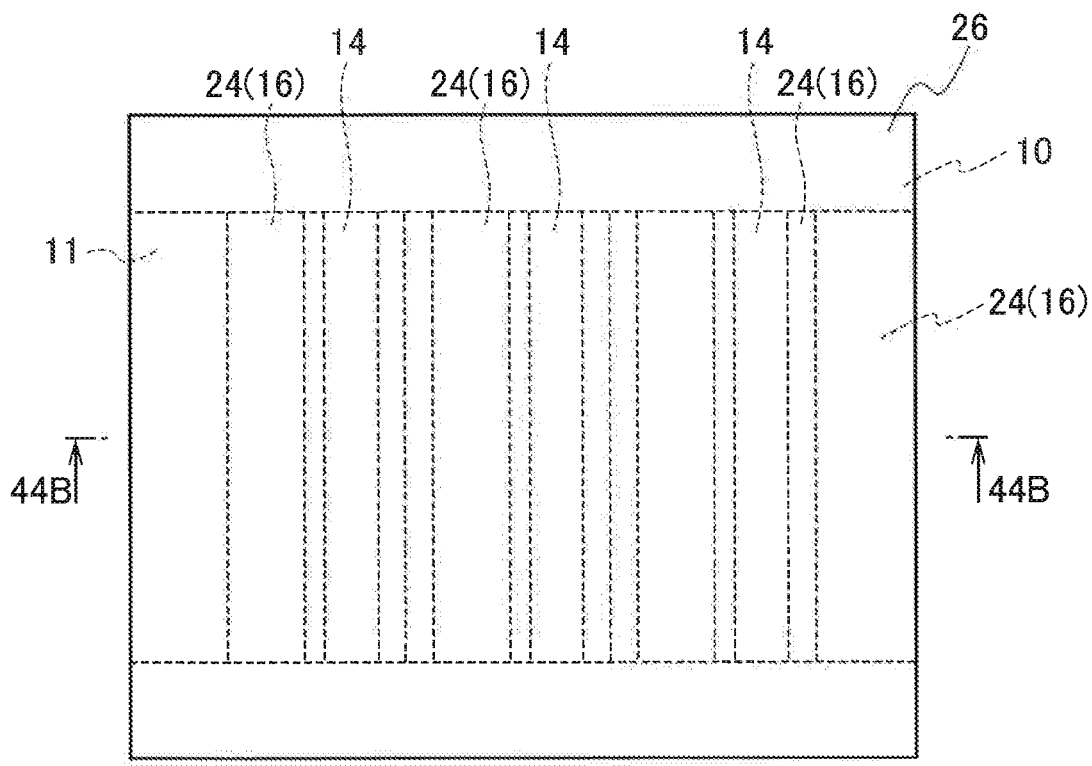
FIG. 44A is a schematic planar pattern configuration diagram showing a state where the passivation layer is formed all over the device, in a process of the fabricating process of the organic thin film photovoltaic device according to the second embodiment.
Figure 44B:
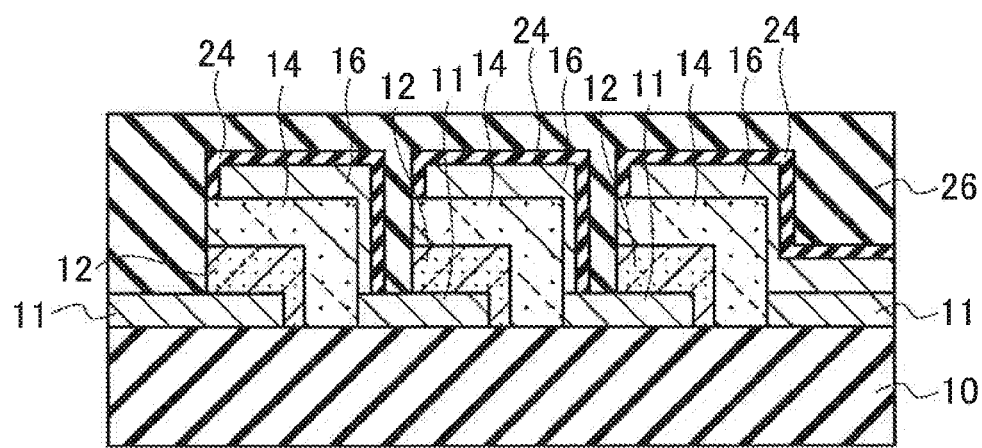
FIG. 44B is a schematic cross-sectional structure diagram taken in the line 44B-44B of FIG. 44A, in a process of the fabrication method of the organic thin film photovoltaic device according to the second embodiment.

Moreover, a schematic planar pattern configuration showing a state where the passivation layer 26 is formed on the entire surface of the device is expressed as shown in FIG. 44A, and a schematic cross-sectional structure taken in the line 44B-44B of FIG. 44A is expressed as shown in FIG. 44B.

Figure 45A:
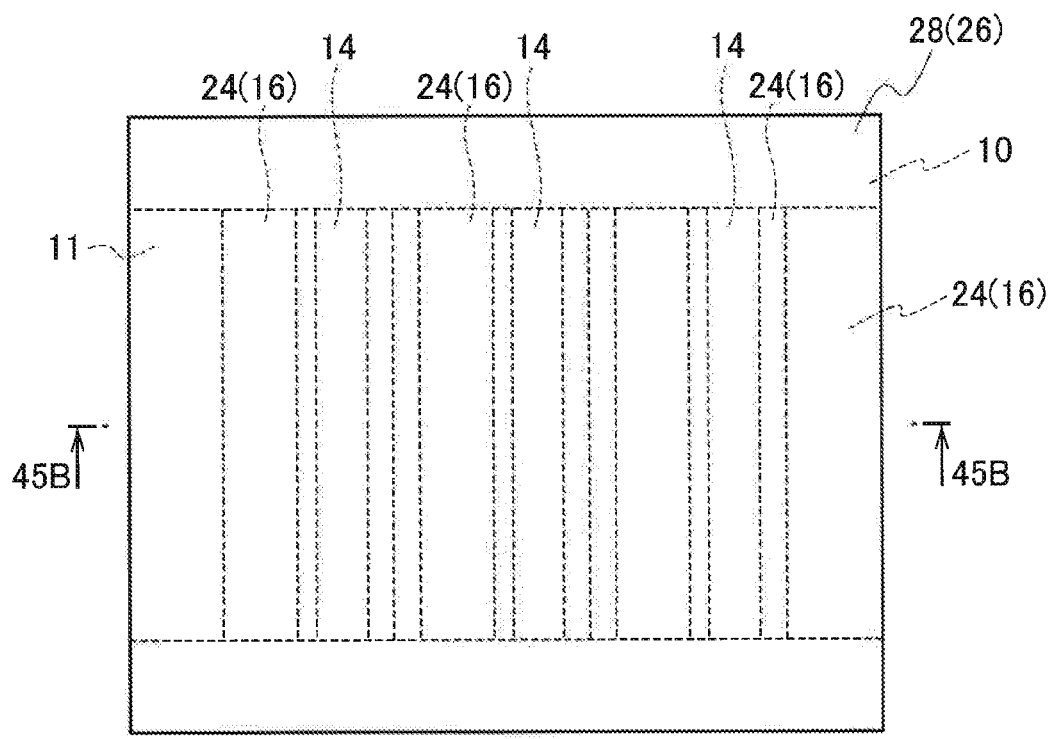
FIG. 45A is a schematic planar pattern configuration diagram showing a state where a colored barrier layer is formed on the passivation layer, in a process of the fabricating process of the organic thin film photovoltaic device according to the second embodiment.
Figure 45B:
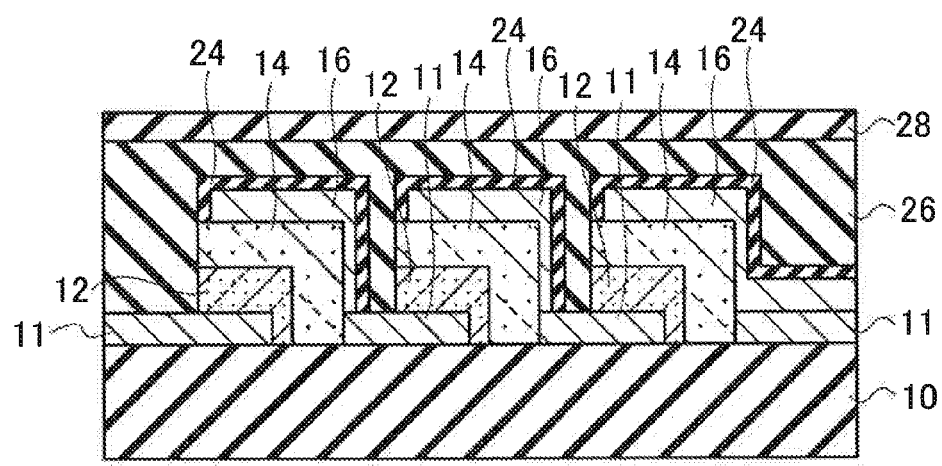
FIG. 45B is a schematic cross-sectional structure diagram taken in the line 45B-45B of FIG. 45A, in a process of the fabrication method of the organic thin film photovoltaic device according to the second embodiment.

Moreover, a schematic planar pattern configuration showing a state where the colored barrier layer 28 is formed on the passivation layer 26 is expressed as shown in FIG. 45A, and a schematic cross-sectional structure taken in the line 45B-45B of FIG. 45A is expressed as shown in FIG. 45B.

Figure 46A:
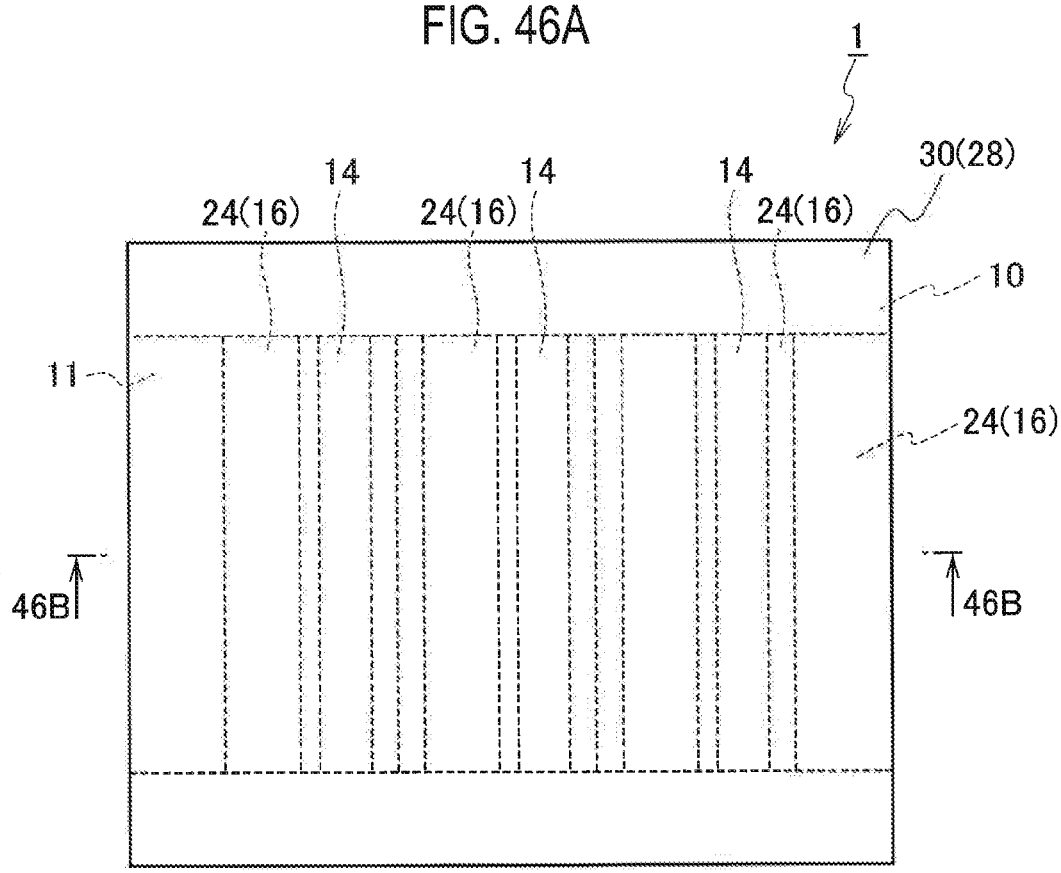
FIG. 46A is a schematic planar pattern configuration diagram showing a state where a back sheet passivation layer is formed on the colored barrier layer, in a process of the fabrication method of the organic thin film photovoltaic device according to the second embodiment.
Figure 46B:
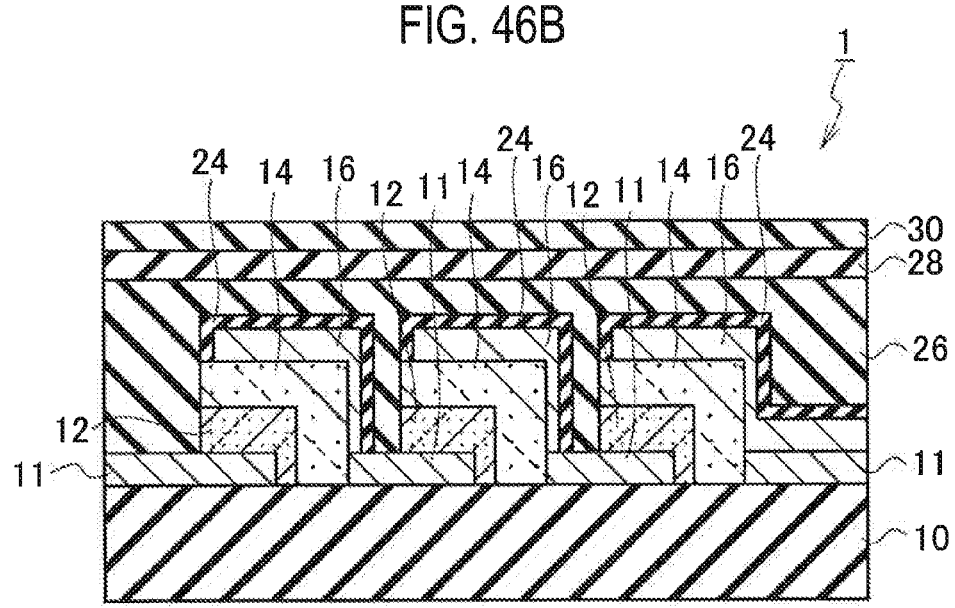
FIG. 46B is a schematic cross-sectional structure diagram taken in the line 46B-46B of FIG. 46A, in a process of the fabrication method of the organic thin film photovoltaic device according to the second embodiment.

Moreover, a schematic planar pattern configuration showing a state where the back sheet passivation layer 30 is formed on the colored barrier layer 28 is expressed as shown in FIG. 46A, and a schematic cross-sectional structure taken in the line 46B-46B of FIG. 46A is expressed as shown in FIG. 46B.

With reference to FIGS. 19-22 and 43-49, there will now be explained the fabrication method of a plurality (three pieces, as an example in drawings) of the organic thin film photovoltaic devices disposed in series according to the second embodiment.

(a) Firstly, a glass substrate (of which the size is, for example, 50 mm in length×50 mm in width×10.4 mm in thickness) washed by pure water, acetone and ethanol is inserted into an Inductively Coupled Plasma (ICP) etcher, and adherents on the surface of the glass substrate are removed by $O_2$ plasma (Glass Substrate Surface Treatment). In order to guide the light to the organic active layer efficiently, an antireflection process may be performed to the glass surface of the substrate 10 formed of a glass substrate.

(b) Next, the transparent electrode layer 11 composed of ITO, for example, is formed on the glass substrate 10 in the same manner as FIG. 19. A plurality of the transparent electrode layers 11 are formed in a stripe pattern so as to sandwich a trench region, in the same manner as FIG. 19. Oxygen plasma etching technology, laser patterning technology, nano-imprint technology, etc. can be applied to the formation of the trench region.

(c) Next, the hole transport layer 12 is formed on each transparent electrode layer 11 in the same manner as FIG. 20. Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees C. for the purpose of water removal. Oxygen plasma etching technology, laser patterning technology, nano-imprint technology, etc. can be applied to the formation of the trench region.

(d) Next, the bulk heterojunction organic active layer 14 is formed on each hole transport layer 12 in the same manner as FIG. 21. In the formation process of the bulk heterojunction organic active layer 14, film formation is performed with spin coating of P3HT, for example.

(e) Next, in the same manner as FIG. 22, the cathode electrode layer 16 is formed on each bulk heterojunction organic active layer 14. The cathode electrode layer 16 is formed by depositing a metal layer (e.g., Al, W, Mo, Mg) by vacuum thermal vapor deposition, for example. Screen printing technology instead of the vacuum thermal vapor deposition may be applied to the formation of the cathode electrode layer 16.

(f) Next, as shown in FIG. 43, the oxide film (passive state film) 24 is formed on the surface of the cathode electrode layer 16, after the etching process with respect to the bulk heterojunction organic active layer 14 and the hole transport layer 12. Each cell can be separated by performing the etching process of the bulk heterojunction organic active layer 14 and the hole transport layer 12. Moreover, the passive state film 24 can be formed by applying oxygen plasma treatment to the second electrode layer 16. The passive state film 24 can be formed using a high-density plasma etching apparatus, for example. By performing the oxygen plasma treatment of the second electrode layer 16, the bulk heterojunction organic active layer 14 and the hole transport layer 12 can also be etched, in tandem with the forming of the passive state film 24.

(g) Next, as shown in FIG. 44, the passivation layer 26 is formed on the entire surface of the device. In this case, the passivation layer 26 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air.

(h) Next, as shown in FIG. 45, the colored barrier layer 28 is formed on the passivation layer 26. In order to eliminate defects, e.g. a spot etc. of the passivation layer 26 formed with the SiN film, and to smooth the back surface of the module, the UV curing resin material is coated with a spin coat method etc., then is cured by the UV irradiation. Coloring arbitrary to the module is enabled in the thin-layered element structure by using the protection film to which a coloring agent is added for the colored barrier layer 28.

(i) Next, as shown in FIG. 46, the back sheet passivation layer 30 is formed on the colored barrier layer 28. The back sheet passivation layer 30 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air.

In accordance with required module durability, a multi-laminated protection film may be formed by repeatedly performing the process of forming the passivation layer 26, e.g. a silicon nitride film (FIG. 44), and forming the colored barrier layer 28 on the passivation layer 26 (FIG. 45).

Moreover, an aperture of the cell is arbitrarily patterned with an ink-jet process etc. Moreover, arbitrary patterning can also be realized with respect to the colored barrier layer 28 (resin protective film) to which dye is added by using the ink-jet process etc.

According to the above-mentioned processes, the organic thin film photovoltaic device 1 according to the second embodiment can be completed.

(Producing Steps of Organic Thin Film Photovoltaic Device)

A flow chart showing producing steps of the organic thin film photovoltaic device 1 according to the second embodiment is the same as the flow chart (FIG. 31) showing producing steps of the organic thin film photovoltaic device 1 according to the second embodiment.

(a) In Step S1, PEDOT:PSS is coated on the substrate 10. For example, PEDOT:PSS aqueous solution is filtered with a 0.45-μm PTFE membrane filter to remove undissolved matters and impurities, and then the PEDOT:PSS aqueous solution is coated on the ITO substrate 10 with spin coating (for example, 4000 rpm for 30 sec).

(b) The PEDOT:PSS is sintered in Step S2. That is, heat-treatment is performed at 120 degrees C. for 10 minutes for the purpose of water removal, after the film formation. In addition, it is effective to cover a petri dish previously heated by a hot plate so that the heat may be transferred to whole of the substrate 10.

(c) P3HT:PCBM is coated on the substrate 10 in Step S3. Specifically, P3HT 16 mg and PCBM 16 mg are dissolved in dichlorobenzene (o-dichlorobenzene), for example. The solution is subjected to ultrasonic treatment for 1 minute at 50 degrees C., after agitating at 50 degrees C. under nitrogen atmosphere for a night. Spin coating of the solution is performed on the ITO substrate 10 subjected to washing treatment in a glove box replaced with nitrogen (<1 ppm$O_2$, $H_2O$). A rotational frequency of the spin coating is 2000 rpm per 1 sec after 550 rpm per 60 sec.

(d) Pre-annealing is performed in Step S4. That is, heating processing is performed for 10 minutes at 120 degrees C. after the coating of Step S3. In addition, it is effective to cover a petri dish previously heated by a hot plate so that the heat may be transferred to whole of the substrate 10.

(e) LiF vacuum evaporation is performed in Step S5. Specifically, as for LiF (purity: 99.98%), vacuum thermal evaporation is performed with the vacuum degree: $1.1 \times 10^{-6}$ torr and the vacuum evaporation rate: 0.1 angstrom/sec.

(f) In Step S6, Al vacuum evaporation is performed, thereby forming the second electrode layer 16. Specifically, as for Al (purity: 99.999%), vacuum thermal evaporation is performed with the vacuum degree: $1.1 \times 10^{-6}$ torr and the vacuum evaporation rate: more than 2 angstroms/sec.

(g) An oxide film is formed on the second electrode layer 16 in Step S7. Specifically, the surface of the second electrode layer 16 is oxidized with oxygen plasma by using a high-density plasma etching apparatus, thereby forming the oxide film 24.

(h) Sealing is performed in Step S8. Specifically, the passivation layer 26, the colored barrier layer 28, and the back sheet passivation layer 30 are formed to be laminated one after another on the whole device, and thereby the elements are sealed.

(Mass Production Process)

The organic thin film photovoltaic device according to the second embodiment can also be fabricated with a mass production process by disposing a plurality of cells in a matrix shape, in the same manner as the first embodiment (FIGS. 32-36).

(a) Firstly, a glass substrate 10 washed by pure water, acetone and ethanol are inserted into an ICP etcher, and adherents on the surface of the glass substrate are removed by $O_2$ plasma (Glass Substrate Surface Treatment). In addition, an antireflection process may be applied on the surface of the glass substrate 10 in order to efficiently guide light to the organic active layer.

(b) Next, the transparent electrode layer 11 composed of ITO, for example, is formed on the substrate 10 in the same manner as FIG. 32. In an example shown in FIG. 32, a plurality of the transparent electrode layers 11 are formed in a stripe pattern so as to sandwich a gap. Oxygen plasma etching technology, laser patterning technology, nano-imprint technology, etc. can be applied to the formation of the gap.

Figure 33:
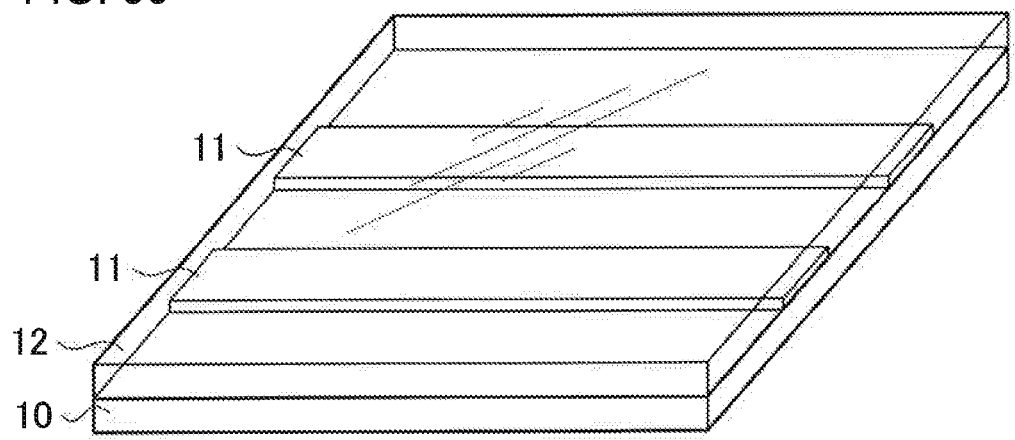
FIG. 33 is a schematic birds-eye view structure diagram showing a state where the hole transport layer is formed as a film with spin coating on the stripe-shaped transparent electrode layer, in a process of the mass production fabricating process of the organic thin film photovoltaic device according to the first embodiment.

(c) Next, the hole transport layer 12 is formed on the substrate 10 and the transparent electrode layer 11, in the same manner as FIG. 33. Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees C. for the purpose of water removal.

(d) Next, the bulk heterojunction organic active layer 14 is formed on the hole transport layer 12, in the same manner as FIG. 34. In the formation process of the bulk heterojunction organic active layer 14, film formation is performed with spin coating of P3HT:PCBM, for example. The thickness of the bulk heterojunction organic active layer 14 is approximately 100 nm to approximately 200 m, for example.

(e) Next, the cathode electrode layers 16 in two-stripes pattern are formed so as to be orthogonal to the transparent electrode layer 11 on the bulk heterojunction organic active layer 14, in the same manner as FIG. 35.

The cathode electrode layer 16 is formed by depositing Al, W, Mo, Mg, etc., for example, by vacuum thermal vapor deposition. Screen printing technology instead of the vacuum thermal vapor deposition may be applied to the formation of the cathode electrode layer 16.

(f) Next, an oxide film (passive state film) not illustrated is formed on the surface of the cathode electrode layer 16. The passive state film can be formed by exposing the cathode electrode layer 16 to oxygen plasma. The oxide film with the oxygen plasma can be formed using a plasma etching apparatus, for example.

(g) Next, although illustration is omitted, the passivation layer 26, the colored barrier layer 28, and the back sheet passivation layer 30 are formed to be laminated one after another on the whole device, and thereby the elements are sealed.

According to the above-mentioned processes, the organic thin film photovoltaic device 1 according to the second embodiment can be mass-produced.

In the organic thin film photovoltaic device according to the second embodiment, an example of a schematic planar pattern configuration to dispose a plurality of cells $C_{ij}$ in a matrix shape is expressed as shown similarly to FIG. 36. The cells $C_{ij}$, ... are disposed at intersections between the anode electrode patterns ..., $A_j$, $A_{j+1}$, ... formed of the anode electrode layer 11, and the cathode electrode patterns ..., $K_{i-1}$, $K_i$, $K_{i+1}$, ... formed of the cathode electrode layer 16 to intersect perpendicularly with the anode electrode patterns ..., $A_j$, $A_{j+1}$, .... The characteristics of each cell $C_{ij}$, ... disposed on the intersections can also be measured independently by selecting the anode electrode pattern ..., $A_j$, $A_{j+1}$, ... and the cathode electrode pattern ..., $K_{i-1}$, $K_i$, $K_{i+1}$, ....

(Spin Coat Method)

A schematic showing a spin coat method at the time of forming the hole transport layer 12 and the bulk heterojunction organic active layer 14, in the fabrication method of the organic thin film photovoltaic device according to the first embodiment is shown similarly to FIG. 37A. A schematic bird's-eye view configuration showing an example of the formed hole transport layer 12 and the bulk heterojunction organic active layer 14 is shown similarly to FIG. 37B.

For example, if a relative small-area element is created, a spin coat method as shown in FIG. 37A can be applied, in the organic thin film photovoltaic device 1 according to the second embodiment.

More specifically, a spin coater including a high-speed rotating spindle 62 connected to driving source, e.g. a motor, and a table fixed to the spindle 62, wherein the substrate 10 is mounted on the table is used therefor, as shown in FIG. 37A.

Then, the driving source, e.g. a motor, is worked after the substrate 10 is mounted on the table 63, and then the table 63 is rotated at a high speed, e.g., 2000-4000 rpm, in arrows A, B direction. Subsequently, a droplet 64 of a solution for forming the hole transport layer 12 and the bulk heterojunction organic active layer 14 is dropped thereon using a syringe 60. Thereby, the hole transport layer 12 and the bulk heterojunction organic active layer 14 having uniform thickness (refer to FIG. 37B) can be formed with the droplet 64 on the substrate 10 in accordance with centrifugal force.

(Electronic Device)

Figure 47:
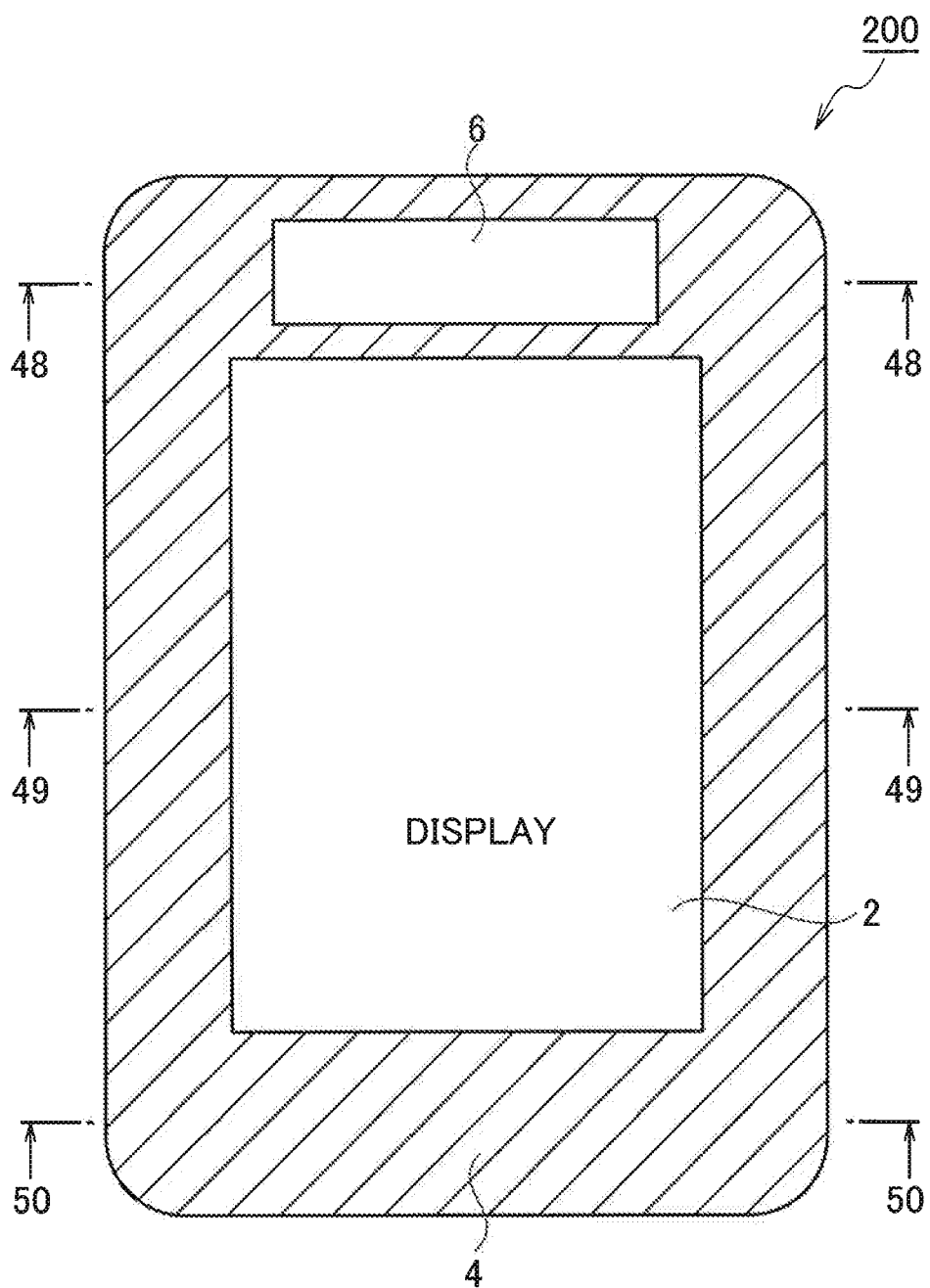
FIG. 47 is a schematic plane configuration diagram of an electronic apparatus to which the organic thin film photovoltaic device according to the second embodiment is applied.

A schematic plane configuration of an electronic apparatus 200 to which the organic thin film photovoltaic device 1 according to the second embodiment is applied is expressed as shown in FIG. 47. The electronic apparatus 200 to which the organic thin film photovoltaic device 1 according to the embodiment is applied includes an organic thin film photovoltaic device formation area 4 and a character formation area 6 at a peripheral part of a display area 2, as shown in FIG. 47.

Figure 48:
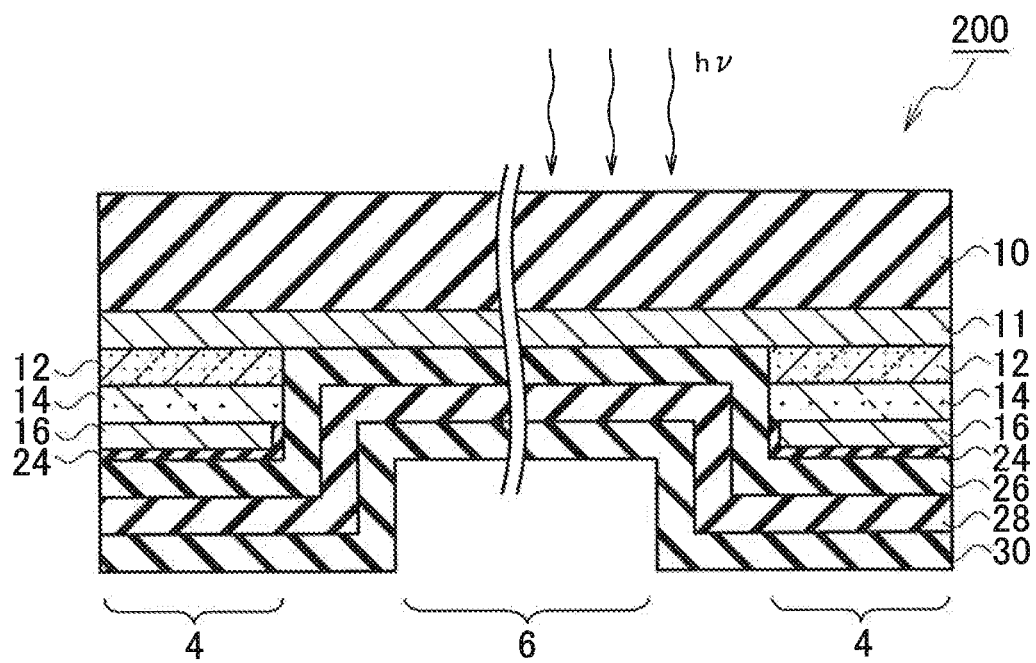
FIG. 48 is a schematic cross-sectional structure diagram taken in the line 48-48 of FIG. 47.
Figure 49:
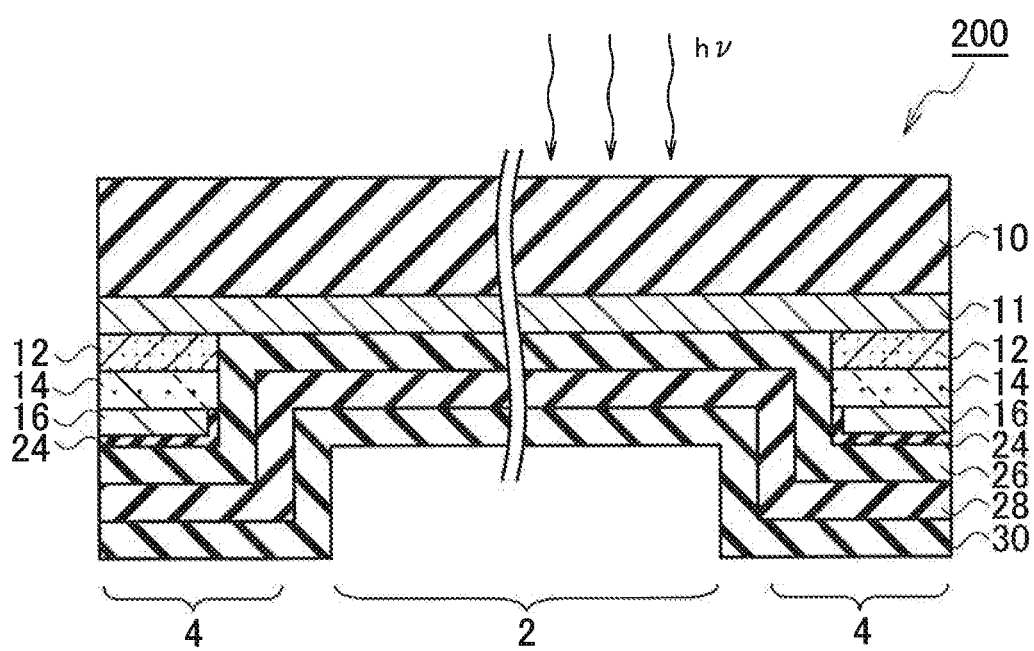
FIG. 49 is a schematic cross-sectional structure diagram taken in the line 49-49 of FIG. 47.
Figure 50:
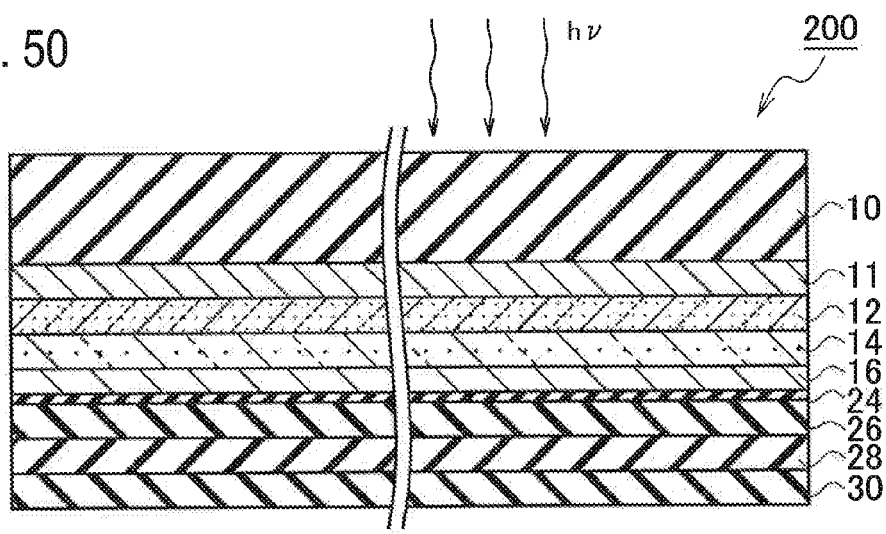
FIG. 50 is a schematic cross-sectional structure diagram taken in the line 50-50 of FIG. 47.

Moreover, a schematic cross-sectional structure taken in the line 48-48 of FIG. 47 is expressed as shown in FIG. 48, a schematic cross-sectional structure taken in the line 49-49 of FIG. 47 is expressed as shown in FIG. 49, and a schematic cross-sectional structure taken in the line 50-50 of FIG. 47 is expressed as shown in FIG. 50.

In the electronic apparatus 200 to which the organic thin film photovoltaic device 1 according to the second embodiment is applied, as shown in FIGS. 48-50, the organic thin film photovoltaic device formation area 4 includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a passivation layer 26 disposed on the second electrode layer 16; a colored barrier layer 28 disposed on the passivation layer 26; and a back sheet passivation layer 30 disposed on the colored barrier layer 28. As shown in FIGS. 48-50, the passive state film 24 may be formed on the surface of the cathode electrode layer (second electrode layer) 16.

As shown in FIGS. 48-50, on the other hand, the display area 2 and the character formation area 6 include: a substrate 10; a transparent electrode layer (first electrode layer) 11 disposed on the substrate 10; a passivation layer 26 disposed on the first electrode layer 11; a colored barrier layer 28 disposed on the passivation layer 26; and a back sheet passivation layer 30 disposed on the colored barrier layer 28.

A colored barrier layer 28 of the organic thin film photovoltaic device formation area 4 is colored in black with black Dye, for example, but a colored barrier layer 28 of the character formation area 6 is colored in a color different from black, e.g., red, in order to arranging literal characters.

Although illustration is omitted, Liquid Crystal Displays (LCD) or Electro Luminescence (EL) displays, for example, can be formed on the substrate 10 corresponding to the display area 2.

Figure 51A:
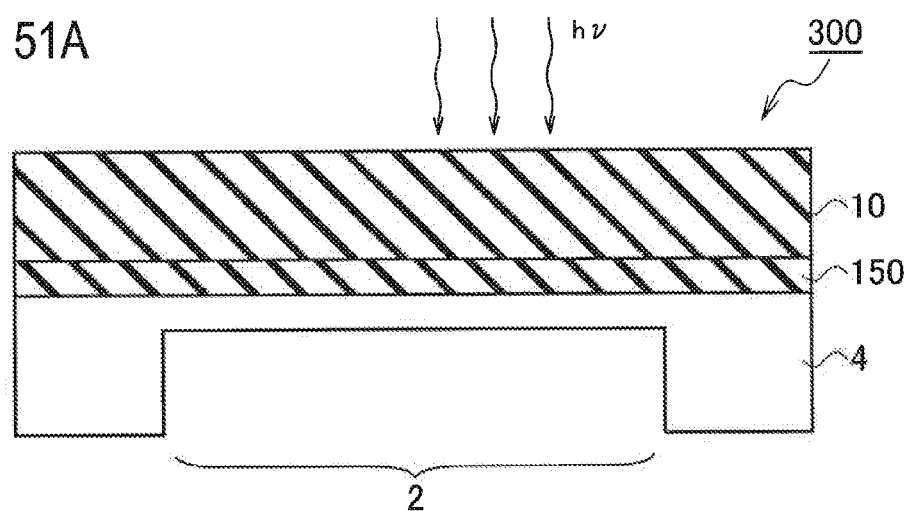
FIG. 51A is a schematic cross-sectional structure diagram of a tandem-structured electronic apparatus to which the organic thin film photovoltaic device according to the second embodiment is applied.

As shown in FIG. 51A, a tandem-structured electronic apparatus 300 to which the organic thin film photovoltaic device according to the second embodiment is applied includes: a substrate 10; and an organic thin film photovoltaic device formation area 4 disposed on the substrate 10 via an adhesive layer 150. The display area 2 is formed in the substrate 10. More specifically, in the tandem-structured electronic apparatus 300 to which the organic thin film photovoltaic device according to the second embodiment is applied, the substrate 10 and the organic thin film photovoltaic device formation area 4 respectively formed independently are disposed in vertical tandem structure via the adhesive layer 150.

Figure 51B:
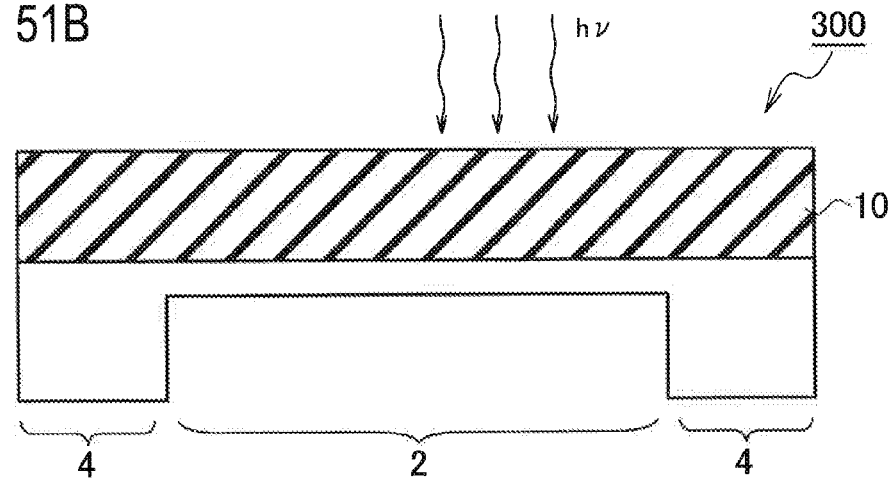
FIG. 51B is a schematic cross-sectional structure diagram of an in-cell structured electronic apparatus to which the organic thin film photovoltaic device according to the second embodiment is applied.

Moreover, as shown in FIG. 51B, an in-cell structured electronic apparatus 300 to which the organic thin film photovoltaic device according to the second embodiment is applied includes: a substrate 10; and an organic thin film photovoltaic device formation area 4 disposed on the substrate 10. More specifically, in the in-cell structured electronic apparatus 300 to which the organic thin film photovoltaic device according to the embodiment is applied, the organic thin film photovoltaic device formation area 4 is formed on the substrate 10 in in-cell structure, and LCD or an organic electroluminescence display can be formed on the substrate 10, for example.

The electronic apparatus 200 to which the organic thin film photovoltaic device 1 according to the second embodiment is applied corresponds to the in-cell structured electronic apparatus 300, as shown in FIGS. 47-50 and 51B.

As explained above, according to the second embodiment, there can be provided the organic thin film photovoltaic device in which the structure thereof is simple, thereby decreasing the number of fabrication processes, and improving the designedness thereof, allowing further weight saving and thin-layering; the fabrication method of such an organic thin film photovoltaic device; and the electronic apparatus including such an organic thin film photovoltaic device.

[Third Embodiment]

Figure 52A:
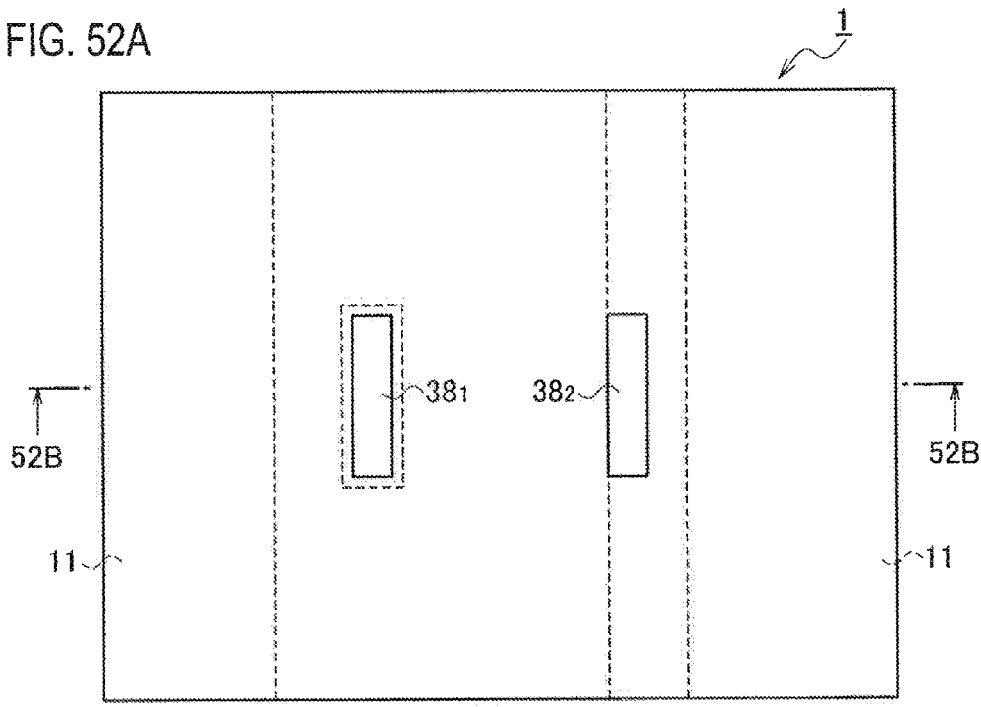
FIG. 52A is a schematic planar pattern configuration diagram of an organic thin film photovoltaic device according to a third embodiment.
Figure 52B:
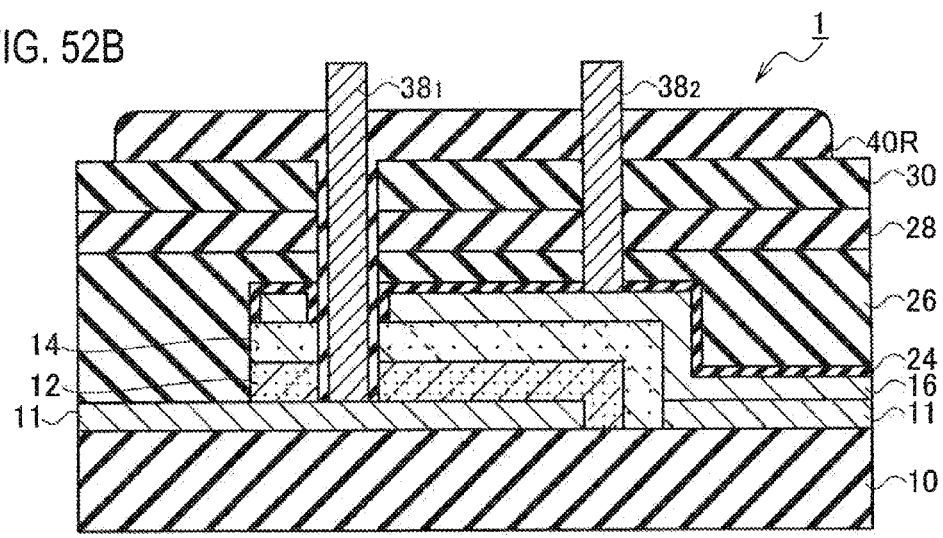
FIG. 52B is a schematic cross-sectional structure diagram taken in the line 52B-52B of FIG. 52A.
Figure 52C:
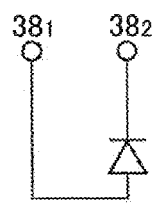
FIG. 52C is a circuit representation of the organic thin film photovoltaic device according to the third embodiment.

A schematic planar pattern configuration of an organic thin film photovoltaic device according to the third embodiment is expressed as shown in FIG. 52A, a schematic cross-sectional structure diagram taken in the line 52B-52B of FIG. 52A is expressed as shown in FIG. 52B, and circuit representation is expressed as shown in FIG. 52C.

As shown in FIG. 52A, the organic thin film photovoltaic device 1 according to a third embodiment includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a passivation layer 26 disposed on the second electrode layer 16; a first extraction terminal electrode $38_1$ disposed in a direction perpendicular to the substrate 10, the first extraction terminal electrode $38_1$ configured to pass through the passivation layer 26, the bulk heterojunction organic active layer 14, and the hole transport layer 12 so as to be connected to the first electrode layer 11; and a second extraction terminal electrode $38_2$ disposed in the direction perpendicular to the substrate 10, the second extraction terminal electrode $38_2$ configured to pass through the passivation layer 26 so as to be connected to the second electrode layer 16.

The first extraction terminal electrode $38_1$ can be connected to arbitrary positions of the first electrode layer 11.

The second extraction terminal electrode $38_2$ can be connected to arbitrary positions of the second electrode layer 16.

As shown in FIGS. 52A and 52B, the organic thin film photovoltaic device 1 according to the third embodiment may include: a colored barrier layer 28 disposed on the passivation layer 26; a back sheet passivation layer 30 disposed on the colored barrier layer 28; and a resin layer 40R disposed on the back sheet passivation layer 30, the resin layer 40R configured to seal the first extraction terminal electrode $38_1$ and the second extraction terminal electrode $38_2$.

Moreover, the colored barrier layer 28 can be formed of a UV curing resin, for example.

Moreover, a coloring agent may be added to the colored barrier layer 28. For example, carbon black etc. are applicable as a black coloring agent, phthalocyanine-based coating etc. are applicable as a blue coloring agent, and alizarin-based coating etc. are applicable as a red coloring agent.

Moreover, the passivation layer 26 can be formed of an SiN film or a SiON film, for example.

Moreover, a multi-laminated protection film may be formed by repeatedly laminating a plurality of the passivation layer 26 and the colored barrier layer 28.

As shown in FIG. 52A, an organic thin film photovoltaic device 1 according to the third embodiment enables arbitrary coloring to the module, with the thin-layered element structure, by using a protection film (colored barrier layer 28) to which a coloring agent is added.

As shown in FIG. 52A, the organic thin film photovoltaic device 1 according to the third embodiment is made by laminating the organic layer (12, 14) having a thickness of approximately several 100 nm used for a power generation layer (photovoltaic layer) on the glass substrate 10 with ITO, and by evaporating a metal layer, e.g. an aluminum, as the second electrode layer 16.

Since a pure aluminum formed as the second electrode layer 16 is easily oxidized, a passive state film 24 may be formed on the second electrode layer 16 in order to improve durability, as shown in FIG. 52A.

Since organic layers, e.g. the hole transport layer 12, the bulk heterojunction organic active layer 14, are disposed on the substrate 10, the passive state film 24 formed thereon can prevent the occurrence of damage to the organic layers at the time when forming the passivation layer 26.

The colored barrier layer 28 disposed on the passivation layer 26 has a role of a protective layer used for the cells in the organic thin film photovoltaic device 1 according to the embodiment.

The colored barrier layer 28 can be formed of color filters enabling arbitrary patterning by irradiation with UV rays. Since the color filter enabling such patterning as the protective layer is used for the organic thin film photovoltaic device 1 according to the embodiment, there can be provided the well-designed protective layer, thereby enabling reduction in the number of the fabrication processes, and improvement in the designedness.

In the organic thin film photovoltaic device 1 according to the third embodiment, the passivation layer 26 and the colored barrier layer 28 can be formed by laminating an inorganic passivation film and resin protective film, e.g. SiN and SiON, with CVD in a multilayer.

Since the barrier layer 28 can be colored without changing the process of the module, in the organic thin film photovoltaic device 1 according to the third embodiment, a part other than the cell of the module can be arbitrarily colored by adding dye to material(s of the resin protective film. Since such a resin material can leave a pattern in only a portion irradiated with UV rays after coating formation, the back surface can be colored with arbitrary patterns.

For example, carbon black etc. are applicable as a black coloring agent, phthalocyanine-based coating etc. are applicable as a blue coloring agent, and alizarin-based coating etc. are applicable as a red coloring agent.

Moreover, according to the third embodiment, there can be provided the organic thin film photovoltaic device of which electrode extraction structure is improved, wherein the connecting point can be formed in arbitrary positions, without largely changing of the external structure, allowing further weight saving and thin-layering.

An example of an organic thin film photovoltaic device module colored with arbitrary patterns and embedded with literal characters will be mentioned later (refer to FIGS. 70-73).

The duplicated description is omitted since the operational principle and composite materials also in the organic thin film photovoltaic device according to the third embodiment of each part are the same as that of the first embodiment.

(Fabrication Method)

Figure 53A:
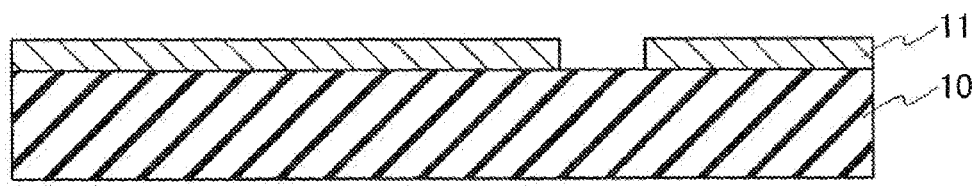
FIG. 53A is a process chart of preparing an ITO substrate on which a transparent electrode layer is pattern-formed on the substrate, in a process of a fabrication method of the organic thin film photovoltaic device according to the third embodiment.
Figure 53B:
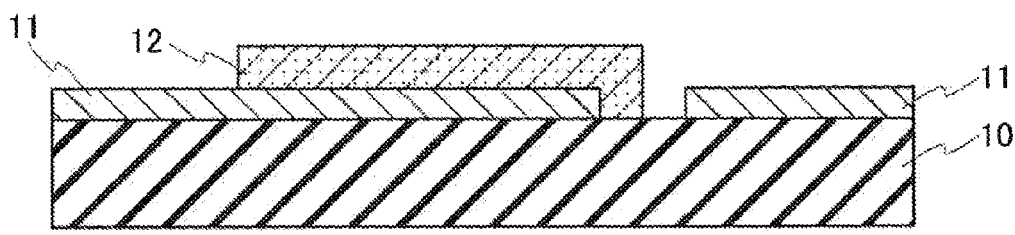
FIG. 53B is a process chart of pattern-forming a hole transport layer on a transparent electrode layer after patterning the transparent electrode layer, in a process of the fabrication method of the organic thin film photovoltaic device according to the third embodiment.
Figure 53C:
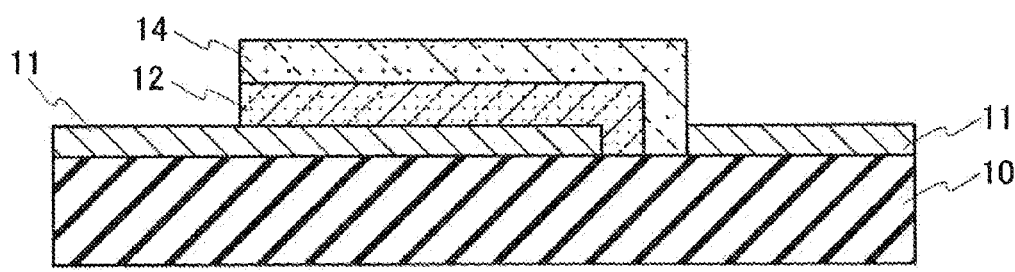
FIG. 53C is a process chart of pattern-forming a bulk heterojunction organic active layer on the hole transport layer, in a process of the fabrication method of the organic thin film photovoltaic device according to the third embodiment.
Figure 53D:
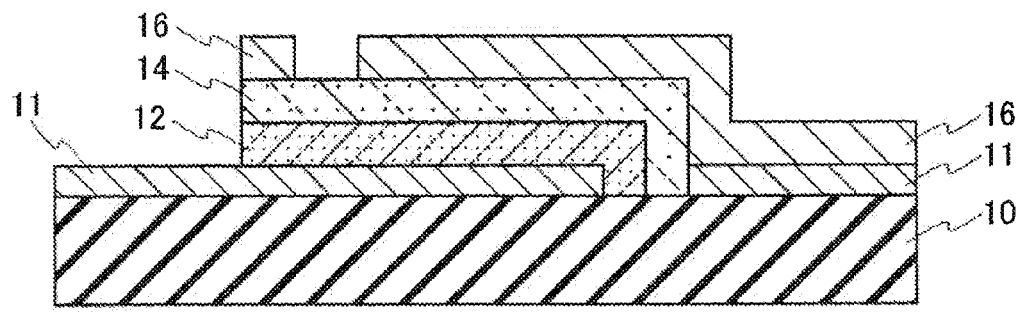
FIG. 53D is a process chart of pattern-forming a second electrode layer on the bulk heterojunction organic active layer, in a process of the fabrication method of the organic thin film photovoltaic device according to the third embodiment.

In a fabrication method of the organic thin film photovoltaic device according to the third embodiment, a process of preparing an ITO substrate on which the transparent electrode layer 11 is formed on the substrate 10 is expressed as shown in FIG. 53A. Moreover, a process of pattern-forming the hole transport layer 12 on the transparent electrode layer 11 after patterning the transparent electrode layer 11 is expressed as shown in FIG. 53B, a process of pattern-forming the bulk heterojunction organic active layer 14 on the hole transport layer 12 is expressed as shown in FIG. 53C, and a process of pattern-forming the second electrode layer 16 on the bulk heterojunction organic active layer 14 is expressed as shown in FIG. 53D.

Figure 54A:
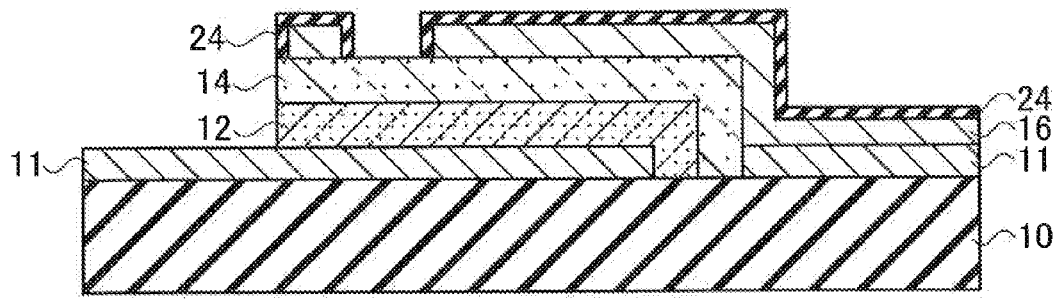
FIG. 54A is a process chart of forming a passive state film (oxide film) on the surface of the second electrode layer, in a process of the fabrication method of an organic thin film photovoltaic device according to the third embodiment.
Figure 54B:
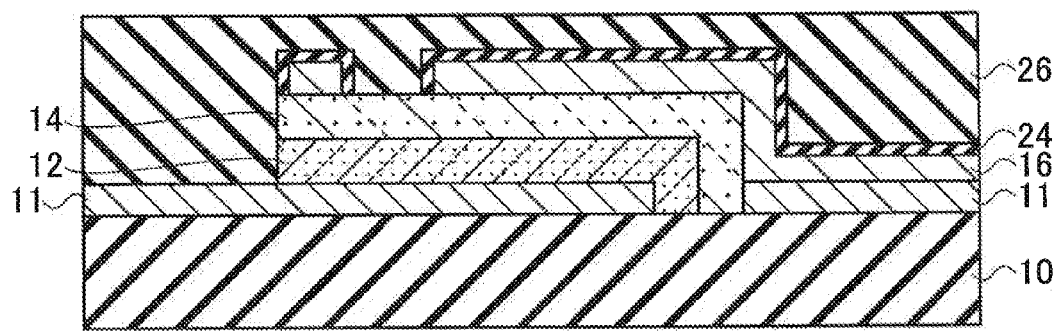
FIG. 54B is a process chart of forming the passivation layer all over the device, in a process of the fabrication method of the organic thin film photovoltaic device according to the third embodiment.
Figure 54C:
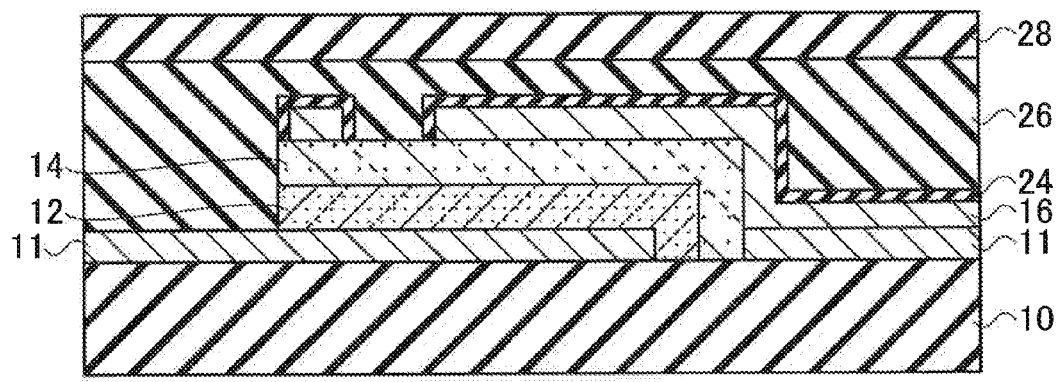
FIG. 54C is a process chart of forming a colored barrier layer on the passivation layer, in a process of the fabrication method of the organic thin film photovoltaic device according to the third embodiment.

Moreover, in the fabrication method of the organic thin film photovoltaic device third according to the embodiment, a process of forming the passive state film (oxide film) 24 on the surface of the second electrode layer 16 is expressed as shown in FIG. 54A, a process of forming the passivation layer 26 the entire surface of the device is expressed as shown in FIG. 54B, and a process of forming the colored bather layer 28 on the passivation layer 26 is expressed as shown in FIG. 54C.

Figure 55A:
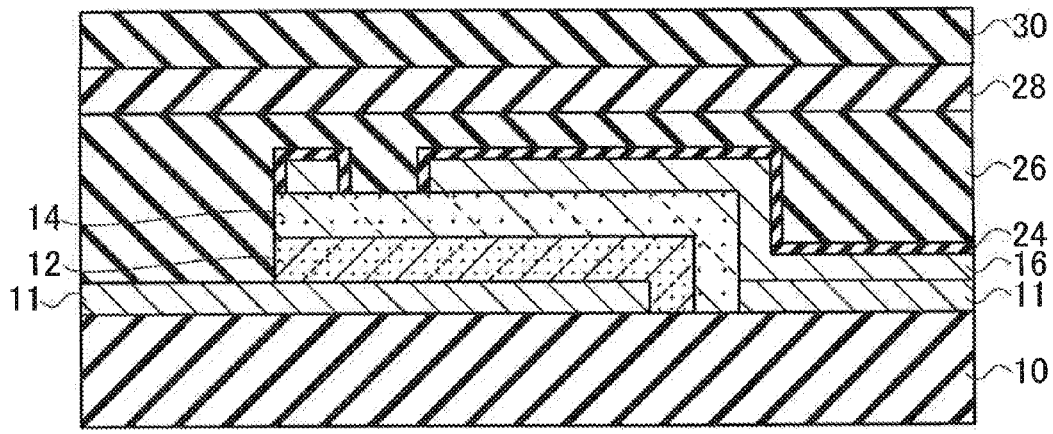
FIG. 55A is a process chart of forming a back sheet passivation layer on the colored barrier layer, in a process of the fabrication method of the organic thin film photovoltaic device according to the third embodiment.
Figure 55B:
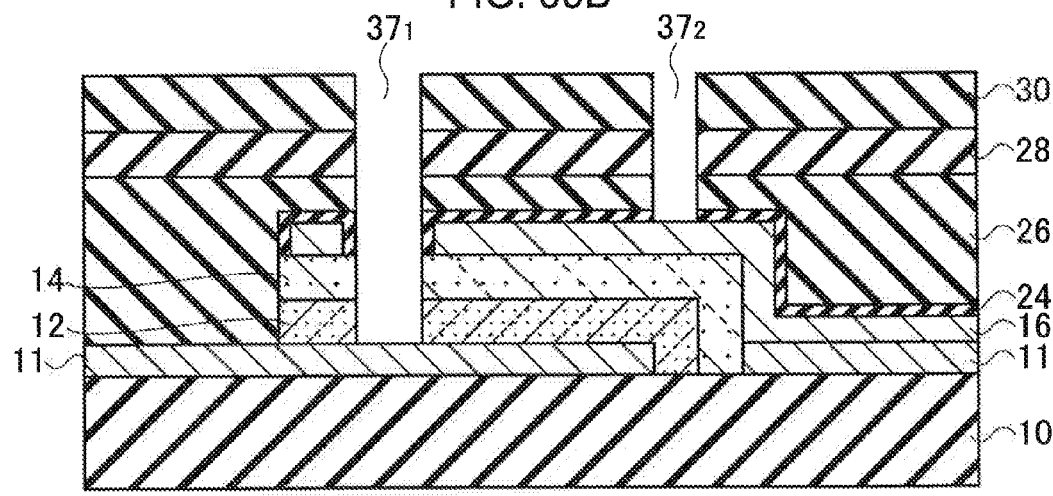
FIG. 55B is a process chart of forming a first via hole configured to pass through the passivation layer, a second electrode layer, the bulk heterojunction organic active layer, and the hole transport layer in a direction perpendicular to the substrate so as to reach a first electrode layer, and forming a second via hole configured to pass through the passivation layer in the direction perpendicular to the substrate so as to reach the second electrode layer, in a process of the fabrication method of the organic thin film photovoltaic device according to the third embodiment.
Figure 55C:
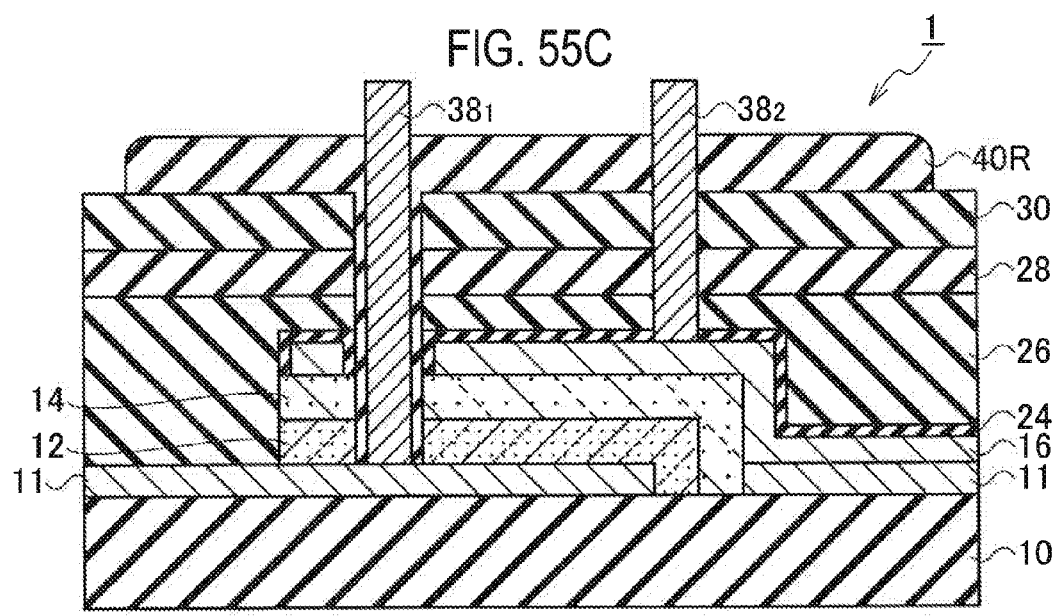
FIG. 55C is a process chart of forming a first extraction terminal electrode connected to first electrode layer in the first via hole, and forming a second extraction terminal electrode connected to the second electrode layer in the second via hole, in a process of the fabrication method of the organic thin film photovoltaic device according to the third embodiment.

FIG. 55A shows a process of forming the back sheet passivation layer 30 on the colored barrier layer 28, in a process of the fabrication method of the organic thin film photovoltaic device according to the third embodiment. FIG. 55B shows a process of forming a first via hole $37_1$ configured to pass through the back sheet passivation layer 30, the colored barrier layer 28, the passivation layer 26, the bulk heterojunction organic active layer 14, and the hole transport layer 12 in a direction perpendicular to the substrate 10 so as to reach a first electrode layer 11, and forming a second via hole $37_2$ configured to pass through the back sheet passivation layer 30, the colored barrier layer 28, and the passivation layer 26 in the direction perpendicular to the substrate 10 so as to reach the second electrode layer 16. FIG. 55C shows a process of forming the first extraction terminal electrode $38_1$ and the second extraction terminal electrode $38_2$ respectively connected to the first electrode layer 11 and the second electrode layer 16 via the first via hole $37_1$ and the second via hole $37_2$.

As shown in FIGS. 53-55 and 1A, the fabrication method of the organic thin film photovoltaic device 1 according to the third embodiment includes: pattern-forming the first electrode layer 11 on the substrate 10; pattern-forming the hole transport layer 12 on the first electrode layer 11; pattern-forming the bulk heterojunction organic active layer 14 on the hole transport layer 12; pattern-forming the second electrode layer 16 on the bulk heterojunction organic active layer 14; forming the passivation layer 26 on the second electrode layer 16; forming the colored barrier layer 28 on the passivation layer 26; and forming the back sheet passivation layer 30 on the colored barrier layer 28.

With reference to FIGS. 53-55, 52A, and 52A, the fabrication method of the organic thin film photovoltaic device according to the third embodiment will now be explained.

(a) Firstly, as shown in FIG. 53A, the transparent electrode layer 11 composed of ITO is pattern-formed on the substrate 10, for example. Wet etching technology, oxygen plasma etching technology, laser patterning technology, nano-imprint technology, etc. are applicable to the patterning of the transparent electrode layer 11.

(b) Next, as shown in FIG. 53B, the hole transport layer 12 is pattern-formed on the patterned transparent electrode layer 11. Spin coating technology, spray technology, screen printing technology, etc. are applicable to the formation of the hole transport layer 12. In this case, in the process for forming the hole transport layer 12, PEDOT:PSS may be formed with spin coating, for example, and annealing may be performed for approximately 10 minutes at 120 degrees C. for the purpose of water removal.

(c) Next, as shown in FIG. 53C, the bulk heterojunction organic active layer 14 used as a power generation layer (photovoltaic layer) is formed on the hole transport layer 12. In the formation process of the bulk heterojunction organic active layer 14, P3HT is formed with spin coating, for example. In the formation of the bulk heterojunction organic active layer 14, after forming the bulk heterojunction organic active layer 14 in film form using ink-jet processing, it is heated at approximately 100-120 degrees C. for approximately 10-30 minutes in order to dry the organic solvent.

(d) Next, as shown in FIG. 53D, the cathode electrode layer 16 is pattern-formed on the bulk heterojunction organic active layer 14. The cathode electrode layer 16 can be formed of a metal layer, e.g. Al, W, Mo, Mn, Mg, etc., for example, with vacuum thermal vapor deposition. Moreover, screen printing technology may be applied thereto.

(e) Next, as shown in FIG. 54A, the oxide film (passive state film) 24 is formed on the surface of the second electrode layer 16. Moreover, the passive state film 24 can be formed by applying oxygen plasma treatment to the second electrode layer 16. Using oxygen plasma, an unnecessary organic layer is removed and them oxide film treatment is applied to a reexposed aluminum surface.

(f) Next, as shown in FIG. 54B, the passivation layer 26 is formed on the second electrode layer 16.

In this case, the passivation layer 26 may be formed of a silicon nitride film, a silicon oxynitride film, etc. with the CVD. The thickness of the silicon nitride film and silicon oxynitride film is approximately 0.5 µm to approximately 1.5 µm, for example. Durability can be further improved by sealing with the SiN film and SiON film formed by using CVD to reduce degradation due to moisture or oxygen in atmospheric air.

(g) Next, as shown in FIG. 54C, the colored barrier layer 28 is formed on the passivation layer 26.

In order to eliminate defects, e.g. a spot etc. of the passivation layer 26 formed with the SiN film, and to smooth the back surface of the module, the UV curing resin material is coated with a spin coat method etc., then is cured by the UV irradiation. Coloring arbitrary to the module is enabled in the thin-layered element structure by using the protection film to which a coloring agent is added for the colored barrier layer 28.

(h) Next, as shown in FIG. 55A, the back sheet passivation layer 30 is formed on the colored barrier layer 28. The back sheet passivation layer 30 may be formed of a silicon nitride film etc. with the CVD. The thickness of the silicon nitride film is approximately 0.5 µm to approximately 1.5 µm, for example. Durability can be further improved by sealing with an SiN film formed by using CVD to reduce degradation due to moisture or oxygen in atmospheric air.

(i) Next, as shown in FIG. 55B, the first via hole $37_1$ configured to pass through the back sheet passivation layer 30, the colored barrier layer 28, the passivation layer 26, the bulk heterojunction organic active layer 14, and the hole transport layer 12 is formed in a direction perpendicular to the substrate 10 so as to reach the first electrode layer 11, and the second via hole $37_2$ configured to pass through the back sheet passivation layer 30, the colored barrier layer 28, and the passivation layer 26 is formed in the direction perpendicular to the substrate 10 so as to reach the second electrode layer 16. The first and second via holes $37_1$, $37_2$ are formed by using mechanical cutting, e.g. laser piercing or laser ablation. The first via hole $37_1$ passing through the back sheet passivation layer 30, the colored barrier layer 28, the passivation layer 26, the bulk heterojunction organic active layer 14, and the hole transport layer 12 required for contact with the first electrode layer 11 can be formed by using a laser beam (of which the wavelength is 532 nm, for example) measuring approximately 5 µm in diameter. Similarly, the second via hole $37_2$ passing through the back sheet passivation layer 30, the colored barrier layer 28, and the passivation layer 26 required for contact with the second electrode layer 16 can be formed by using a laser beam (of which the wavelength is 532 nm, for example) measuring approximately 5 µm in diameter. In addition, a plurality of the first via holes $37_1$ and second via holes $37_2$ may be formed in accordance with each resistance value limited to one piece thereof.

(j) Next, as shown in FIG. 55C, the first extraction terminal electrode $38_1$ connected to the first electrode layer 11 is formed into the first via hole $37_1$, and the second extraction terminal electrode $38_2$ connected to the second electrode layer 16 is formed into the second via hole $37_2$. A carbon paste, an Ag paste, etc. are used for bonding junctions between the first and second extraction terminal electrodes $38_1$, $38_2$, and the first and second electrode layers 11, 16, for example. The first extraction terminal electrode $38_1$ and the second extraction terminal electrode $38_2$ can be formed of a gold wire etc., for example.

(k) Finally, as shown in FIG. 55C, a peripheral part of the first extraction terminal electrode 381 and a peripheral part of the second extraction terminal electrode 382 are protected with a UV curing resin from an intrusion of moisture, oxygen, etc.

Thus, since the first extraction terminal electrode $38_1$ and the second extraction terminal electrode $38_2$ are formed in the direction perpendicular to the substrate 10, contact resistance can be reduced without impairing external appearance, and thereby forming satisfactory bonding.

According to the above-mentioned processes, the organic thin film photovoltaic device 1 according to the third embodiment can be completed.

In accordance with required module durability, a multi-laminated protection film may be formed by repeatedly performing the process of forming the passivation layers 26, e.g. a silicon nitride film (FIG. 54B), and forming the colored barrier layer 28 on the passivation layer 26 (FIG. 54C).

Figure 56A:
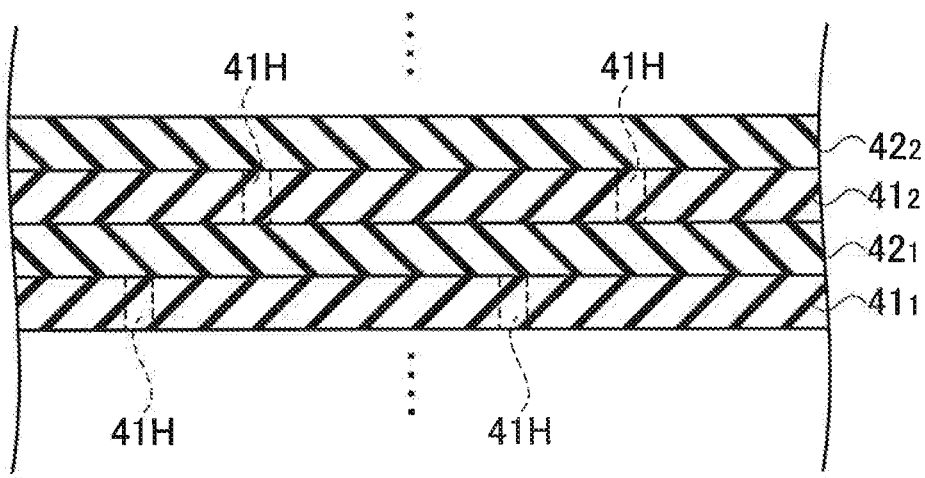
FIG. 56A is a schematic cross-sectional structure diagram for explaining an aspect that a spot formed in the passivation layer is covered with a colored barrier layer, in the organic thin film photovoltaic device according to the third embodiment.
Figure 56B:
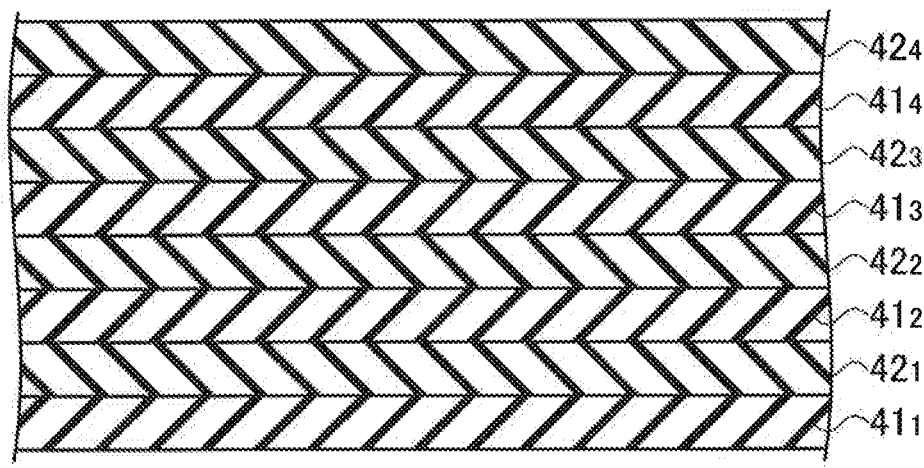
FIG. 56B is a schematic cross-sectional structure diagram of a multi-laminated protection film formed by repeatedly laminating a plurality of the passivation layers and the colored barrier layers, in the organic thin film photovoltaic device according to the third embodiment.

FIG. 56A shows a schematic cross-sectional structure for explaining an aspect that a spot 41H formed in the passivation layers $41_1$, $41_2$ is covered with a colored barrier layers $42_1$, $42_2$, in the organic thin film photovoltaic device according to the third embodiment. FIG. 56B shows a schematic cross-sectional structure of a multi-laminated protection film formed by repeatedly laminating a plurality of the passivation layers $41_1$, $41_2$, $41_3$, $41_4$ and the colored barrier layers $42_1$, $42_2$, $42_3$, $42_4$, in the organic thin film photovoltaic device according to the third embodiment.

Moreover, an aperture of the cell is arbitrarily patterned with an ink-jet process etc. Moreover, arbitrary patterning can also be realized with respect to the colored barrier layer 28 (resin protective film) to which dye is added by using the ink-jet process etc. In this case, the aperture of the cell corresponds to the display area 2 or the formation area 6 of literal characters (refer to FIGS. 70-73), for example.

(Configuration of Plural Cells Disposed in Series)

Figure 57A:
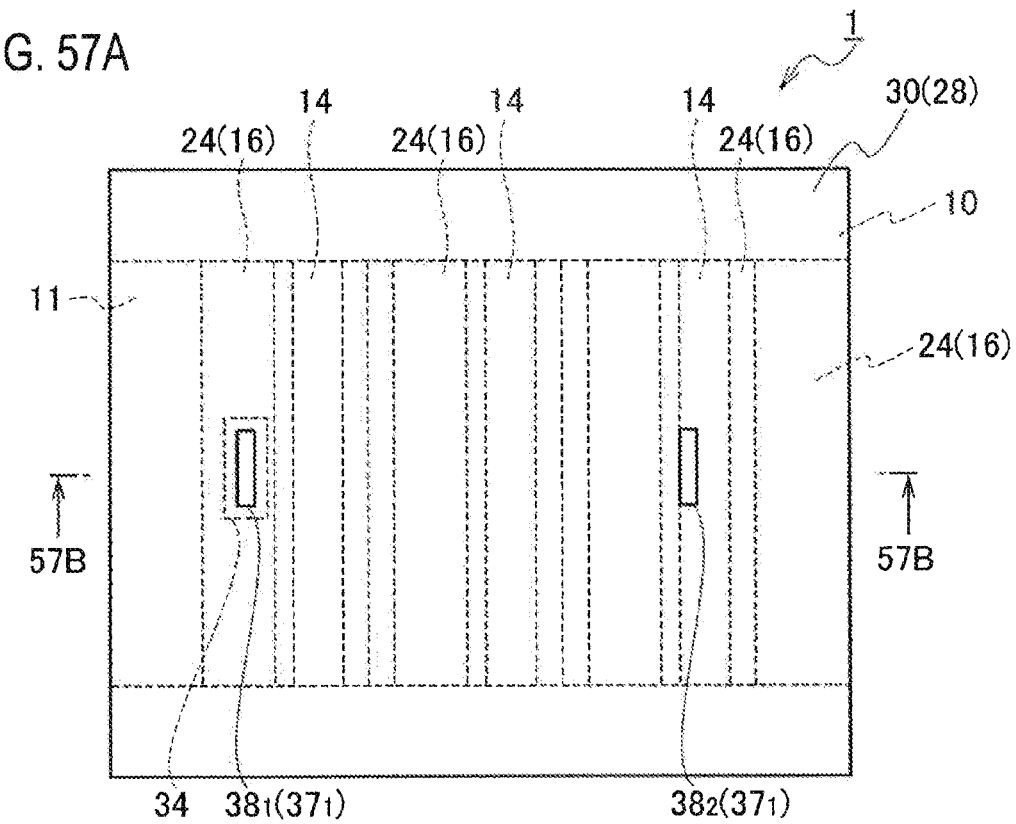
FIG. 57A is a schematic planar pattern configuration diagram of a plurality (three pieces, as an example in drawings) of the organic thin film photovoltaic devices according to the embodiment disposed in series.
Figure 57B:
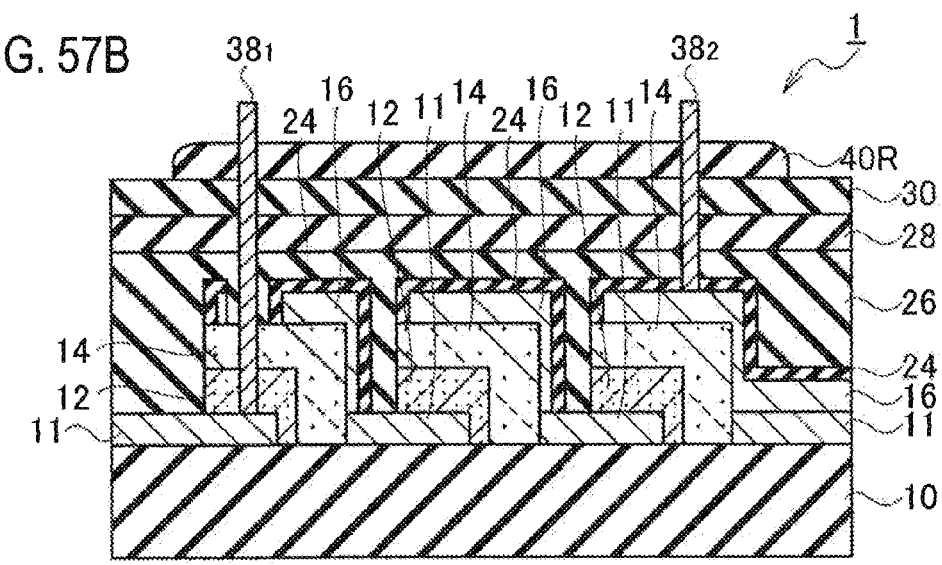
FIG. 57B is a schematic cross-sectional structure diagram taken in the line 57B-57B of FIG. 57A.
Figure 57C:
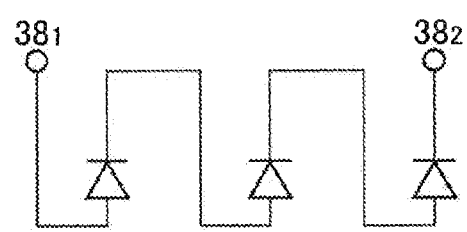
FIG. 57C shows a circuit representation corresponding to that shown in FIGS. 57A and 57B.

FIG. 57A shows a schematic planar pattern configuration of a plurality (three pieces, as an example in drawings) of the organic thin film photovoltaic devices 1 according to the third embodiment disposed in series. A schematic cross-sectional structure taken in the line 57B-57B of FIG. 57A is expressed as shown in FIG. 57B, and a circuit representation corresponding to FIGS. 57A and 57B is expressed as shown in FIG. 57C.

(Fabrication Method)

There will now be explained the fabrication method of a plurality (three pieces, as an example in FIG. 43) of the organic thin film photovoltaic devices disposed in series according to the third embodiment.

A schematic planar pattern configuration of a state where the transparent electrode layer 11 is formed on the substrate 10 is shown similarly to FIG. 19A, in a process of the fabrication method of the organic thin film photovoltaic device according to the third embodiment. A schematic cross-sectional structure taken in the line 19B-19B FIG. 19A is shown similarly to FIG. 19B.

Moreover, a schematic planar pattern configuration showing a state where the hole transport layer 12 is formed as a film on the transparent electrode layer 11 is shown similarly to FIG. 20A, and a schematic cross-sectional structure taken in the line 20B-20B of FIG. 20A is similarly shown as FIG. 20B.

Moreover, a schematic planar pattern configuration showing a state where the bulk heterojunction organic active layer 14 is formed as a film on the hole transport layer 12 is shown similarly to FIG. 21A, and a schematic cross-sectional structure taken in the line 21B-21B of FIG. 21A is shown similarly to FIG. 21B.

Figure 58A:
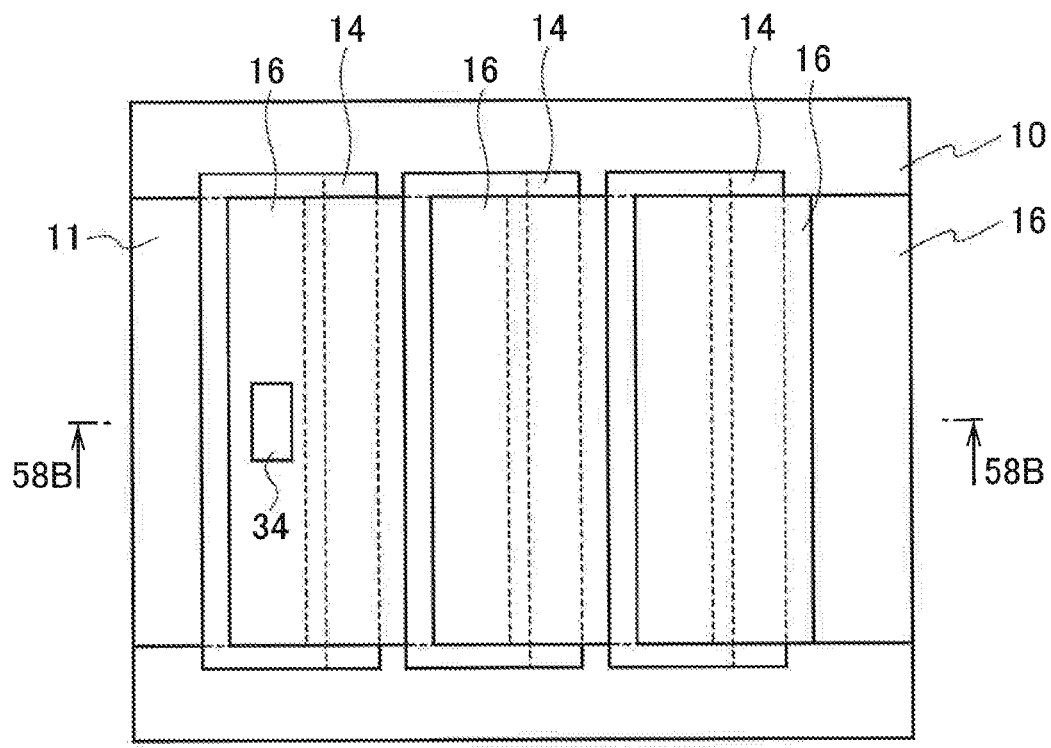
FIG. 58A is a schematic planar pattern configuration diagram showing a state where the second electrode layer is pattern-formed on the bulk heterojunction organic active layer, in a process of the fabrication method of the organic thin film photovoltaic device according to the third embodiment.
Figure 58B:
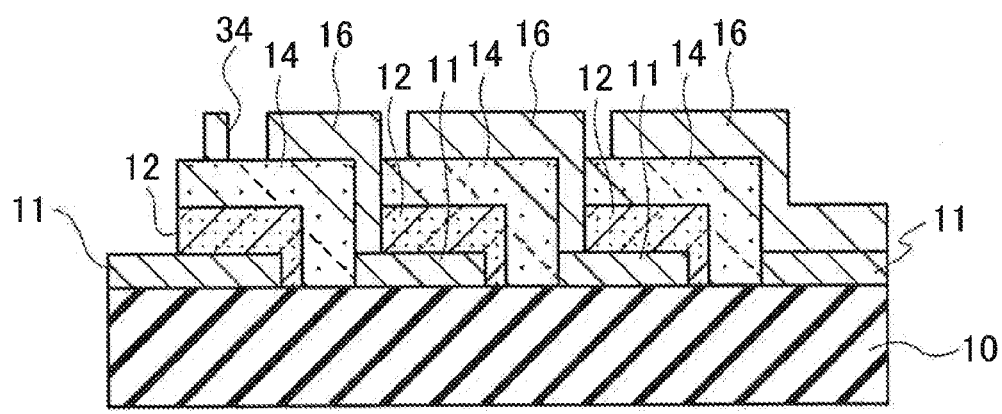
FIG. 58B is a schematic cross-sectional structure diagram taken in the line 58B-58B of FIG. 58A, in a process of the fabrication method of the organic thin film photovoltaic device according to the third embodiment.

Moreover, a schematic planar pattern configuration showing a state where the second electrode layer 16 is formed on the bulk heterojunction organic active layer 14 is expressed as shown in FIG. 58A, and a schematic cross-sectional structure taken in the line 58B-58B of FIG. 58A is expressed as shown in FIG. 58B.

Figure 59A:
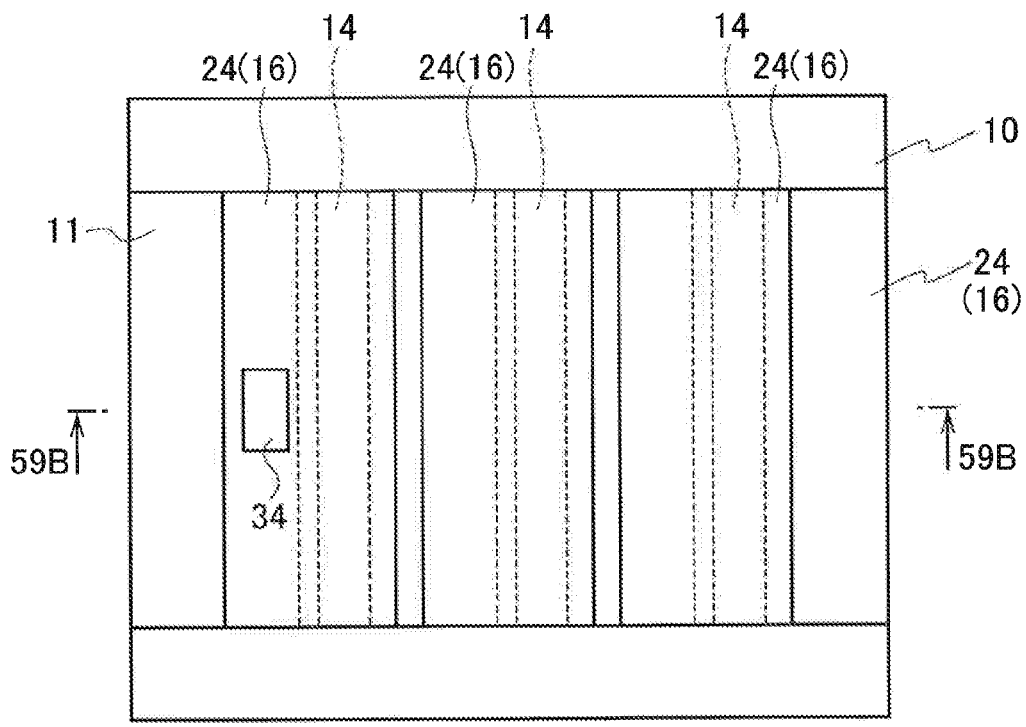
FIG. 59A is a schematic planar pattern configuration diagram showing a state where an unnecessary organic layer is etched by using oxygen plasma treatment, and an oxide layer is formed on the surface of the second electrode layer, in a process of the fabrication method of the organic thin film photovoltaic device according to the third embodiment.
Figure 59B:
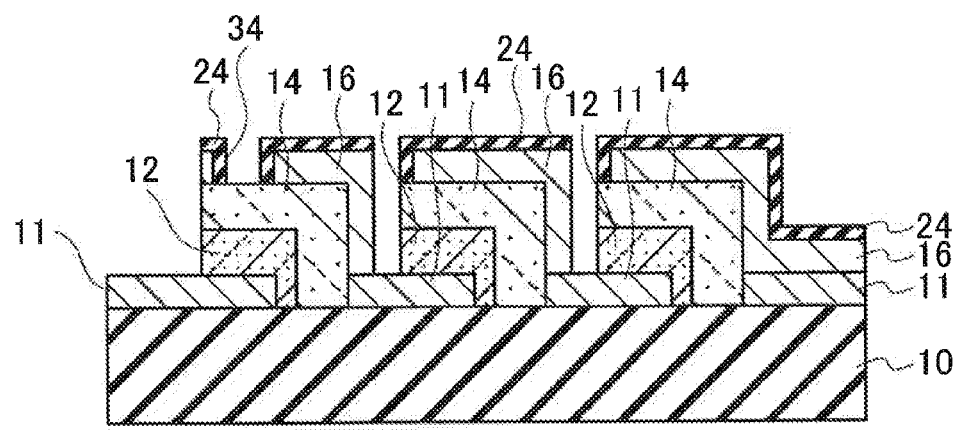
FIG. 59B is a schematic cross-sectional structure diagram taken in the line 59B-59B of FIG. 59A, in a process of the fabrication method of the organic thin film photovoltaic device according to the third embodiment.

Moreover, FIG. 59A shows a schematic planar pattern configuration of a state where an unnecessary organic layer of the hole transport layer 12 and the bulk heterojunction organic active layer 14 is etched by using oxygen plasma treatment, and the passive state film (oxide film) 24 is formed on the surface of the second electrode layer 16. A schematic cross-sectional structure taken in the line 59B-59B of FIG. 59A is expressed as shown in FIG. 59B.

Figure 60A:
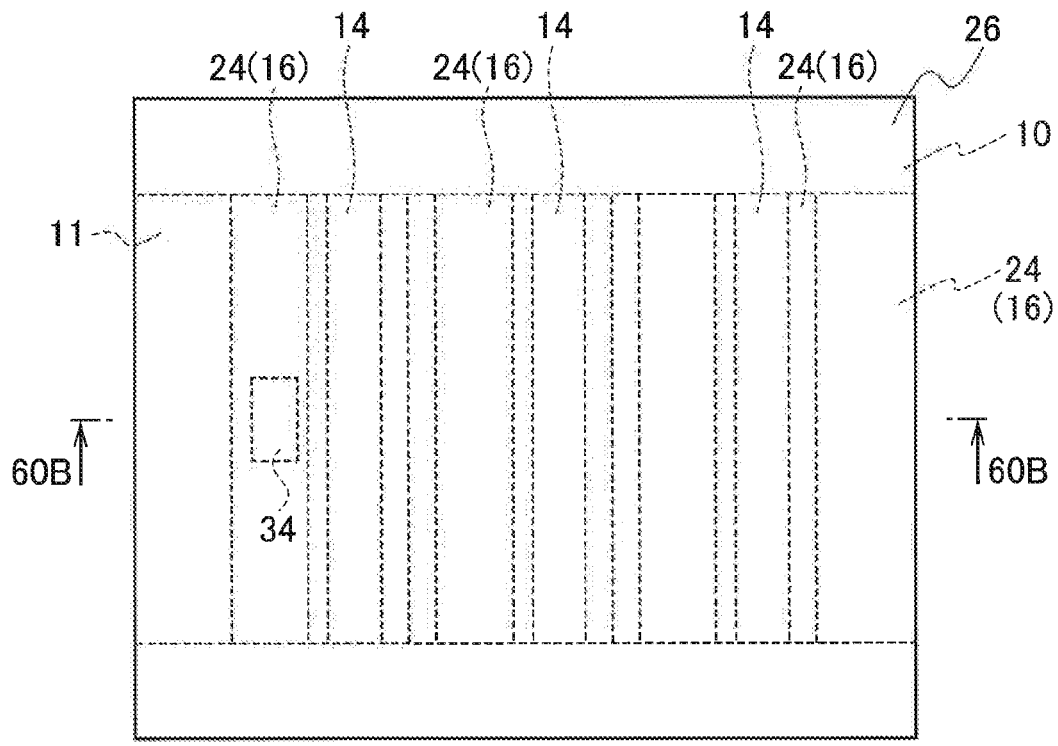
FIG. 60A is a schematic planar pattern configuration diagram showing a state where the passivation layer is formed all over the device, in a process of the fabricating process of the organic thin film photovoltaic device according to the third embodiment.
Figure 60B:
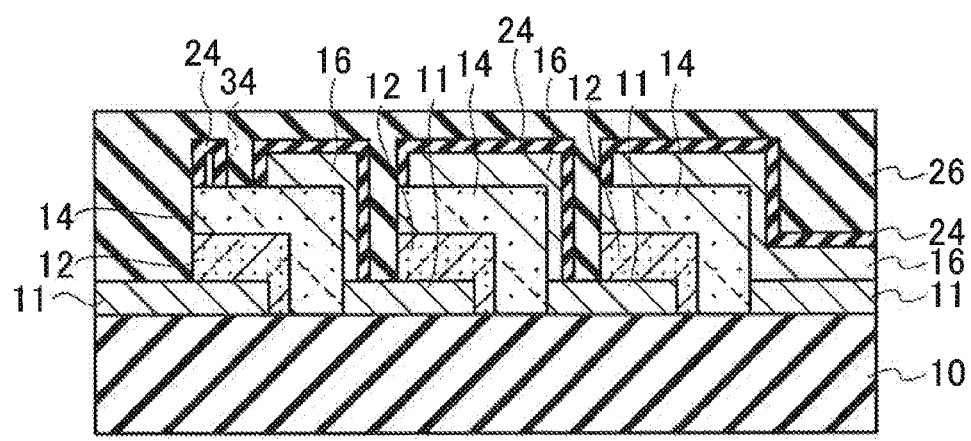
FIG. 60B is a schematic cross-sectional structure diagram taken in the line 60B-60B of FIG. 60A, in a process of the fabrication method of the organic thin film photovoltaic device according to the third embodiment.

Moreover, a schematic planar pattern configuration showing a state where the passivation layer 26 is formed on the entire surface of the device is expressed as shown in FIG. 60A, and a schematic cross-sectional structure taken in the line 60B-60B of FIG. 60A is expressed as shown in FIG. 60B.

Figure 61A:
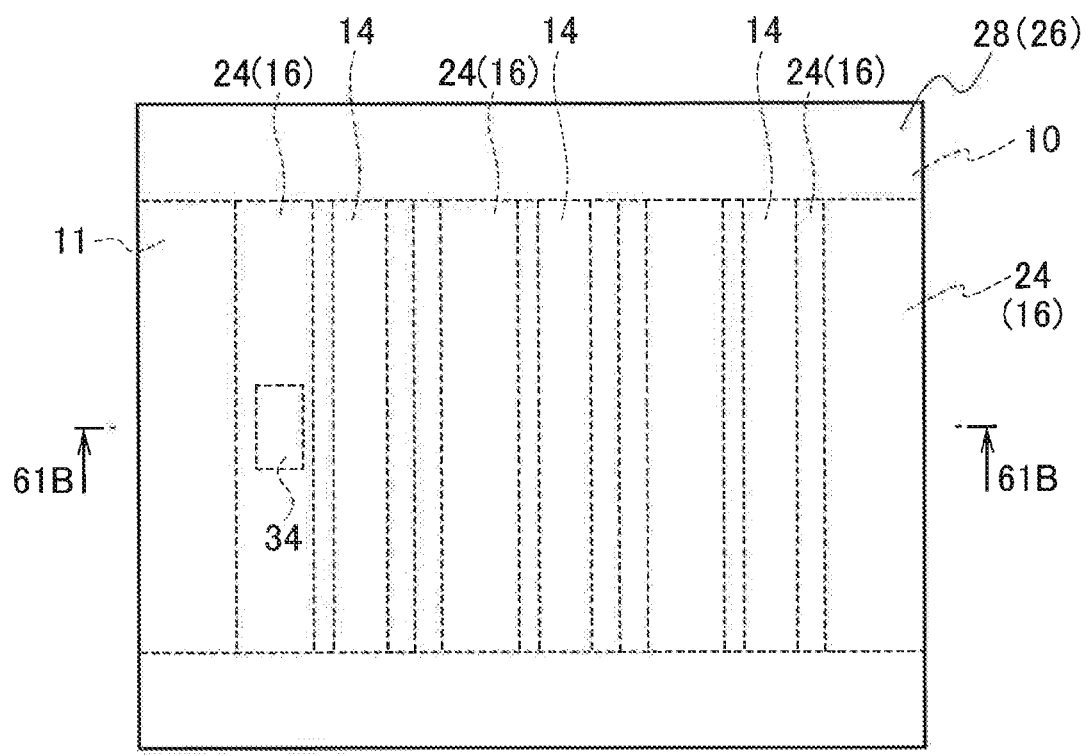
Figure 61B:
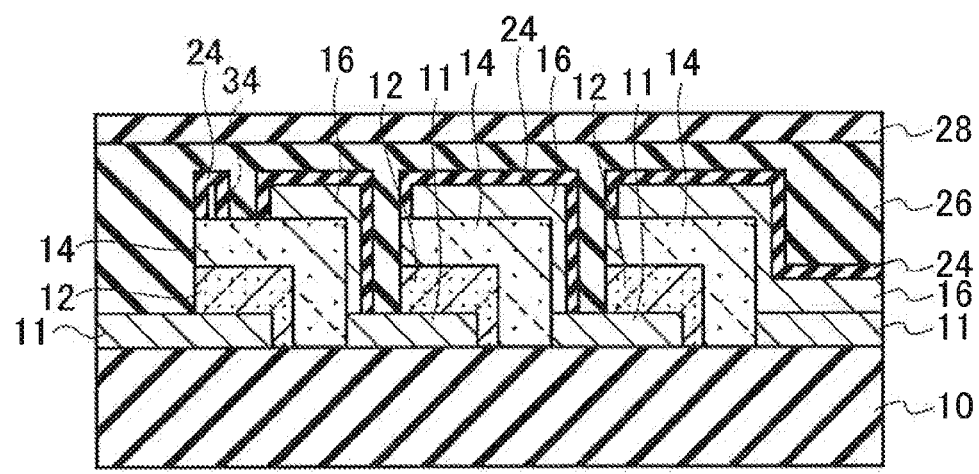

Moreover, a schematic planar pattern configuration showing a state where the colored barrier layer 28 is formed on the passivation layer 26 is expressed as shown in FIG. 61A, and a schematic cross-sectional structure taken in the line 61B-61B of FIG. 61A is expressed as shown in FIG. 61B.

Figure 62A:
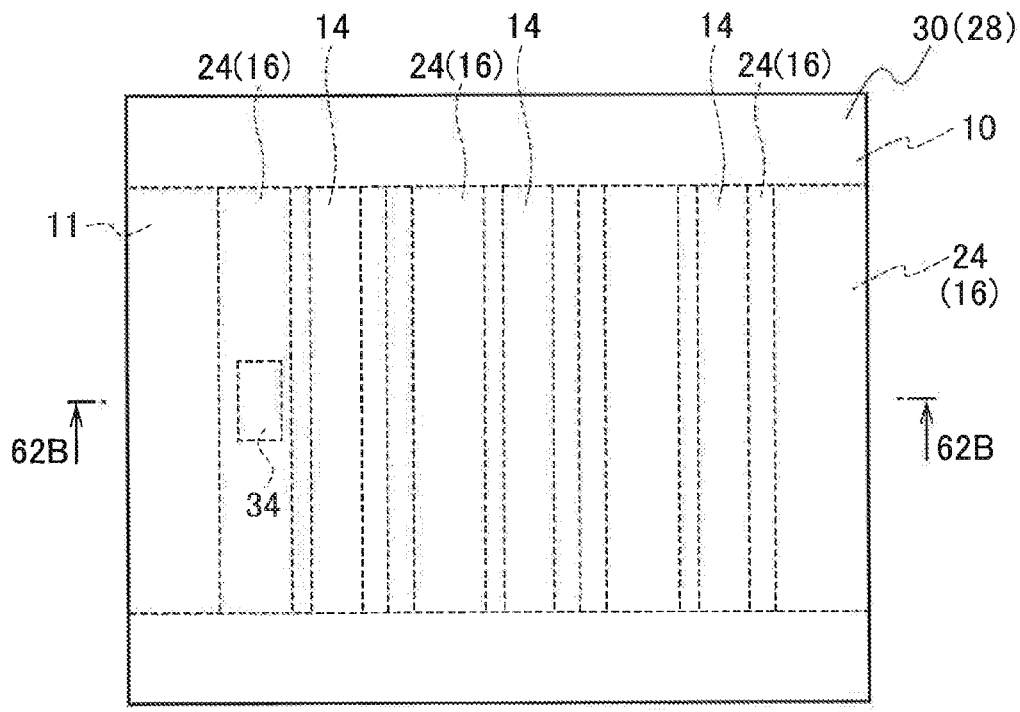
Figure 62B:
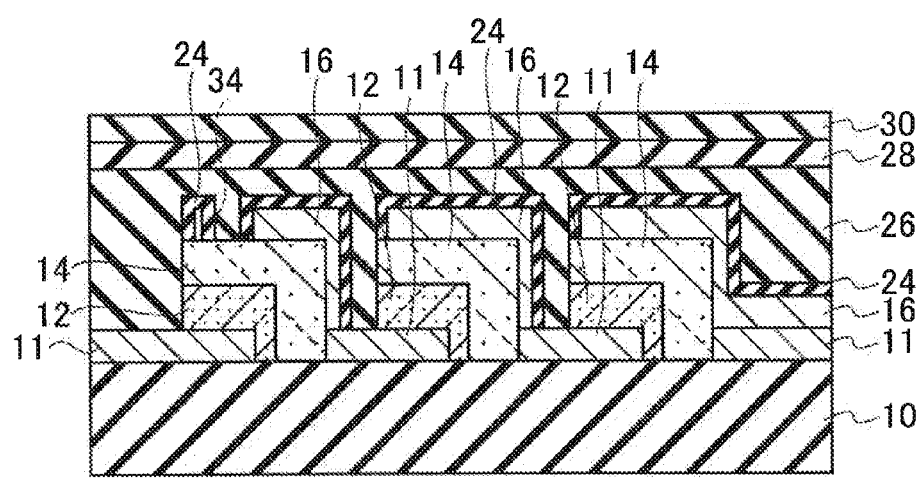

Moreover, a schematic planar pattern configuration showing a state where the back sheet passivation layer 30 is formed on the colored barrier layer 28 is expressed as shown in FIG. 62A, and a schematic cross-sectional structure taken in the line 62B-62B of FIG. 62A is expressed as shown in FIG. 62B.

Figure 63A:
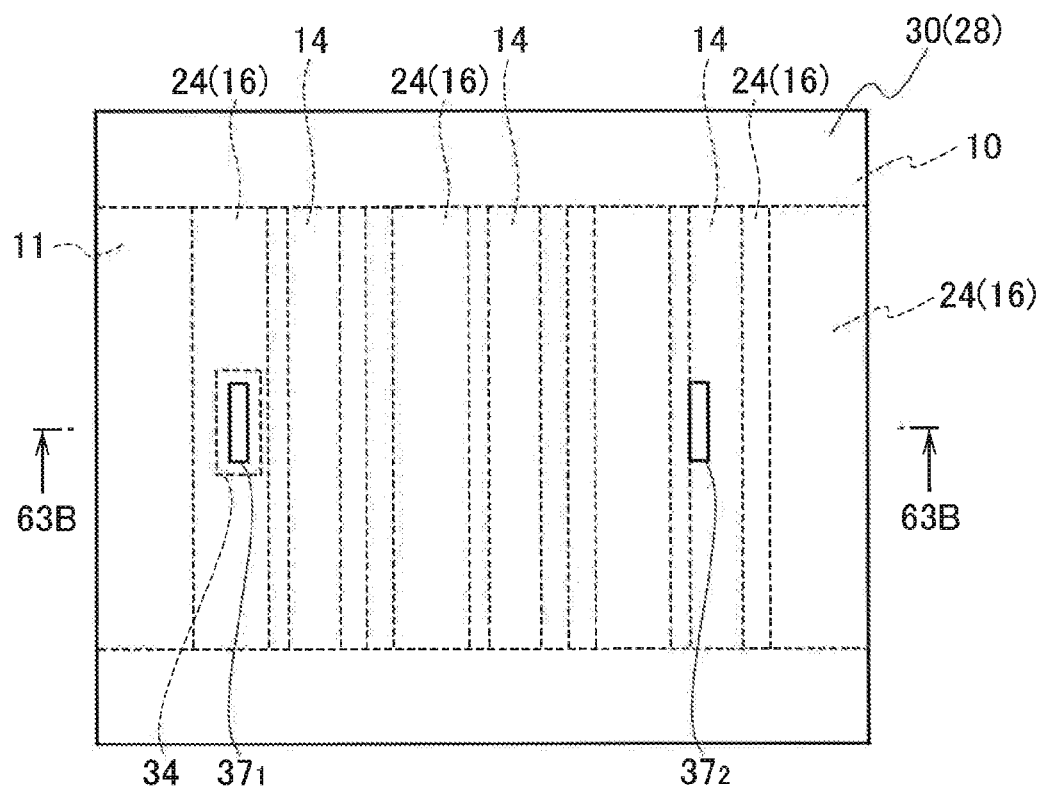
Figure 63B:
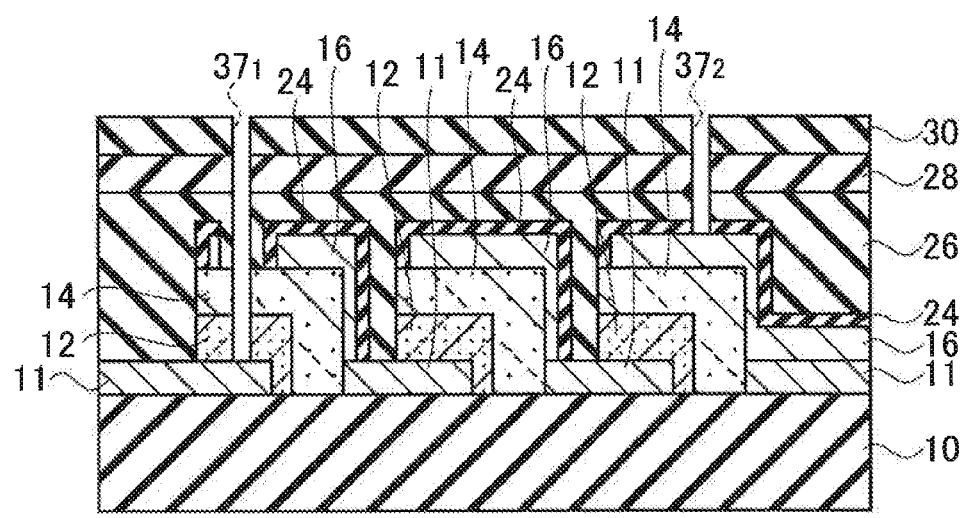

Moreover, a schematic planar pattern configuration showing a state where the first via hole $37_1$ and the second via hole $37_2$ are formed is expressed as shown in FIG. 63A, and a schematic cross-sectional structure taken in the line 63B-63B of FIG. 63A is expressed as shown in FIG. 63B.

With reference to FIGS. 19-21 and 58-63, there will now be explained the fabrication method of a plurality (three pieces, as an example in drawings) of the organic thin film photovoltaic devices disposed in series according to the embodiment.

(a) Firstly, a glass substrate (of which the size is, for example, 50 mm in length×50 mm in width×10.4 mm in thickness) washed by pure water, acetone and ethanol is inserted into an Inductively Coupled Plasma (ICP) etcher, and adherents on the surface of the glass substrate are removed by $O_2$ plasma (Glass Substrate Surface Treatment). In order to guide the light to the organic active layer efficiently, an antireflection process may be performed to the glass surface of the substrate 10 formed of a glass substrate.

(b) Next, the transparent electrode layer 11 composed of ITO, for example, is formed on the glass substrate 10 in the same manner as FIGS. 19A and 19B. A plurality of the transparent electrode layers 11 are formed in a stripe pattern so as to sandwich a trench region, in the same manner as FIGS. 19A and 19B. Oxygen plasma etching technology, laser patterning technology, nano-imprint technology, etc. can be applied to the formation of the trench region.

(c) Next, the hole transport layer 12 is formed on each transparent electrode layer 11 in the same manner as FIGS. 20A and 20B. Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees C. for the purpose of water removal. Oxygen plasma etching technology, laser patterning technology, nano-imprint technology, etc. can be applied to the formation of the trench region.

(d) Next, the bulk heterojunction organic active layer 14 is formed on each hole transport layer 12 in the same manner as FIGS. 21A and 21B. In the formation process of the bulk heterojunction organic active layer 14, film formation is performed with spin coating of P3HT, for example.

(e) Next, as shown in FIGS. 58A and 58B, the cathode electrode layer 16 is pattern-formed on each bulk heterojunction organic active layer 14. The cathode electrode layer 16 is formed by depositing a metal layer (e.g., Al, W, Mo, Mg) by vacuum thermal vapor deposition, for example. Screen printing technology instead of the vacuum thermal vapor deposition may be applied to the formation of the cathode electrode layer 16. As shown in FIGS. 58A and 58B, an aperture is formed in the cathode electrode layer 16, and then the through hole 34 is formed thereinto.

(f) Next, as shown in FIGS. 59A and 59B, the oxide film (passive state film) 24 is formed on the surface of the cathode electrode layer 16, after the etching process with respect to the bulk heterojunction organic active layer 14 and the hole transport layer 12. Each cell can be separated by performing the etching process of the bulk heterojunction organic active layer 14 and the hole transport layer 12. Moreover, the passive state film 24 can be formed by applying oxygen plasma treatment to the second electrode layer 16. The passive state film 24 can be formed using a high-density plasma etching apparatus, for example. By performing the oxygen plasma treatment of the second electrode layer 16, the bulk heterojunction organic active layer 14 and the hole transport layer 12 can also be etched, in tandem with the forming of the passive state film 24.

(g) Next, as shown in FIGS. 60A and 60B, the passivation layer 26 is formed on the entire surface of the device. In this case, the passivation layer 26 may be formed of a silicon nitride film etc. with the CVD. The thickness of the silicon nitride film is approximately 0.5 μm to approximately 1.5

μm, for example. Durability can be further improved by sealing with an SiN film formed by using CVD to reduce degradation due to moisture or oxygen in atmospheric air.

(h) Next, as shown in FIGS. 61A and 61B, the colored bather layer 28 is formed on the passivation layer 26. In order to eliminate defects, e.g. a spot etc. of the passivation layer 26 formed with the SiN film, and to smooth the back surface of the module, the UV curing resin material is coated with a spin coat method etc., then is cured by the UV irradiation. Coloring arbitrary to the module is enabled in the thin-layered element structure by using the protection film to which a coloring agent is added for the colored barrier layer 28.

(i) Next, as shown in FIGS. 62A and 62B, the back sheet passivation layer 30 is formed on the colored barrier layer 28. The back sheet passivation layer 30 may be formed of a silicon nitride film etc. with the CVD. The thickness of the silicon nitride film is approximately 0.5 μm to approximately 1.5 μm, for example. Durability can be further improved by sealing with the SiN film formed by using CVD to reduce degradation due to moisture or oxygen in atmospheric air.

(i) Next, as shown in FIGS. 63A and 63B, the first via hole $37_1$ configured to pass through the back sheet passivation layer 30, the colored barrier layer 28, the passivation layer 26, the bulk heterojunction organic active layer 14, and the hole transport layer 12 is formed in a direction perpendicular to the substrate 10 so as to reach the first electrode layer 11, and the second via hole $37_2$ configured to pass through the back sheet passivation layer 30, the colored barrier layer 28, and the passivation layer 26 is formed in the direction perpendicular to the substrate 10 so as to reach the second electrode layer 16. The first and second via holes $37_1$, $37_2$ are formed by using mechanical cutting, e.g. laser piercing or laser ablation. The first via hole $37_1$ can be formed by using a laser beam (of which the wavelength is 532 nm, for example) measuring approximately 5 μm in diameter. Similarly, the second via hole $37_2$ can also be formed by using a laser beam (of which the wavelength is 532 nm, for example) measuring approximately 5 μm in diameter. In addition, a plurality of the first via holes $37_1$ and second via holes $37_2$ may be formed in accordance with each resistance value limited to one piece thereof.

(k) Next, as shown in FIGS. 57A and 57B, the first extraction terminal electrode $38_1$ connected to the first electrode layer 11 is formed into the first via hole $37_1$, and the second extraction terminal electrode $38_2$ connected to the second electrode layer 16 is formed into the second via hole $37_2$. A carbon paste, an Ag paste, etc. are used for bonding junctions between the first and second extraction terminal electrodes $38_1$, $38_2$, and the first and second electrode layers 11, 16, for example. The first extraction terminal electrode $38_1$ and the second extraction terminal electrode $38_2$ can be formed of a gold wire etc., for example.

(l) Finally, as shown in FIGS. 57A and 57B, a neighborhood of the first extraction terminal electrode $38_1$ and the second extraction terminal electrode $38_2$ is protected with a UV curing resin from an intrusion of moisture, oxygen, etc.

Thus, since the first extraction terminal electrode $38_1$ and the second extraction terminal electrode $38_2$ are formed in the direction perpendicular to the substrate 10, contact resistance can be reduced without impairing external appearance, and thereby forming satisfactory bonding.

According to the above-mentioned processes, the plurality (three pieces, as an example in FIG. 43) of the organic thin film photovoltaic devices disposed in series according to the third embodiment is completed.

(Producing Steps of Organic Thin Film Photovoltaic Device)

Figure 64:
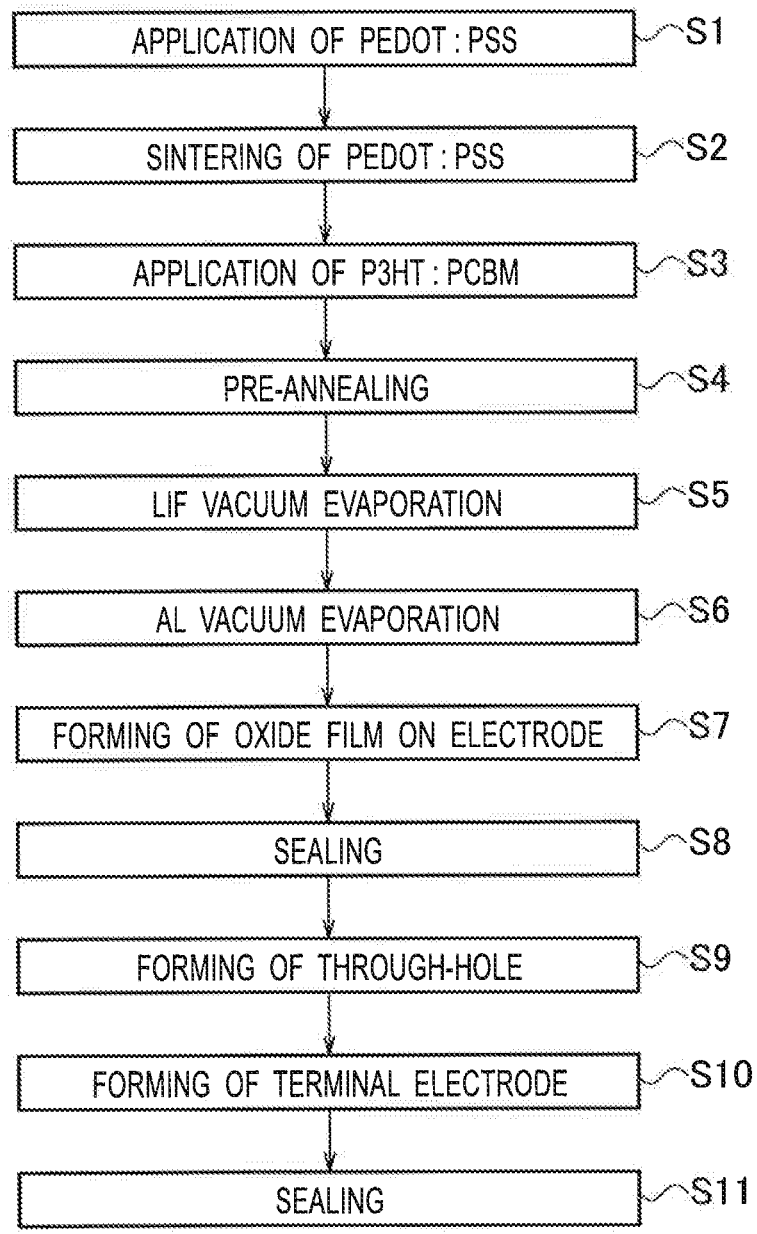

In accordance with the flow chart shown in FIG. 64, there will now be explained producing steps of the organic thin film photovoltaic device 1 according to the third embodiment.

(a) In Step S1, PEDOT:PSS is coated on the substrate 10. For example, PEDOT:PSS aqueous solution is filtered with a 0.45-μm PTFE membrane filter to remove undissolved matters and impurities, and then the PEDOT:PSS aqueous solution is coated on the ITO substrate 10 with spin coating (for example, 4000 rpm for 30 sec).

(b) The PEDOT:PSS is sintered in Step S2. That is, heat-treatment is performed at 120 degrees C. for 10 minutes for the purpose of water removal, after the film formation. In addition, it is effective to cover a petri dish previously heated by a hot plate so that the heat may be transferred to whole of the substrate 10.

(c) P3HT:PCBM is coated on the substrate 10 in Step S3. Specifically, P3HT 16 mg and PCBM 16 mg are dissolved in dichlorobenzene (o-dichlorobenzene), for example. The solution is subjected to ultrasonic treatment for 1 minute at 50 degrees C., after agitating at 50 degrees C. under nitrogen atmosphere for a night. Spin coating of the solution is performed on the ITO substrate 10 subjected to washing treatment in a glove box replaced with nitrogen (<1 ppm$O_2$, $H_2O$). A rotational frequency of the spin coating is 2000 rpm per 1 sec after 550 rpm per 60 sec.

(d) Pre-annealing is performed in Step S4. That is, heating processing is performed for 10 minutes at 120 degrees C. after the coating of Step S3. In addition, it is effective to cover a petri dish previously heated by a hot plate so that the heat may be transferred to whole of the substrate 10.

(e) LiF vacuum evaporation is performed in Step S5. Specifically, as for LiF (purity: 99.98%), vacuum thermal evaporation is performed with the vacuum degree: $1.1 \times 10^{-6}$ torr and the vacuum evaporation rate: 0.1 angstrom/sec.

(f) In Step S6, Al vacuum evaporation is performed, thereby forming the second electrode layer 16. Specifically, as for Al (purity: 99.999%), vacuum thermal evaporation is performed with the vacuum degree: $1.1 \times 10^{-6}$ torr and the vacuum evaporation rate: more than 2 angstroms/sec.

(g) An oxide film is formed on the second electrode layer 16 in Step S7. Specifically, the surface of the second electrode layer 16 is oxidized with oxygen plasma by using a high-density plasma etching apparatus, thereby forming the oxide film 24.

(h) Sealing is performed in Step S8. Specifically, the passivation layer 26, the colored barrier layer 28, and the back sheet passivation layer 30 are formed to be laminated one after another on the whole device, and thereby the elements are sealed.

(i) The via hole is formed in Step S9. Specifically, the first via hole $37_1$ and the second via hole $37_2$ which are respectively contact holes for contacting the first electrode layer 11 and the second electrode layer 16 are formed using mechanical cutting, e.g. laser piercing or laser ablation.

(j) The terminal electrode is formed in Step S10. Specifically, the first extraction terminal electrode $38_1$ and the second extraction terminal electrode $38_2$, and the first electrode layer 11 and the second electrode layer 16 are respectively connected to each other via the first via hole $37_1$ and the second via hole $37_2$ using bonding junction. The first extraction terminal electrode $38_1$ and the second extraction terminal electrode $38_2$ can be formed with a gold wire etc. A carbon paste, an Ag paste, etc. are used for a bonding junction portion between the first extraction terminal electrode $38_1$ and the first electrode layer 11, and a bonding junction portion between the second extraction terminal electrode $38_2$ and the second electrode layer 16.

(k) Sealing is performed in Step S11. Specifically, a peripheral part of the first extraction terminal electrode $38_1$ and a peripheral part of the second extraction terminal electrode $38_2$ are protected with a resin layer 40R, e.g. UV curing resin, from an intrusion of moisture, oxygen, etc.

(Mass Production Process)

The organic thin film photovoltaic device according to the third embodiment can also be fabricated with a mass production process by disposing a plurality of cells in a matrix shape, in the same manner as the first embodiment (FIGS. 32-36).

(a) Firstly, a glass substrate 10 washed by pure water, acetone and ethanol are inserted into an ICP etcher, and adherents on the surface of the glass substrate are removed by $O_2$ plasma (Glass Substrate Surface Treatment). In addition, an antireflection process may be applied on the surface of the glass substrate 10 in order to efficiently guide light to the organic active layer.

(b) Next, the transparent electrode layer 11 composed of ITO, for example, is formed on the substrate 10 in the same manner as FIG. 32. In an example shown in FIG. 32, a plurality of the transparent electrode layers 11 are formed in a stripe pattern so as to sandwich a gap. Oxygen plasma etching technology, laser patterning technology, nano-imprint technology, etc. can be applied to the formation of the gap.

(c) Next, the hole transport layer 12 is formed on the substrate 10 and the transparent electrode layer 11, in the same manner as FIG. 33. Spin coating technology, spray technology, screen printing technology, etc. can be applied to the formation of the hole transport layer 12. In this case, in the process for forming the hole transport layer 12, the film formation is performed, for example, by spin coating of PEDOT:PSS, and annealing is applied thereto for approximately 10 minutes at 120 degrees C. for the purpose of water removal.

(d) Next, the bulk heterojunction organic active layer 14 is formed on the hole transport layer 12, in the same manner as FIG. 34. In the formation process of the bulk heterojunction organic active layer 14, film formation is performed with spin coating of P3HT:PCBM, for example. The thickness of the bulk heterojunction organic active layer 14 is approximately 100 m to approximately 200 m, for example.

(e) Next, the cathode electrode layers 16 in two-stripes pattern are formed so as to be orthogonal to the transparent electrode layer 11 on the bulk heterojunction organic active layer 14, in the same manner as FIG. 35.

The cathode electrode layer 16 is formed by depositing Al, W, Mo, Mg, etc., for example, by vacuum thermal vapor deposition. Screen printing technology instead of the vacuum thermal vapor deposition may be applied to the formation of the cathode electrode layer 16.

(f) Next, an oxide film (passive state film) not illustrated is formed on the surface of the cathode electrode layer 16. The passive state film can be formed by exposing the cathode electrode layer 16 to oxygen plasma. The oxide film with the oxygen plasma can be formed using a plasma etching apparatus, for example.

(g) Next, although illustration is omitted, the passivation layer 26, the colored barrier layer 28, and the back sheet passivation layer 30 are laminated on the whole of the device one after another, and then the first via hole $37_1$ and the second via hole $37_2$ are formed. Then, the first extraction terminal electrode $38_1$ and the second extraction terminal electrode $38_2$, and the first electrode layer 11 and the second electrode layer 16 are respectively connected to each other via the first via hole $37_1$ and the second via hole $37_2$ using bonding junction. Finally, a peripheral part of the first extraction terminal electrode $38_1$ and a peripheral part of the second extraction terminal electrode $38_2$ are protected with a resin layer 40R, e.g. UV curing resin, from an intrusion of moisture, oxygen, etc.

According to the above-mentioned processes, the organic thin film photovoltaic device 1 according to the embodiment can be mass-produced.

In the organic thin film photovoltaic device according to the third embodiment, an example of a schematic planar pattern configuration to dispose a plurality of cells $C_{ij}$ in a matrix shape is expressed as shown similarly to FIG. 36. The cells $C_{ij}$, . . . are disposed at intersections between the anode electrode patterns . . . , $A_j$, $A_{j+1}$, . . . formed of the anode electrode layer 11, and the cathode electrode patterns . . . , $K_{i-1}$, $K_i$, $K_{i+1}$, . . . formed of the cathode electrode layer 16 to intersect perpendicularly with the anode electrode patterns . . . , $A_j$, $A_{j+1}$, . . . . The characteristics of each cell $C_{ij}$, . . . disposed on the intersections can also be measured independently by selecting the anode electrode pattern . . . , $A_j$, $A_{j+1}$, . . . and the cathode electrode pattern . . . , $K_{i-1}$, $K_i$, $K_{i+1}$, . . . .

(Spin Coat Method)

A schematic showing a spin coat method at the time of forming the hole transport layer 12 and the bulk heterojunction organic active layer 14, in the fabrication method of the organic thin film photovoltaic device according to the third embodiment is shown similarly to FIG. 37. A schematic birds-eye view configuration showing an example of the formed hole transport layer 12 and the bulk heterojunction organic active layer 14 is shown similarly to FIG. 37B.

For example, if a relative small-area element is created, a spin coat method as shown similarly to FIG. 37A can be applied, in the organic thin film photovoltaic device 1 according to the third embodiment.

More specifically, a spin coater including a high-speed rotating spindle 62 connected to driving source, e.g. a motor, and a table fixed to the spindle 62, wherein the substrate 10 is mounted on the table is used therefor, as shown similarly to FIG. 37A.

Then, the driving source, e.g. a motor, is worked after the substrate 10 is mounted on the table 63, and then the table 63 is rotated at a high speed, e.g., 2000-4000 rpm, in arrows A, B direction. Subsequently, a droplet 64 of a solution for forming the hole transport layer 12 and the bulk heterojunction organic active layer 14 is dropped thereon using a syringe 60. Thereby, the hole transport layer 12 and the bulk heterojunction organic active layer 14 having uniform thickness (refer to FIG. 37B) can be formed with the droplet 64 on the substrate 10 in accordance with centrifugal force.

Modified Example 1

Figure 65A:
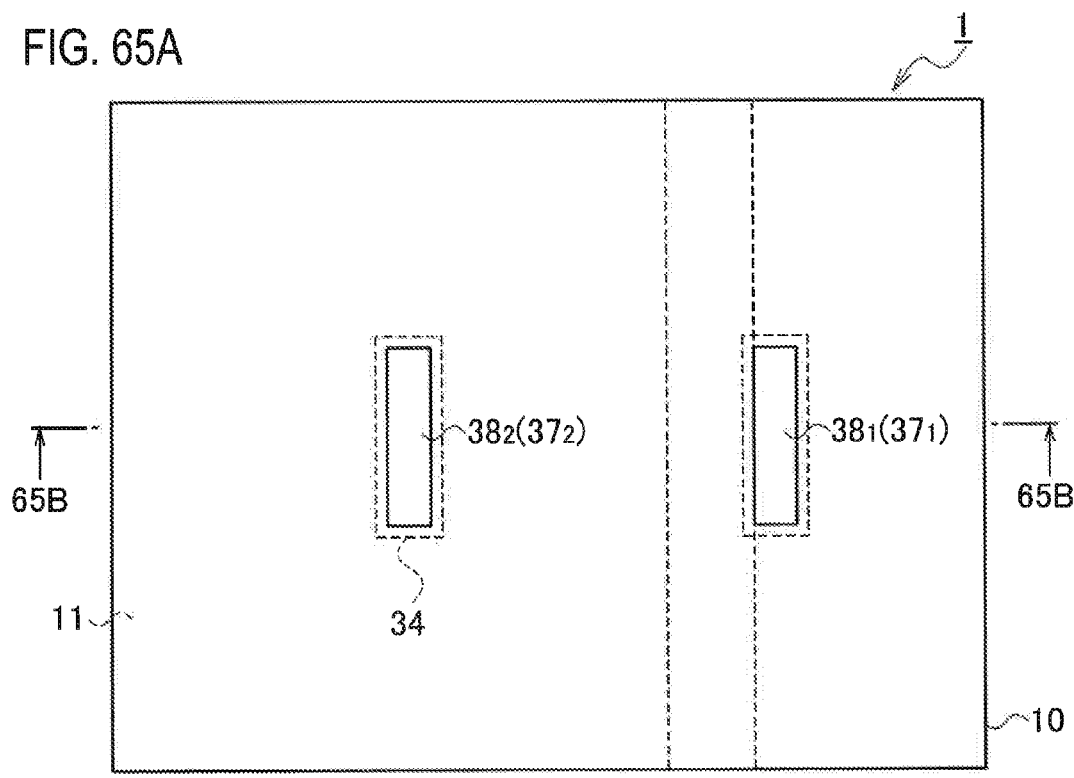
Figure 65B:
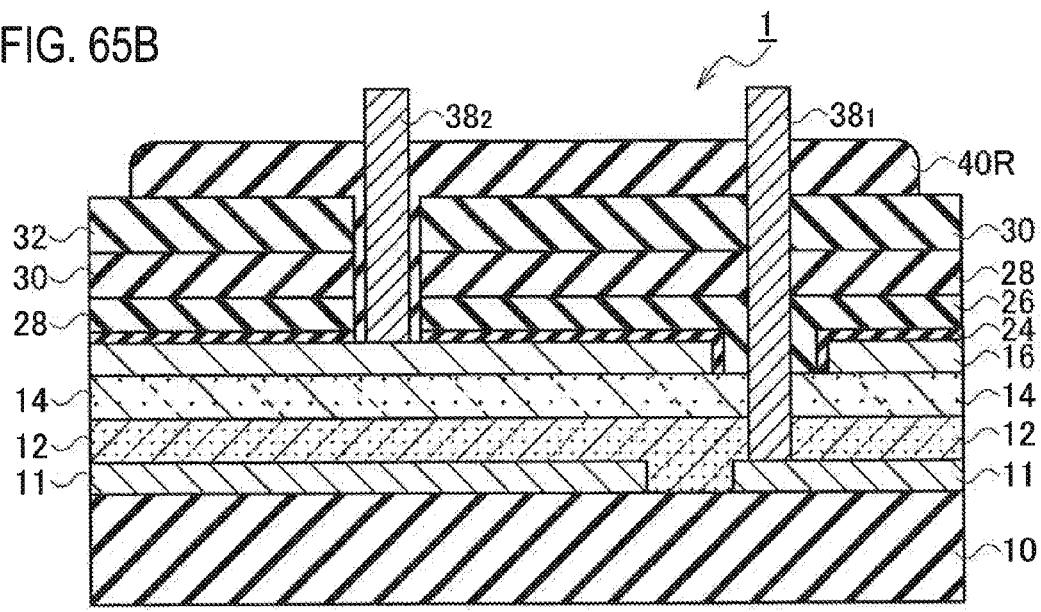
Figure 65C:
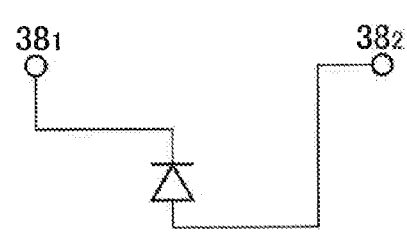

A schematic planar pattern configuration of an organic thin film photovoltaic device 1 according to a modified example 1 of the third embodiment is expressed as shown in FIG. 65A, a schematic cross-sectional structure taken in the line 65B-65B of FIG. 65A is expressed as shown in FIG. 65B, and circuit representation is expressed as shown in FIG. 65C.

As shown in FIGS. 65A-65C, the organic thin film photovoltaic device 1 according to the modified example 1 of the third embodiment includes: a substrate 10; a first electrode layer 11 disposed on the substrate 10; a hole transport layer 12 disposed on the first electrode layer 11; a bulk heterojunction organic active layer 14 disposed on the hole transport layer 12; and a second electrode layer 16 disposed on the bulk heterojunction organic active layer 14; a passivation layer 26 disposed on the second electrode layer 16; a first extraction terminal electrode $38_1$ disposed in a direction perpendicular to the substrate 10, the first extraction terminal electrode $38_1$ configured to pass through the passivation layer 26, the bulk heterojunction organic active layer 14, and the hole transport layer 12 so as to be connected to the first electrode layer 11; and a second extraction terminal electrode $38_2$ disposed in the direction perpendicular to the substrate 10, the second extraction terminal electrode $38_2$ configured to pass through the passivation layer 26 so as to be connected to the second electrode layer 16.

The first extraction terminal electrode $38_1$ can be connected to arbitrary positions of the first electrode layer 11.

The second extraction terminal electrode $38_2$ can be connected to arbitrary positions of the second electrode layer 16.

As shown in FIGS. 65A-65C, the organic thin film photovoltaic device 1 according to the modified example 1 of the third embodiment may include: a colored barrier layer 28 disposed on the passivation layer 26; a back sheet passivation layer 30 disposed on the colored barrier layer 28; and a resin layer 40R disposed on the back sheet passivation layer 30, the resin layer 40R configured to seal the first extraction terminal electrode $38_1$ and the second extraction terminal electrode $38_2$.

Moreover, the colored barrier layer 28 can be formed of a UV curing resin, for example.

Moreover, a coloring agent may be added to the colored barrier layer 28. For example, carbon black etc. are applicable as a black coloring agent, phthalocyanine-based coating etc. are applicable as a blue coloring agent, and alizarin-based coating etc. are applicable as a red coloring agent.

Moreover, the passivation layer 26 can be formed of an SiN film or a SiON film, for example.

The colored barrier layer 28 can cover a spot formed in the passivation layer 26. Moreover, a multi-laminated protection film may be formed by repeatedly laminating a plurality of the passivation layer 26 and the colored barrier layer 28.

FIG. 66A shows a schematic cross-sectional structure of a state where the transparent electrode layer 11 is pattern-formed on the substrate 10, in a process of the fabrication method of the organic thin film photovoltaic device according to the third embodiment. Moreover, a schematic cross-sectional structure showing a state where the hole transport layer 12 is film-formed on the transparent electrode layer 11 is expressed as shown in FIG. 66B, a schematic cross-sectional structure showing a state where the bulk heterojunction organic active layer 14 is film-formed on the hole transport layer 12 is expressed as shown in FIG. 66C, and a schematic cross-sectional structure showing a state where the second electrode layer 16 is pattern-formed on the bulk heterojunction organic active layer 14 is expressed as shown in FIG. 66D.

FIG. 67A is a schematic cross-sectional structure showing a state where oxide film 24 is formed on the surface of the second electrode layer by using oxygen plasma treatment, in a process of the fabrication method of the organic thin film photovoltaic device according to the third embodiment. A schematic cross-sectional structure showing a state where the passivation layer 26 is formed the entire surface of the device is expressed as shown in FIG. 67B, and a schematic cross-sectional structure showing a state where the colored barrier layer 28 is formed on the passivation layer 26 is expressed as shown in FIG. 67C.

Moreover, FIG. 68A shows a schematic cross-sectional structure showing a state where the back sheet passivation layer 30 is formed on the colored barrier layer 28, in a process of the fabrication method of the organic thin film photovoltaic device according to the third embodiment. FIG. 68B shows a schematic cross-sectional structure showing a state where the first via hole $37_1$ configured to pass through the back sheet passivation layer 30, the colored barrier layer 28, the passivation layer 26, the bulk heterojunction organic active layer 14, and the hole transport layer 12 is formed in a direction perpendicular to the substrate 10 so as to reach a first electrode layer 11, and the second via hole $37_2$ configured to pass through the back sheet passivation layer 30, the colored barrier layer 28, and the passivation layer 26 is formed in the direction perpendicular to the substrate 10 so as to reach the second electrode layer 16.

Moreover, FIG. 69A is a schematic cross-sectional structure showing a state where the first extraction terminal electrode $38_1$ connected to the first electrode layer 11 via the first via hole $37_1$ is formed, and the second extraction terminal electrode $38_2$ connected to the second electrode layer 16 via the second via hole $37_2$ is formed, in a process of the fabrication method of the organic thin film photovoltaic device according to the third embodiment. An enlarged view of the portion A of FIG. 69A is expressed as shown in FIG. 69B.

The first via hole $37_1$ and the second via hole $37_2$ which are respectively contact holes for contacting the first electrode layer 11 and the second electrode layer 16 are formed using mechanical cutting, e.g. laser piercing or laser ablation, in the same manner as the third embodiment.

Moreover, the first extraction terminal electrode $38_1$ and the second extraction terminal electrode $38_2$ can be formed with a gold wire etc.

A carbon paste, an Ag paste, etc. are used for bonding junctions between the first and second extraction terminal electrodes $38_1$, $38_2$, and the first and second electrode layers 11, 16, for example. A carbon paste, an Ag paste, etc. are used for a bonding junction portion between the first extraction terminal electrode $38_1$ and the first electrode layer 11. A carbon paste, an Ag paste, etc. are used for a bonding junction portion 42 between the second extraction terminal electrode $38_2$ and the second electrode layer 16. In this case, if in particular the second electrode layer 16 is formed of AgMg, satisfactory bonding can be obtained by using an Ag paste for the bonding junction portion 42. Moreover, a peripheral part of the first extraction terminal electrode $38_1$ and a peripheral part of the second extraction terminal electrode $38_2$ are protected with a resin layer 40R, e.g. UV curing resin, from an intrusion of moisture, oxygen, etc.

(Electronic Device)

In the organic thin film photovoltaic device according to the third embodiment, since first extraction terminal electrode $38_1$ and the second extraction terminal electrode $38_2$ can be extracted from the inside of the cell in the organic thin film photovoltaic device, it becomes easy to mount electronic apparatuses, e.g. mobile terminal equipment thereon, which has been difficult for extraction from edge face. It is more effective for first extraction terminal electrode $38_1$ and the second extraction terminal electrode $38_2$ not to be conspicuous at the time of mounting the cell of the organic thin film photovoltaic device on a bezel (peripheral part of the display) and the back surface of the display panel since an external view is important for electronic apparatuses represented by in particular smart phones, tablet-type devices, etc. As the via hole up to the organic layers (12.14) required for contact with the first electrode layer 11 (TCO), the first via hole $37_1$ can be formed by using a laser beam (of which the wavelength is 532 nm, for example) measuring approximately 5 μm in diameter. A plurality of the first via holes $37_1$ may be formed. Similarly, a plurality of the second via hole $37_2$ may also be formed. Since such a method is used, contact resistance can be reduced without impairing external appearance, and thereby forming satisfactory bonding.

A schematic plane configuration of an electronic apparatus 200 to which the organic thin film photovoltaic device 1 according to the third embodiment is applied is expressed as shown in FIG. 70. The electronic apparatus 200 to which the organic thin film photovoltaic device 1 according to the third embodiment is applied includes an organic thin film photovoltaic device formation area 4 and a character formation area 6 at a peripheral part of a display area 2, as shown in FIG. 70.

Moreover, a schematic cross-sectional structure taken in the line 71-71 of FIG. 70 is expressed as shown in FIG. 71, a schematic cross-sectional structure taken in the line 72-72 of FIG. 70 is expressed as shown in FIG. 72, and a schematic cross-sectional structure taken in the line 73-73 of FIG. 70 is expressed as shown in FIG. 73.

In the electronic apparatus 200 to which the organic thin film photovoltaic device 1 according to the third embodiment is applied, as shown in FIGS. 70-73, the organic thin film photovoltaic device formation area 4 includes; a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a passivation layer 26 disposed on the second electrode layer 16; a colored barrier layer 28 disposed on the passivation layer 26; and a back sheet passivation layer 30 disposed on the colored barrier layer 28. As shown in FIGS. 71-73, the passive state film 24 may be formed on the surface of the cathode electrode layer (second electrode layer) 16.

As shown in FIGS. 70-72, on the other hand, the display area 2 and the character formation area 6 include: a substrate 10; a transparent electrode layer (first electrode layer) 11 disposed on the substrate 10; a passivation layer 26 disposed on the first electrode layer 11; a colored barrier layer 28 disposed on the passivation layer 26; and a back sheet passivation layer 30 disposed on the colored barrier layer 28.

Although illustration is omitted, the first extraction terminal electrode $38_1$ and the second extraction terminal electrode $38_2$ can be formed at the region C and the region D of FIG. 73, for example, so as to not be conspicuous via the plurality of the first via hole $37_1$ and the second via hole $37_2$. More specifically, there may be included: a first extraction terminal electrode disposed in a direction perpendicular to the substrate 10, the first extraction terminal electrode configured to pass through the back sheet passivation layer 30, the colored barrier layer 28, the passivation layer 26, the bulk heterojunction organic active layer 14, and the hole transport layer 12 so as to be connected with the first electrode layer; and a second extraction terminal electrode disposed in the direction perpendicular to the substrate 10, the second extraction terminal electrode configured to pass through the back sheet passivation layer 30, the colored barrier layer 28, and the passivation layer 26 so as to be connected with the second electrode layer 16.

Similarly, in the electronic apparatus 200 to which an organic thin film photovoltaic device 1 according to a modified example 2 of the third embodiment (mentioned below: FIG. 75) is applied, as shown similar to FIGS. 70-73, an organic thin film photovoltaic device formation area 4 includes: a substrate 10; a transparent electrode layer (first electrode layer) 11 disposed on the substrate 10; a hole transport layer 12 disposed on the first electrode layer 11; a bulk heterojunction organic active layer 14 disposed on the hole transport layer 12; a cathode electrode layer (second electrode layer) 16 disposed on the bulk heterojunction organic active layer 14; a via electrode layer 16P connected to the first electrode layer 11 via a third via hole $37_3$, the third via hole 373 configured to pass through the hole transport layer 12 and the bulk heterojunction organic active layer 14 in a direction perpendicular to the substrate 10 so as to reach the first electrode layer 11; a passivation layer 26 disposed on the second electrode layer 16N and the via electrode layer 16P; a colored barrier layer 28 disposed on the passivation layer 26; and a back sheet passivation layer 30 disposed on the colored barrier layer 28. As shown in FIGS. 71-73, the passive state film 24 may be formed on the surface of the cathode electrode layer (second electrode layer) 16.

Moreover, as shown in FIGS. 70-72, the display area 2 and the character formation area 6 include: a substrate 10; a first electrode layer 11 disposed on the substrate 10; a passivation layer disposed on the first electrode layer 11; a colored barrier layer 28 disposed on the passivation layer 26; and a back sheet passivation layer 30 disposed on the colored barrier layer 28.

Although illustration is omitted, the first extraction terminal electrode $38_1$ and the second extraction terminal electrode $38_2$ can be formed so as to not be conspicuous via the plurality of the first via hole $37_1$ and the second via hole $37_2$. More specifically, there may be included: a first extraction terminal electrode $38_1$ disposed in a direction perpendicular to the substrate 10, the first extraction terminal electrode configured to pass through the back sheet passivation layer 30, the colored barrier layer 28, the passivation layer 26, the bulk heterojunction organic active layer 14, and the hole transport layer 12 so as to be connected with the via electrode layer 16P; and a second extraction terminal electrode $38_2$ disposed in the direction perpendicular to the substrate 10, the second extraction terminal electrode configured to pass through the back sheet passivation layer 30, the colored barrier layer 28, and the passivation layer 26 so as to be connected with the second electrode layer 16N.

the colored barrier layer 28 of the organic thin film photovoltaic device formation area 4 is colored in black with black Dye, for example, but the colored barrier layer 28 of the character formation area 6 is colored in a color different from black, e.g., red, in order to arranging literal characters.

Although illustration is omitted, Liquid Crystal Displays (LCD) or Electro Luminescence (EL) displays, for example, can be formed on the substrate 10 corresponding to the display area 2.

As shown in FIG. 74A, a tandem-structured electronic apparatus 300 to which the organic thin film photovoltaic device according to the third embodiment is applied includes: a substrate 10; and an organic thin film photovoltaic device formation area 4 disposed on the substrate 10 via an adhesive layer 150. The display area 2 is formed in the substrate 10. More specifically, in the tandem-structured electronic apparatus 300 to which the organic thin film photovoltaic device according to the third embodiment is applied, the substrate 10 and the organic thin film photovoltaic device formation area 4 respectively formed independently are disposed in vertical tandem structure via the adhesive layer 150.

Moreover, as shown in FIG. 74B, an in-cell structured electronic apparatus 300 to which the organic thin film photovoltaic device according to the third embodiment is applied includes: a substrate 10; and an organic thin film photovoltaic device formation area 4 disposed on the substrate 10. More specifically, in the in-cell structured electronic apparatus 300 to which the organic thin film photovoltaic device according to the embodiment is applied, the organic thin film photovoltaic device formation area 4 is formed on the substrate 10 in in-cell structure, and LCD or an organic electroluminescence display can be formed on the substrate 10, for example.

The electronic apparatus 200 to which the organic thin film photovoltaic device 1 according to the third embodiment is applied corresponds to the in-cell structured electronic apparatus 300, as shown in FIGS. 70-73 and 74B.

Modified Example 2

A schematic planar pattern configuration of an organic thin film photovoltaic device 1 according to a modified example 2 of the third embodiment is expressed as shown in FIG. 75A, a schematic cross-sectional structure taken in the line 75B-75B of FIG. 75A is expressed as shown in FIG. 75B, and a circuit representation corresponding to FIGS. 75A and 75B is expressed as shown in FIG. 75C.

As shown in FIGS. 75A and 75B, the organic thin film photovoltaic device 1 according to the modified example 2 of the third embodiment includes; a substrate 10; a first electrode layer 11 disposed on the substrate 10; a hole transport layer 12 disposed on the first electrode layer 11 is provided; a bulk heterojunction organic active layer 14 disposed on the hole transport layer 12; a second electrode layer 16N disposed on the bulk heterojunction organic active layer 14; a via electrode layer 16P disposed in a direction perpendicular to the substrate 10 and connected to the first electrode layer 11 via a third via hole $37_3$, the third via hole $37_3$ configured to pass through the hole transport layer 12 and the bulk heterojunction organic active layer 14 so as to reach the first electrode layer 11;
a passivation layer 26 disposed on the second electrode layer 16N and the via electrode layer 16P; a first extraction terminal electrode $38_1$ disposed in the direction perpendicular to the substrate 10, the first extraction terminal electrode $38_1$ configured to pass through the passivation layer 26 so as to be connected to the via electrode layer 16P; and a second extraction terminal electrode $38_2$ configured to pass through the passivation layer 26 so as to be connected with the second electrode layer 16N.

The first extraction terminal electrode $38_1$ can be connected to arbitrary positions of the first electrode layer 11.

The second extraction terminal electrode $38_2$ can be connected with arbitrary positions of the second electrode layer 16N.

As shown in FIGS. 75A and 75B, the organic thin film photovoltaic device 1 according to the modified example 2 of the third embodiment may include: a colored barrier layer 28 disposed on the passivation layer 26; a back sheet passivation layer 30 disposed on the colored barrier layer 28; and a resin layer 40R disposed on the back sheet passivation layer 30, the resin layer 40R configured to seal the first extraction terminal electrode $38_1$ and the second extraction terminal electrode $38_2$.

The colored barrier layer 28 can be formed of a UV curing resin.

Moreover, a coloring agent may be added to the colored barrier layer 28.

Moreover, the passivation layer 26 can be formed of an SiN film or a SiON film, for example.

The colored barrier layer 28 can cover a spot formed in the passivation layer 26.

Moreover, a multi-laminated protection film may be formed by repeatedly laminating a plurality of the passivation layer 26 and the colored barrier layer 28.

The surface of the second electrode layer 16N and via electrode layer 16P may be provided with the passive state film 24. In this case, the passive state film 24 can be formed of an oxide film of the second electrode layer 16N and the via electrode layer 16P. In this case, such an oxide film can be formed by performing oxygen plasma treatment for the surface of the second electrode layer 16N and via electrode layer 16P.

FIG. 76A shows a schematic cross-sectional structure of a state where the transparent electrode layer 11 is pattern-formed on the substrate 10, in a process of the fabrication method of the organic thin film photovoltaic device 1 according to the modified example 2 of the third embodiment. Moreover, FIG. 76B shows a schematic cross-sectional structure showing a state where the hole transport layer 12 is film-formed on the transparent electrode layer 11, FIG. 76C shows a schematic cross-sectional structure showing a state where the bulk heterojunction organic active layer 14 is film-formed on the hole transport layer 12, and FIG. 76D shows a schematic cross-sectional structure showing a state where a third via hole 373 disposed in a direction perpendicular to the substrate 10, the third via hole $37_3$ configured to pass through the hole transport layer 12 and the bulk heterojunction organic active layer 14 so as to reach the first electrode layer 11 is formed.

FIG. 77A is a schematic cross-sectional structure showing a state forming pattern-forming a second electrode layer 16N on the bulk heterojunction organic active layer 14 and forming a via electrode layer 16P connected to the first electrode layer 11 via the third via hole $37_3$, in a process of the fabrication method of the organic thin film photovoltaic device according to the modified example 2 of the third embodiment. FIG. 77B is a schematic cross-sectional structure showing a state where the passivation layer 26, the colored barrier layer 28, and the back sheet passivation layer 30 are formed on the second electrode layer 16N and the via electrode layer 16P after forming the oxide layer 24 on the surface of the second electrode layer 16N and the via electrode layer 16P by using oxygen plasma treatment.

FIG. 78 is a schematic cross-sectional structure showing a state of forming a fourth via hole $37_4$ and the second via hole $37_2$ each configured to pass through the back sheet passivation layer 30, the colored barrier layer 28, and the passivation layer 26 in a direction perpendicular to the substrate 10, wherein the fourth via hole $37_4$ is configured to reach the via electrode layer 16P and the second via hole $37_2$ is configured to reach the second electrode layer 16N.

Furthermore, FIGS. 75A and 75B show a schematic cross-sectional structure showing a state where the extraction terminal electrode $38_1$ is formed to be connected to the via electrode layer 16P connected to the first electrode layer 11 via the fourth via hole $37_4$, and the extraction terminal electrode $38_1$ is formed to be connected to the second electrode layer 16N via the second via hole $37_2$.

As shown in FIGS. 76-78 and 75, the fabrication method of the organic thin film photovoltaic device 1 according to the modified example 2 of the third embodiment includes: forming the first electrode layer 11 on the substrate 10; forming the hole transport layer 12 on the first electrode layer 11; forming the bulk heterojunction organic active layer 14 on the hole transport layer 12; forming a third via hole $37_3$ configured to pass through the hole transport layer 12 and the bulk heterojunction organic active layer 14 in a direction perpendicular to the substrate 10 so as to reach the first electrode layer 11; pattern-forming a second electrode layer 16N on the bulk heterojunction organic active layer 14, and pattern-forming the via electrode layer 16P connected to the first electrode layer 11 via the third via hole $37_3$; forming a passivation layer 26, a colored barrier layer 28, and a back sheet passivation layer 30 on the second electrode layer 16N and the via electrode layer 16P; forming a fourth via hole $37_4$ configured to pass through the passivation layer 26, the colored barrier layer 28, and the back sheet passivation layer 30 in the direction perpendicular to the substrate 10 so as to reach the via electrode layer 16P; forming a second via hole $37_2$ configured to pass through the passivation layer 26, the colored barrier layer 28, and the back sheet passivation layer 30 in the direction perpendicular to the substrate 10 so as to reach the second electrode layer 16N; forming a first extraction terminal electrode $38_1$ connected to the via electrode layer 16P into the fourth via hole $37_4$; and forming a second extraction terminal electrode $38_2$ connected to the second electrode layer 16N into the second via hole $37_2$.

Since detailed explanation of the fabricating processes other than above-mentioned duplicates with that of the fabrication method of the organic thin film photovoltaic device 1 according to the third embodiment and the modified example 1 thereof, the detailed explanation is omitted.

As mentioned above, according to the third embodiment, there can be provided the organic thin film photovoltaic device of which electrode extraction structure is improved, wherein the connecting point can be formed in arbitrary positions, without largely changing of the external structure, allowing further weight saving and thin-layering; the fabrication method of such an organic thin film photovoltaic device; and the electronic apparatus including such an organic thin film photovoltaic device.

[Other Embodiments]

As explained above, the embodiments have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The organic thin film photovoltaic device of the embodiment can be applied to wide fields, e.g. photovoltaic power generation panels, charging apparatuses for mobile computing devices, solar energy systems, etc.

What is claimed is:

1. An organic thin film photovoltaic device comprising:
   a substrate;
   a first electrode layer disposed on the substrate;
   a hole transport layer disposed on the first electrode layer;
   a bulk heterojunction organic active layer disposed on the hole transport layer;
   a second electrode layer disposed on the bulk heterojunction organic active layer;
   a passivation layer disposed on the second electrode layer;
   a colored barrier layer disposed on the passivation layer; and
   a back sheet passivation layer disposed on the colored barrier layer.

2. The organic thin film photovoltaic device according to claim 1, wherein
   the colored barrier layer is an ultraviolet curing resin.

3. The organic thin film photovoltaic device according to claim 2, wherein
   a coloring agent is added in the colored barrier layer.

4. The organic thin film photovoltaic device according to claim 1, wherein
   the passivation layer is any one film of an SiN film or a SiON film.

5. An electronic apparatus comprising:
   a display area; and
   an organic thin film photovoltaic device formation area and a character formation area disposed at a peripheral part of the display area, wherein
   the organic thin film photovoltaic device formation area comprises
      a substrate,
      a first electrode layer disposed on the substrate,
      a hole transport layer disposed on the first electrode layer,
      a bulk heterojunction organic active layer disposed on the hole transport layer,
      a second electrode layer disposed on the bulk heterojunction organic active layer,
      a passivation layer disposed on the second electrode layer,
      a colored barrier layer disposed on the passivation layer, and
      a back sheet passivation layer disposed on the colored barrier layer, wherein
   the display area and the character formation area comprise
      the substrate,
      the first electrode layer disposed on the substrate,
      the passivation layer disposed on the first electrode layer,
      the colored barrier layer disposed on the passivation layer, and
      the back sheet passivation layer disposed on the colored barrier layer, wherein
   the colored barrier layer corresponding to the organic thin film photovoltaic device formation area and the colored barrier layer corresponding to the character formation area are colored.

* * * * *